US012671419B2

(12) United States Patent (10) Patent No.: US 12,671,419 B2
Katou et al. (45) Date of Patent: Jun. 30, 2026

(54) PROCESSING METHOD, ASYNCHRONOUS CIRCUIT, AND LOGIC CIRCUIT

(71) Applicant: Sony Semiconductor Solutions Corporation, Kanagawa (JP)

(72) Inventors: Toshihiko Katou, Kanagawa (JP); Tadaaki Tanimoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 58 days.

(21) Appl. No.: 18/832,009

(22) PCT Filed: Jan. 19, 2023

(86) PCT No.: PCT/JP2023/001553

§ 371 (c)(1),
(2) Date: Jul. 22, 2024

(87) PCT Pub. No.: WO2023/166877

PCT Pub. Date: Sep. 7, 2023

(65) Prior Publication Data

US 2025/0119145 A1 Apr. 10, 2025

(30) Foreign Application Priority Data

Mar. 3, 2022 (JP) ................................. 2022-032437

(51) Int. Cl.
*H03K 19/20* (2006.01)
*H03K 3/037* (2006.01)
*H03K 19/17704* (2020.01)
(52) U.S. Cl.
CPC ............. *H03K 19/20* (2013.01); *H03K 3/037* (2013.01); *H03K 19/17716* (2013.01)
(58) Field of Classification Search
CPC .. H03K 19/20; H03K 3/037; H03K 19/17716; H03K 19/00; G06F 30/337; G06F 30/35
See application file for complete search history.

(56) References Cited

U.S. PATENT DOCUMENTS

| 2009/0116597 A1 | 5/2009 | Cortadella |
| 2014/0125381 A1* | 5/2014 | Schreiber ................ G06F 30/30 716/108 |
| 2015/0326210 A1* | 11/2015 | Beerel .............. H03K 19/00323 326/94 |

FOREIGN PATENT DOCUMENTS

JP 2011512602 A 4/2011

OTHER PUBLICATIONS

International Search Report (PCT/ISA/210), International Application No. PCT/JP2023/001553, dated Apr. 11, 2023.

(Continued)

*Primary Examiner* — Daniel D Chang
(74) *Attorney, Agent, or Firm* — Michael Best & Friedrich LLP

(57) ABSTRACT

A processing method according to an embodiment of the present disclosure includes: causing a computer to perform first processing for identifying one or a plurality of flip-flop circuits each forming a self-feedback loop from among a plurality of flip-flop circuits in a synchronous circuit, deleting a feedback path in the self-feedback loop, identifying two or more flip-flop circuits forming strongly coupled components from among the one or plurality of flip-flop circuits, and replacing the two or more flip-flop circuits forming the strongly coupled components with one dummy flip-flop circuit; and causing the computer to perform second processing for identifying first one or more flip-flop circuits coupled to input side of a combinational circuit and second one or more flip-flop circuits coupled to output side of the combinational circuit.

7 Claims, 39 Drawing Sheets

(56) References Cited

OTHER PUBLICATIONS

I. Blunno et al., "Handshake Protocols for De-synchronization," 10th International Symposium on Asynchronous Circuits and Systems, 2004. Proceedings., Apr. 19-23, 2004.
R. Konishi et al., "A Synthesis Method for Asynchronous Logic Circuits on Array of LUTs" , NTT Optical Network Systems Laboratories, Dec. 10, 1998.

* cited by examiner

[ FIG. 1 ]
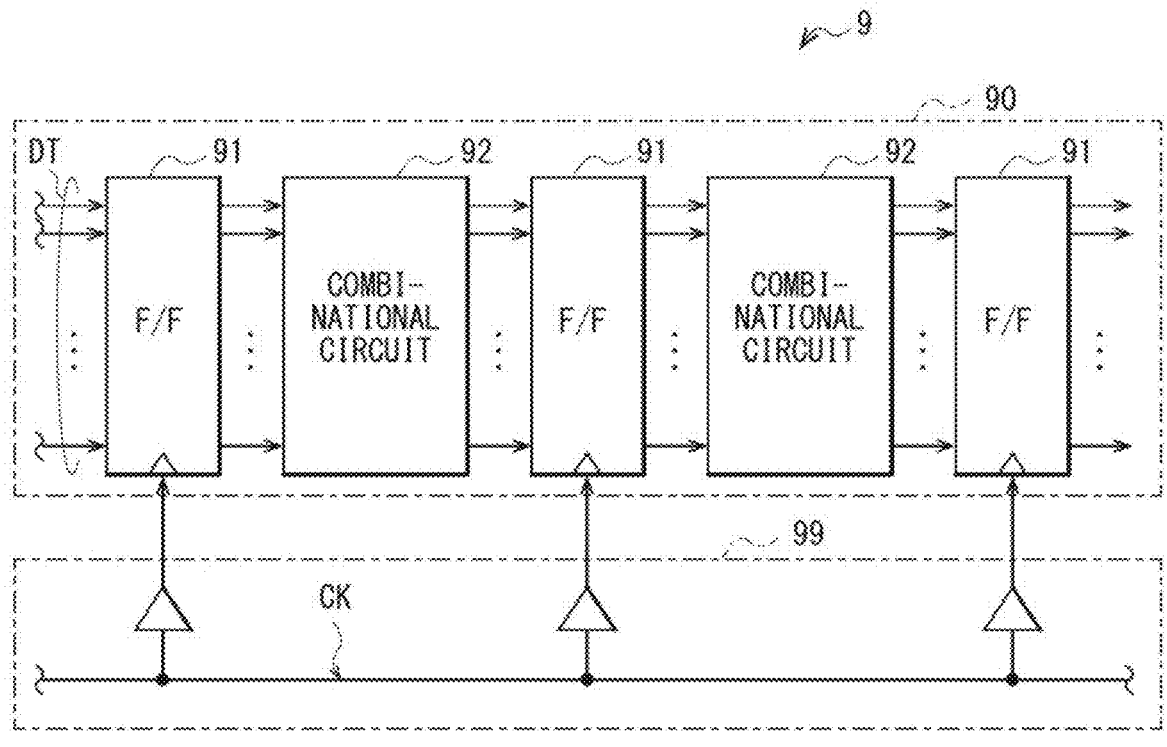
[ FIG. 2 ]
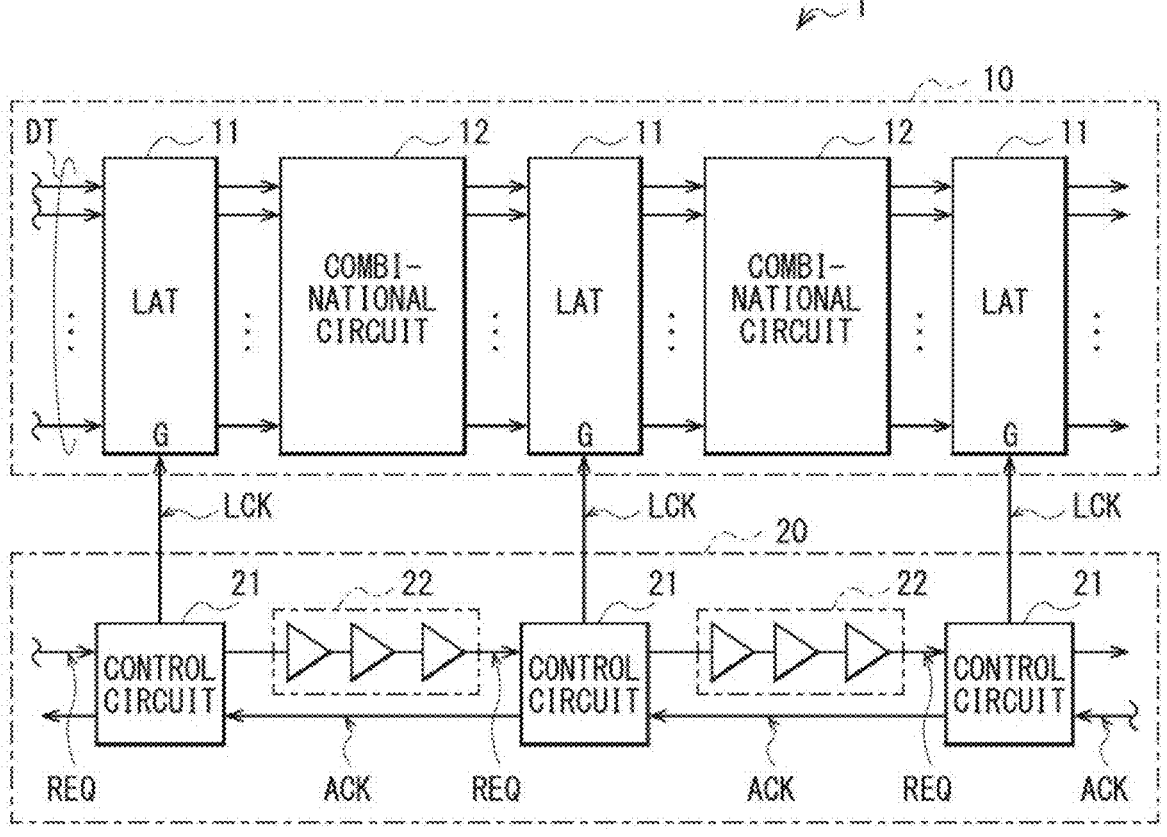

[ FIG. 3 ]
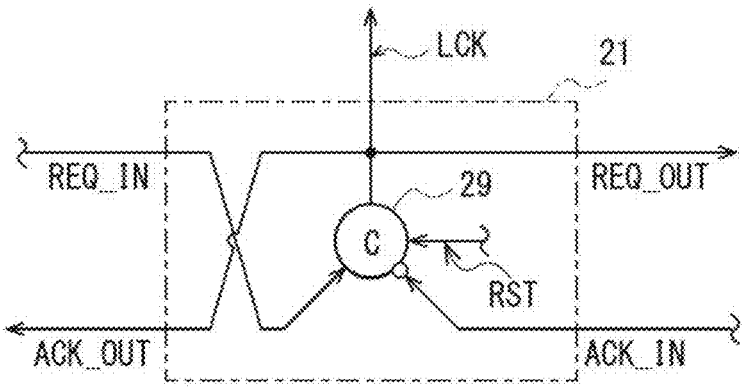
[ FIG. 4 ]
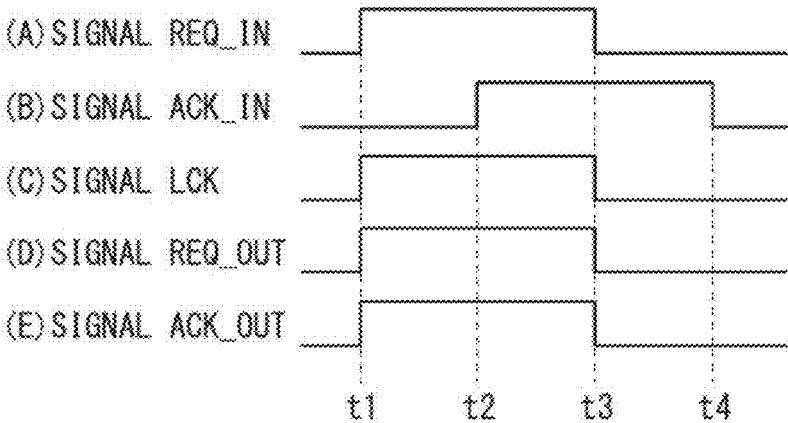

[ FIG. 5 ]
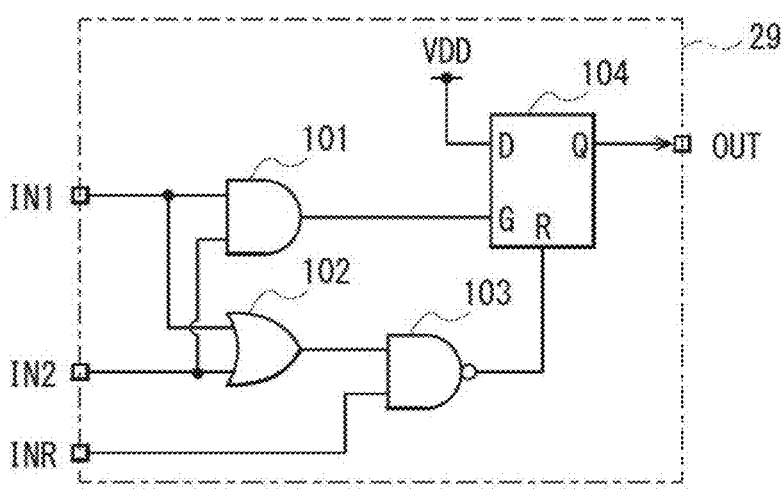
[ FIG. 6 ]
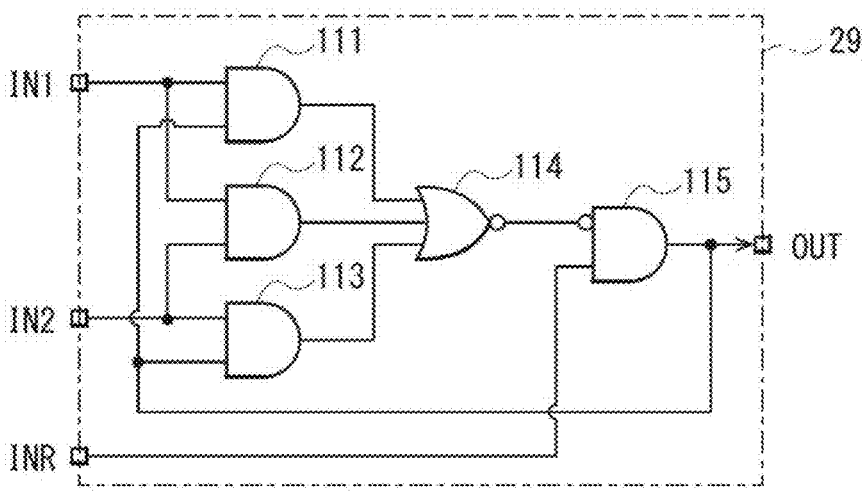

[ FIG. 7 ]
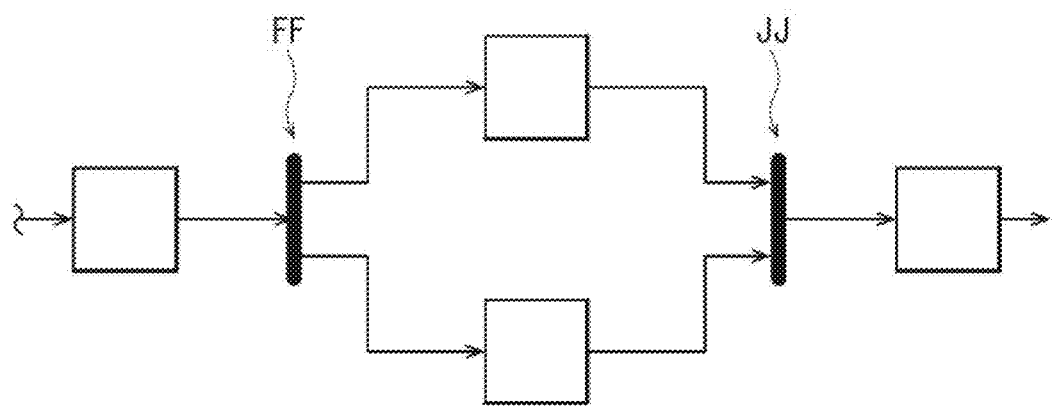
[ FIG. 8 ]
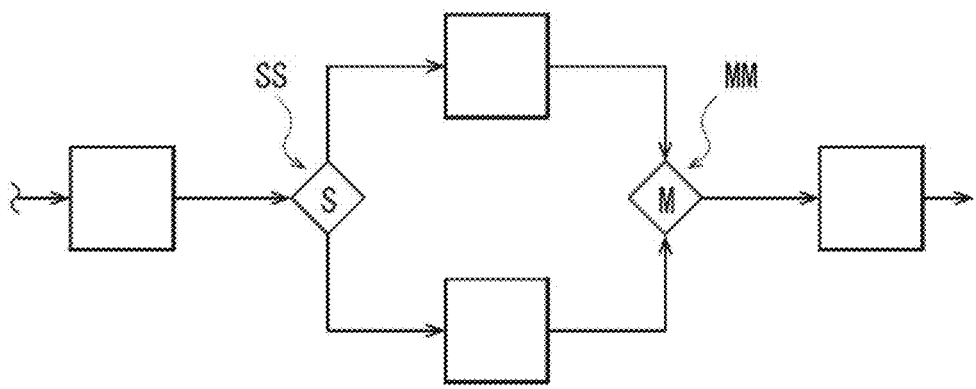

[ FIG. 9 ]
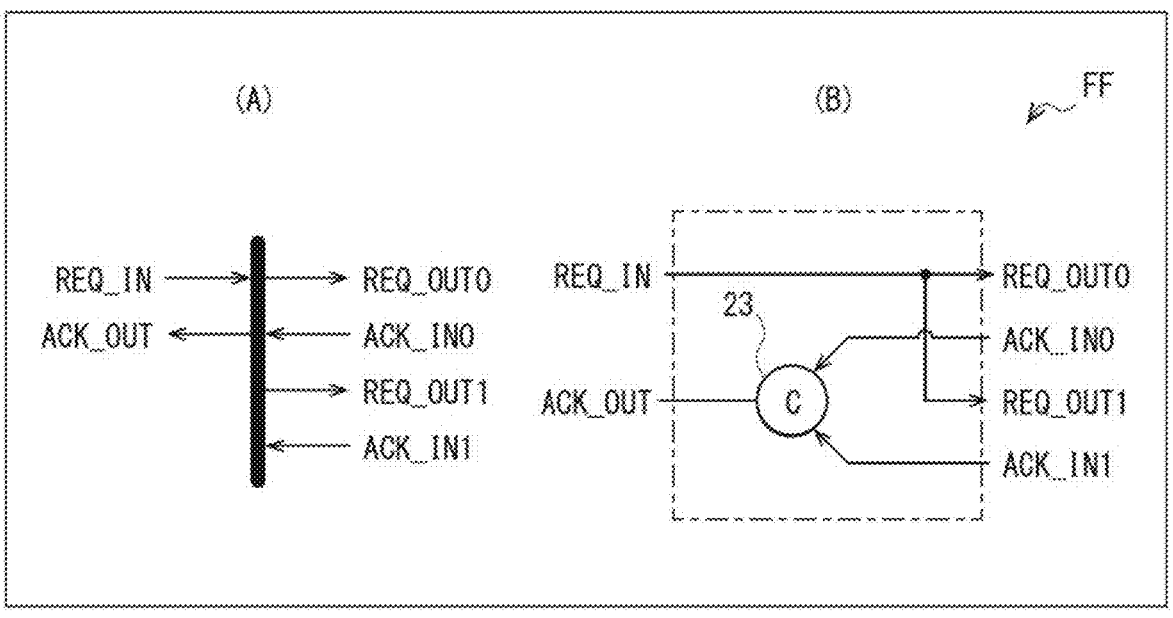
[ FIG. 10 ]
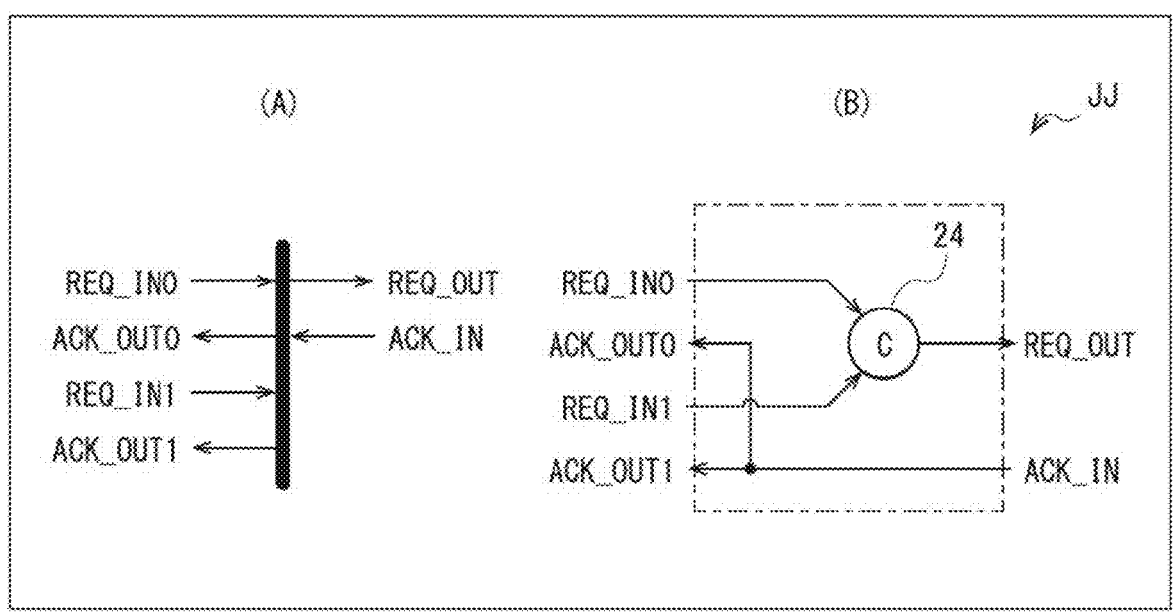

[ FIG. 11 ]
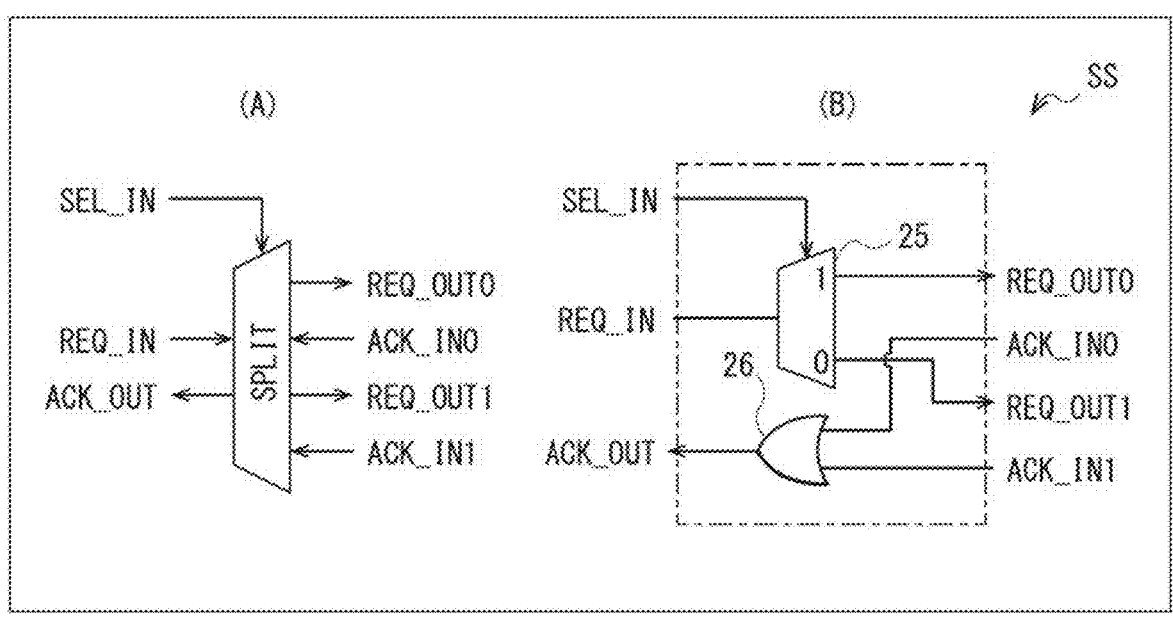
[ FIG. 12 ]
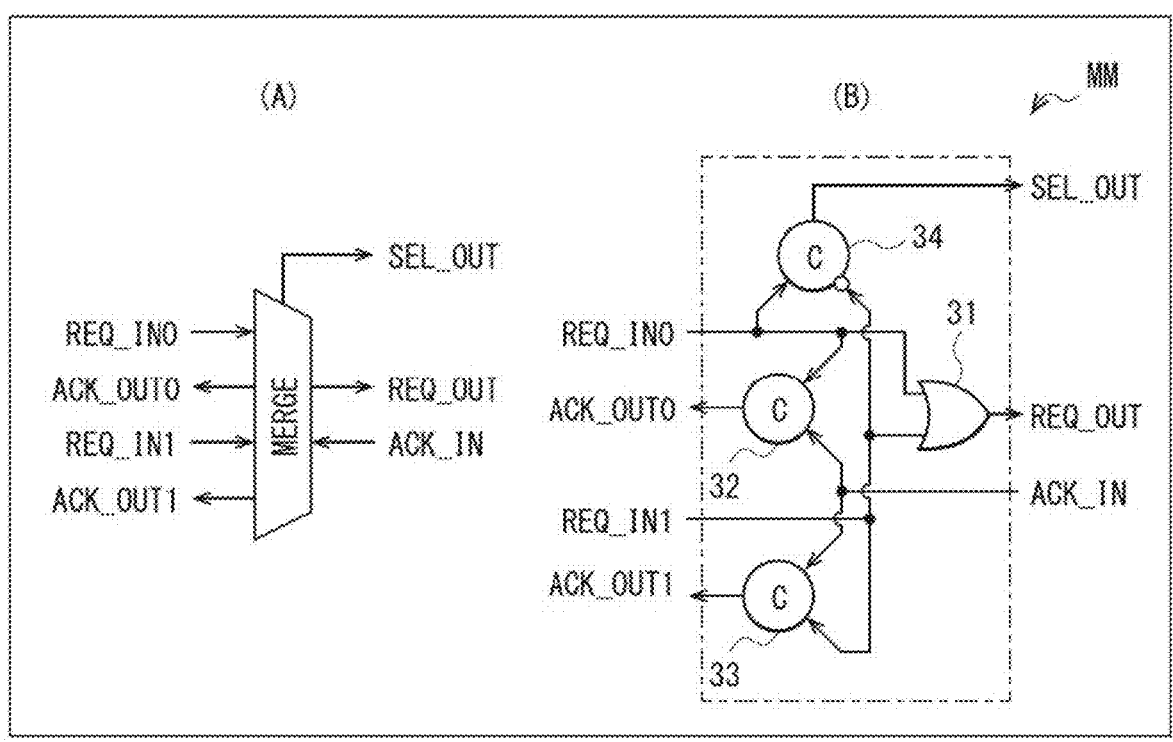

[ FIG. 13 ]
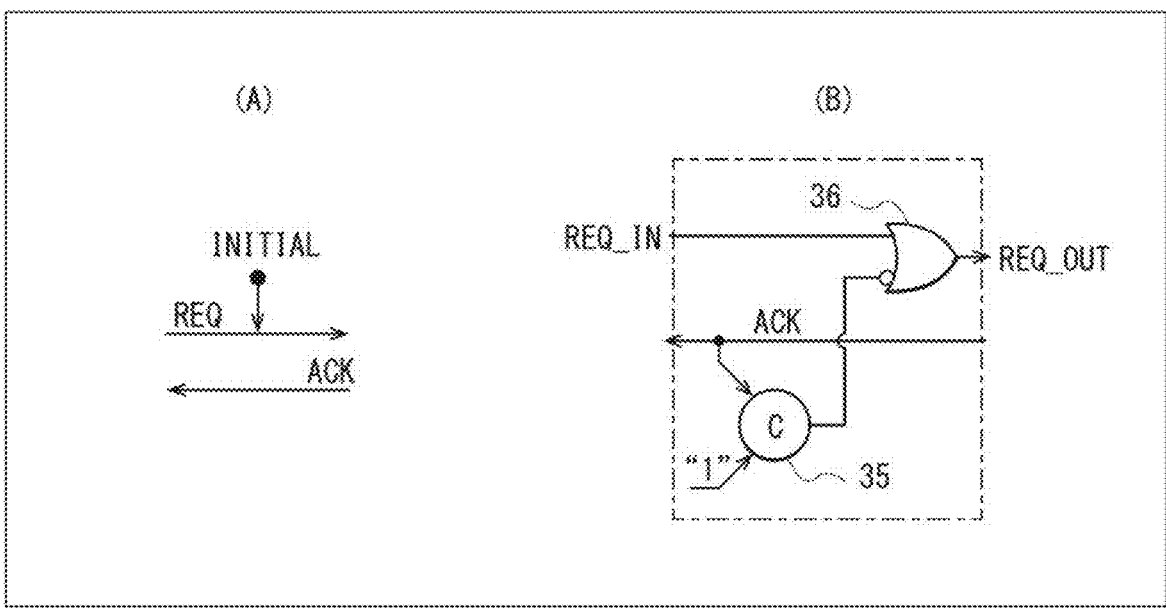
(A)
INITIAL
REQ
ACK
(B)
REQ_IN
36
REQ_OUT
ACK
C
"1"
35
[ FIG. 14 ]
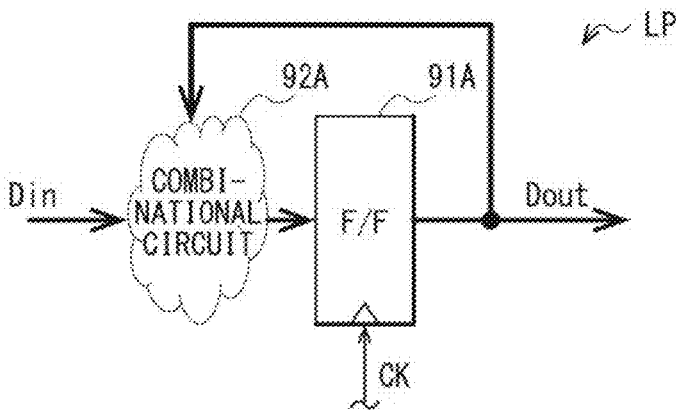
LP
Din
COMBI-
NATIONAL
CIRCUIT
92A
F/F
91A
Dout
CK

[ FIG. 15 ]
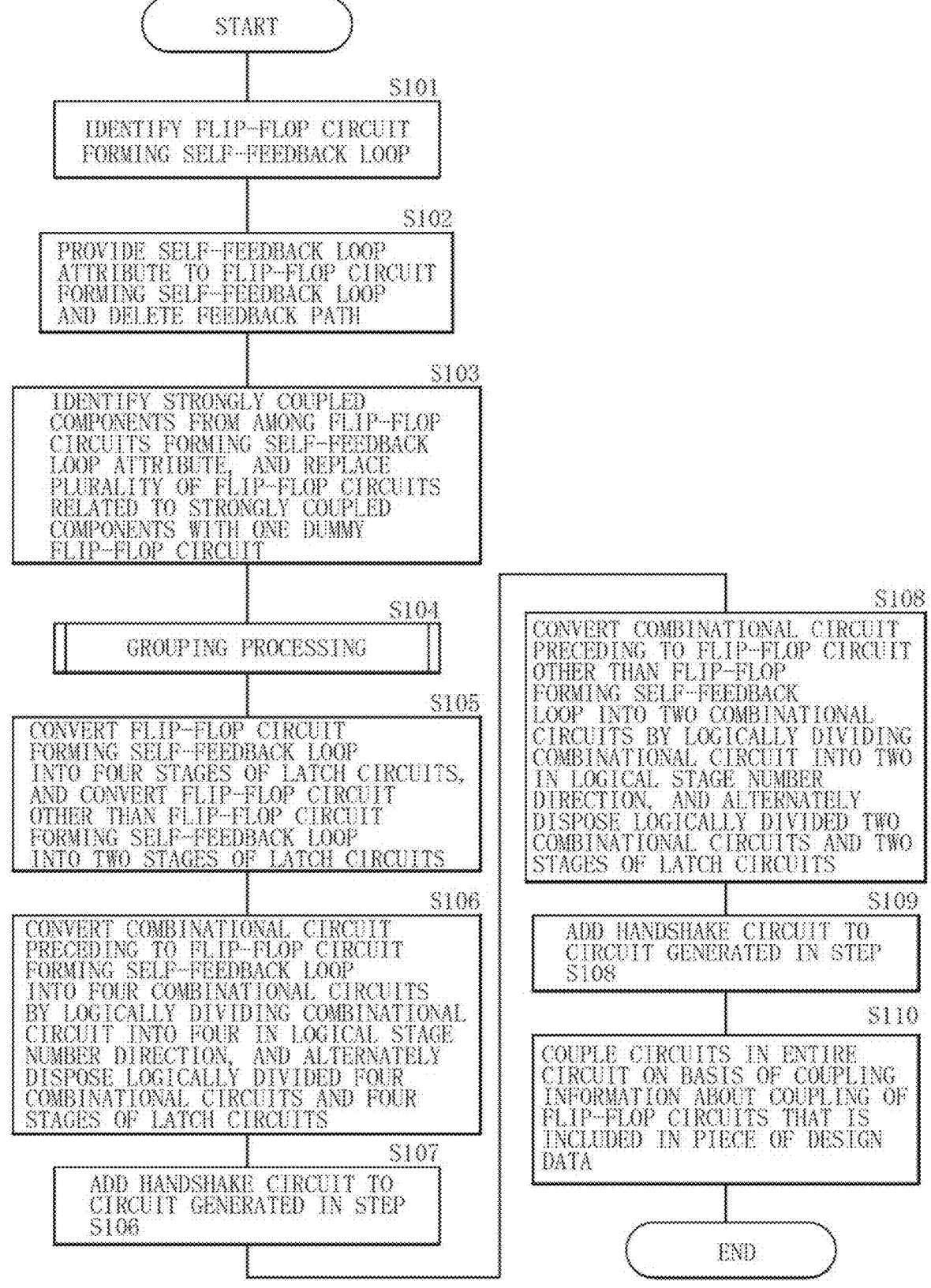

[ FIG. 16 ]
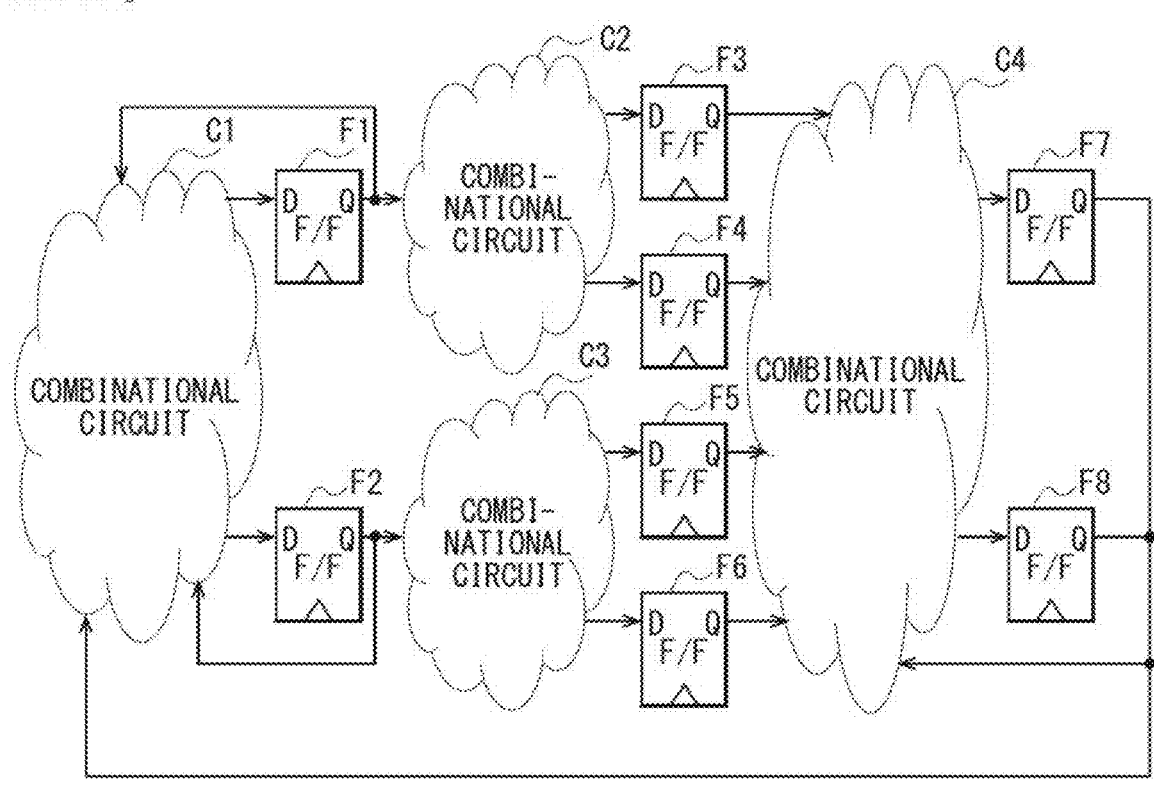
[ FIG. 17 ]
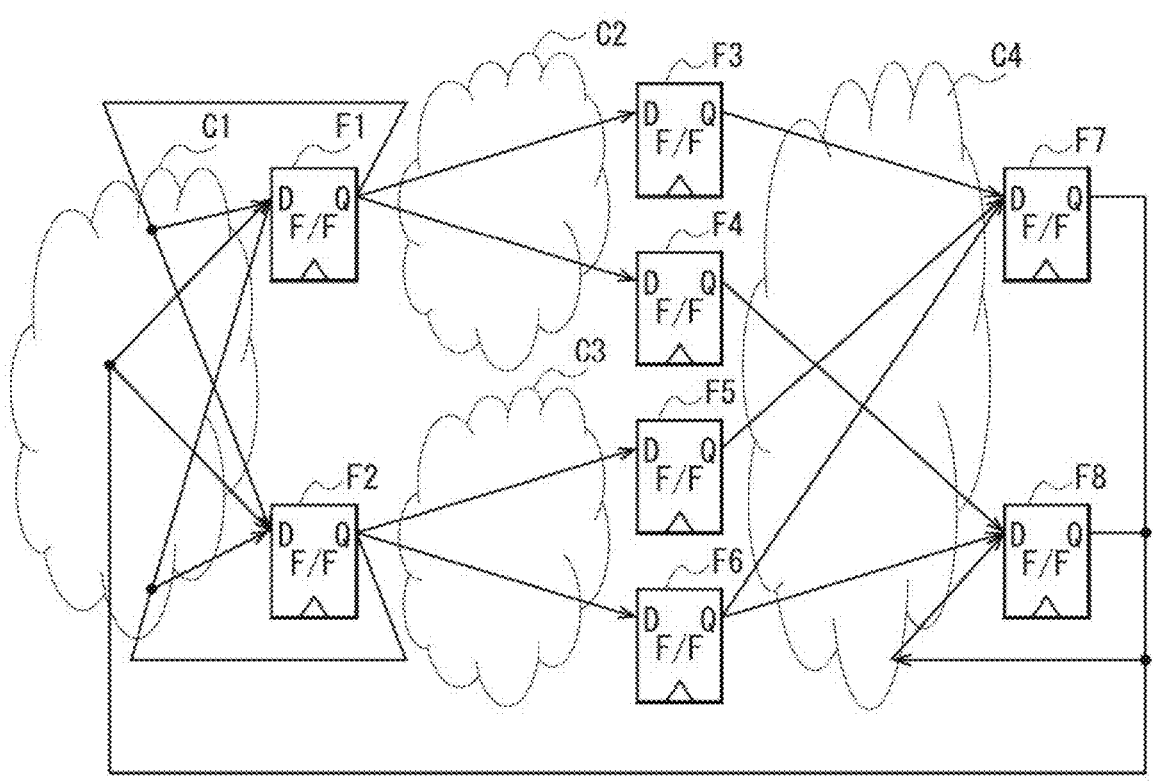

[ FIG. 18 ]
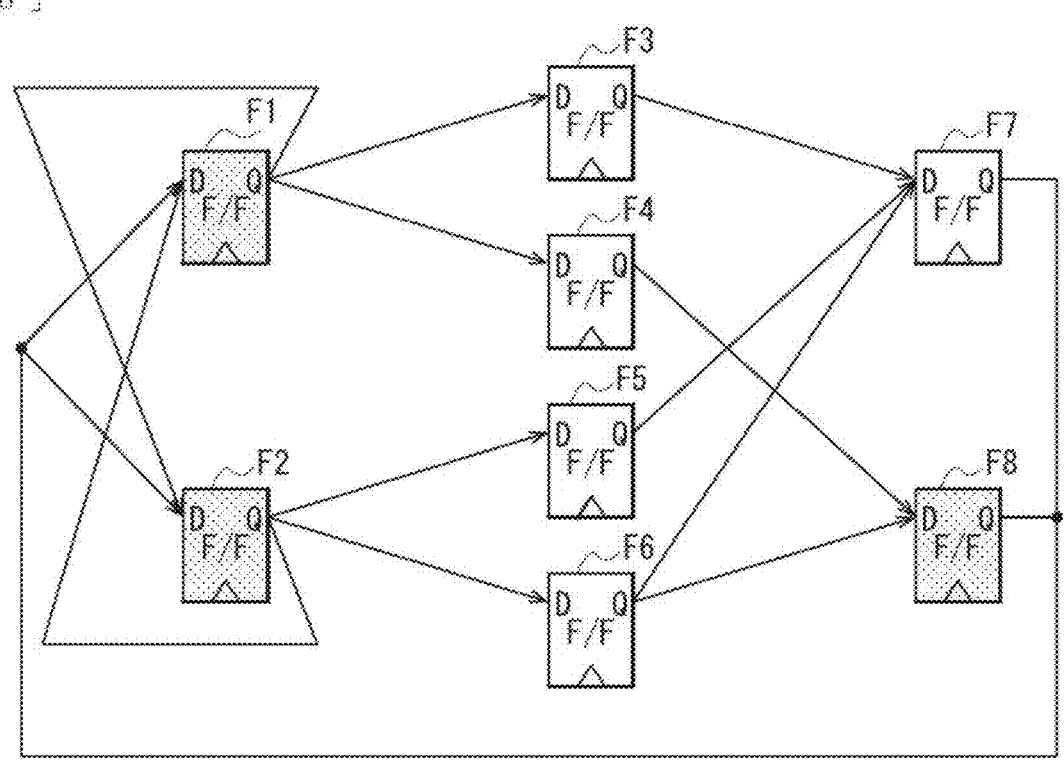
[ FIG. 19 ]
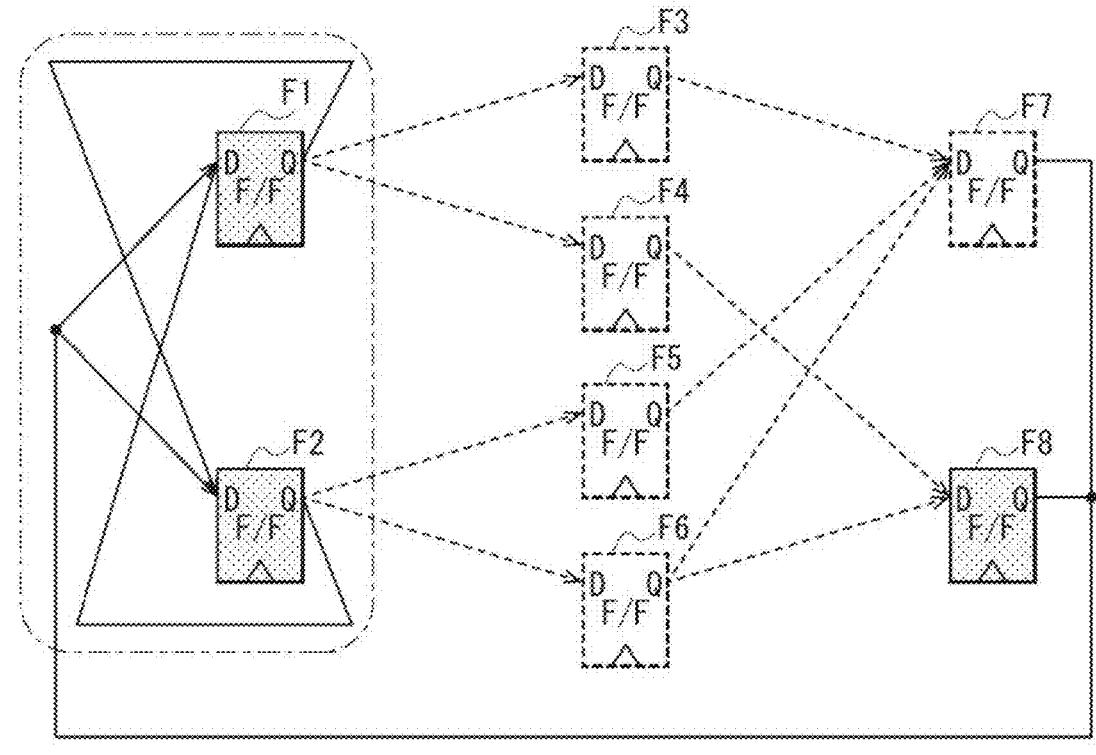

[ FIG. 20 ]
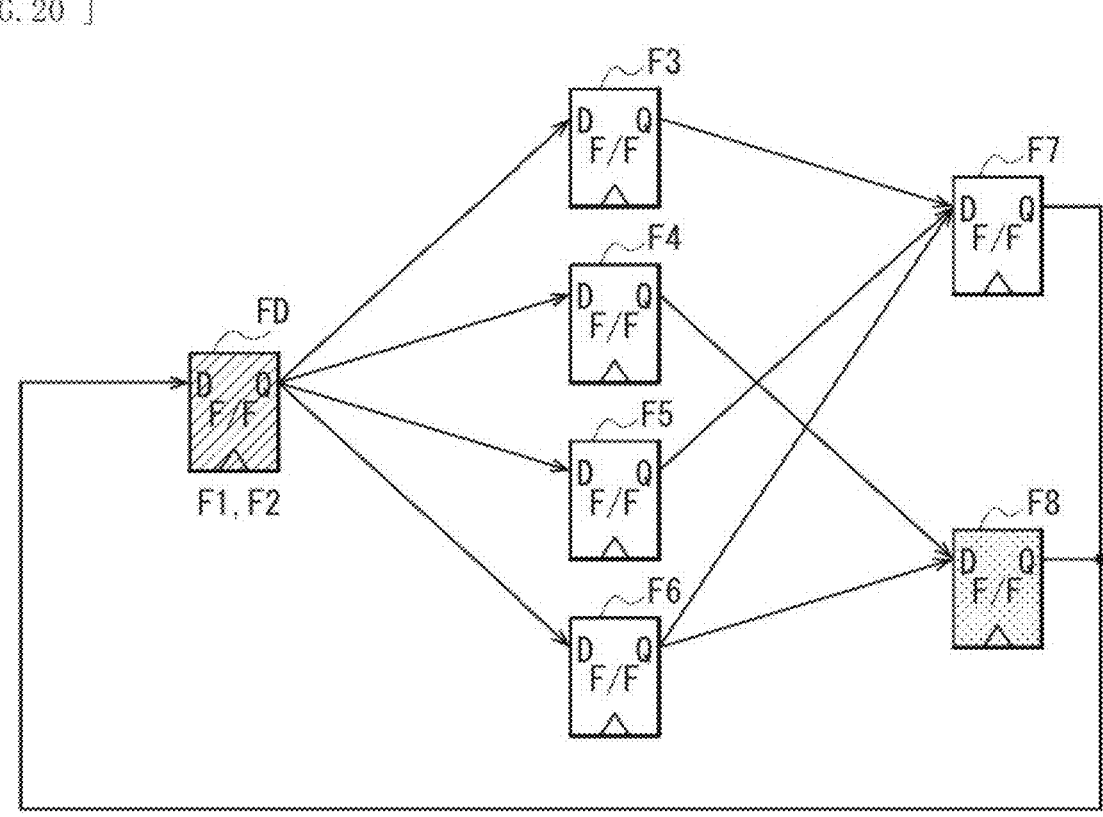

[ FIG. 21A ]
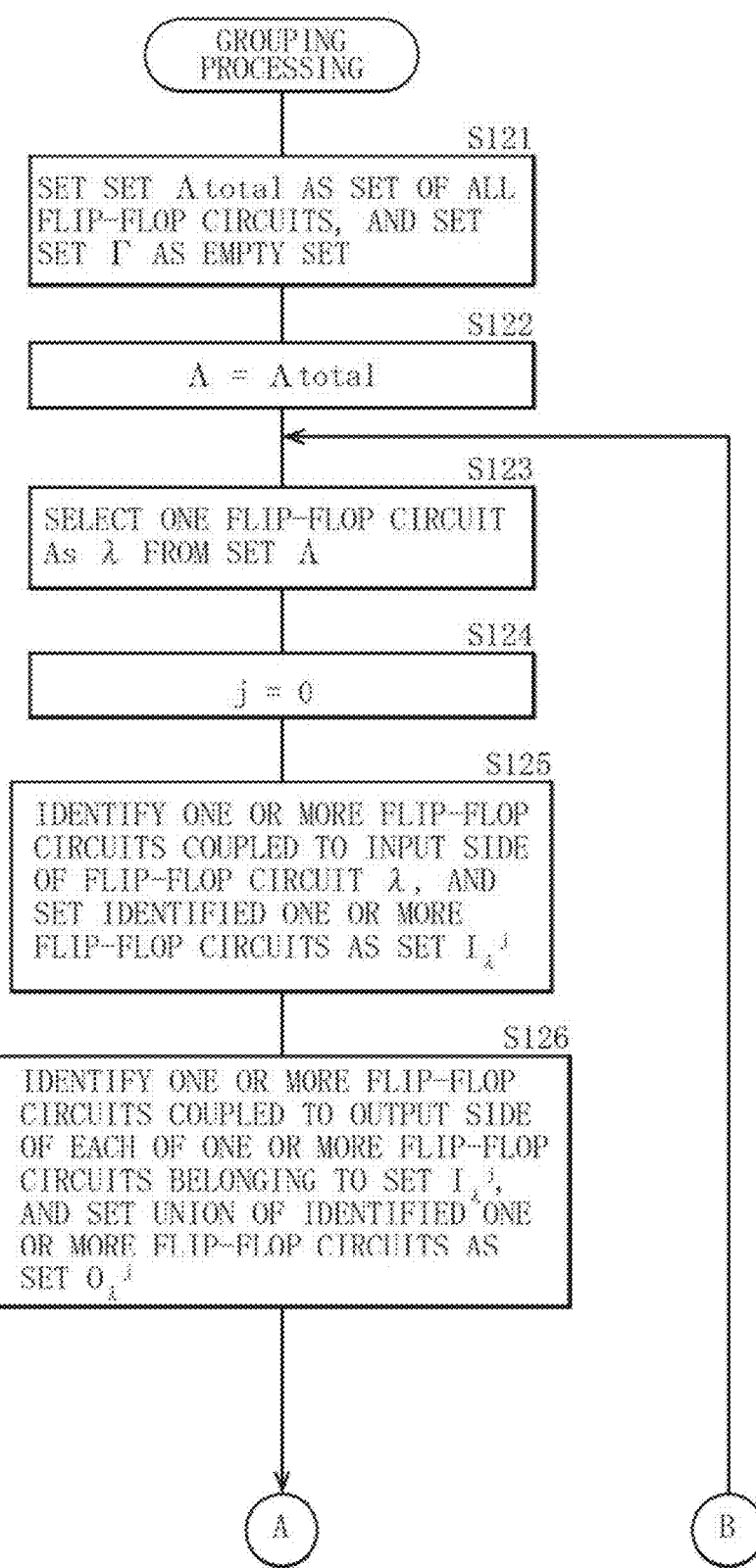

[ FIG. 21B ]

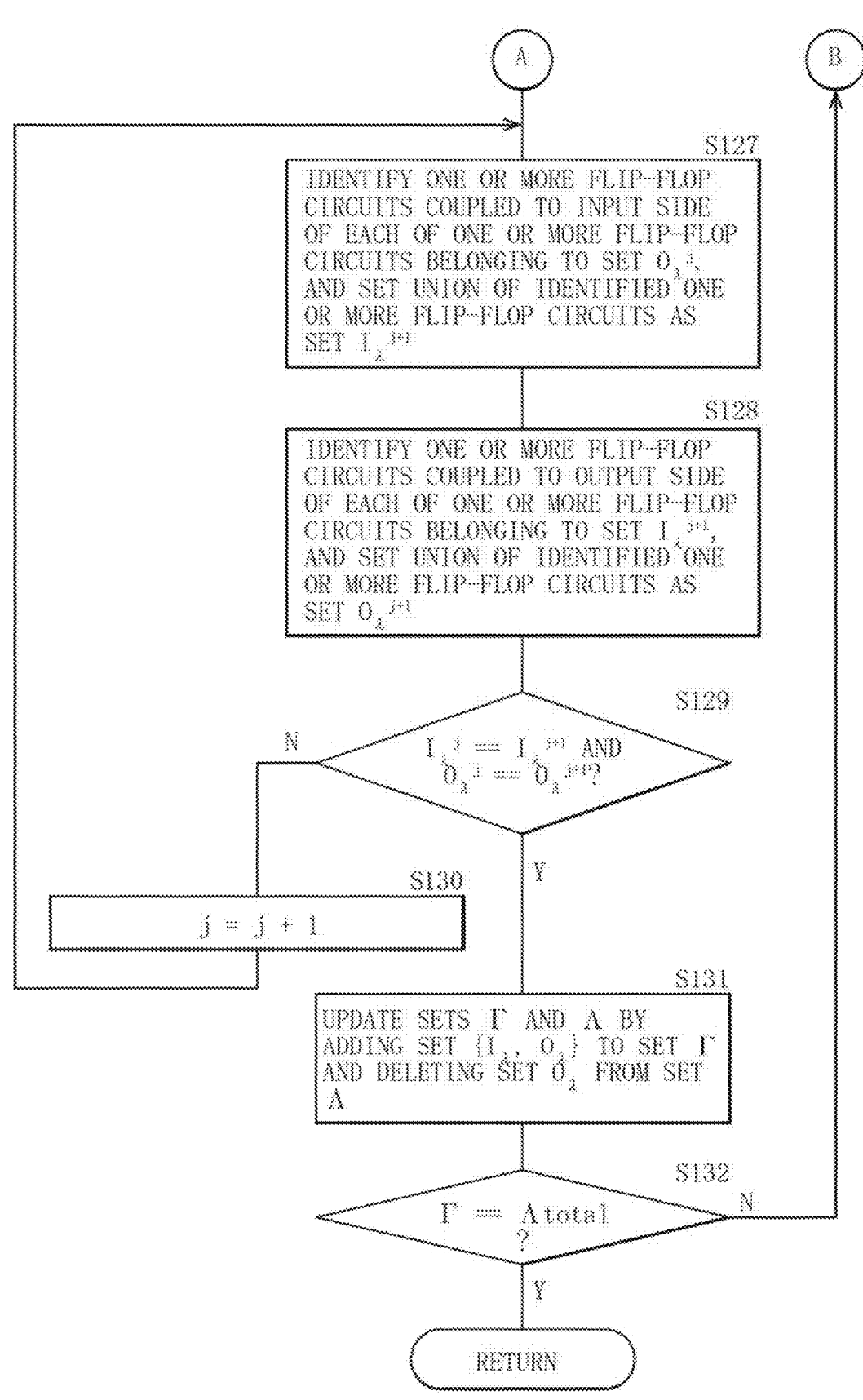

A

B

S127

IDENTIFY ONE OR MORE FLIP-FLOP CIRCUITS COUPLED TO INPUT SIDE OF EACH OF ONE OR MORE FLIP-FLOP CIRCUITS BELONGING TO SET $O_2^j$, AND SET UNION OF IDENTIFIED ONE OR MORE FLIP-FLOP CIRCUITS AS SET $I_2^{j+1}$

S128

IDENTIFY ONE OR MORE FLIP-FLOP CIRCUITS COUPLED TO OUTPUT SIDE OF EACH OF ONE OR MORE FLIP-FLOP CIRCUITS BELONGING TO SET $I_2^{j+1}$, AND SET UNION OF IDENTIFIED ONE OR MORE FLIP-FLOP CIRCUITS AS SET $O_2^{j+1}$

S129

$I_2^j == I_2^{j+1}$ AND $O_2^j == O_2^{j+1}$?

N

Y

S130

$j = j + 1$

S131

UPDATE SETS $\Gamma$ AND $\Lambda$ BY ADDING SET $\{I_2, O_2\}$ TO SET $\Gamma$ AND DELETING SET $O_2$ FROM SET $\Lambda$

S132

$\Gamma == \Lambda$ total ?

N

Y

RETURN

[ FIG. 22 ]
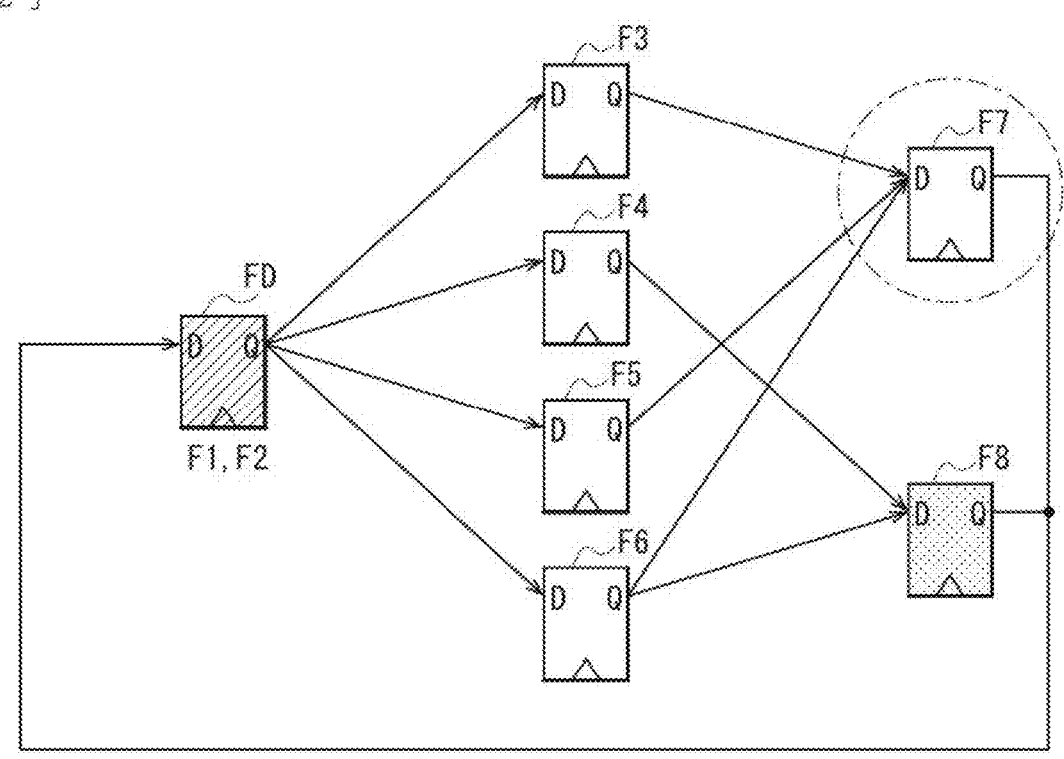
[ FIG. 23 ]
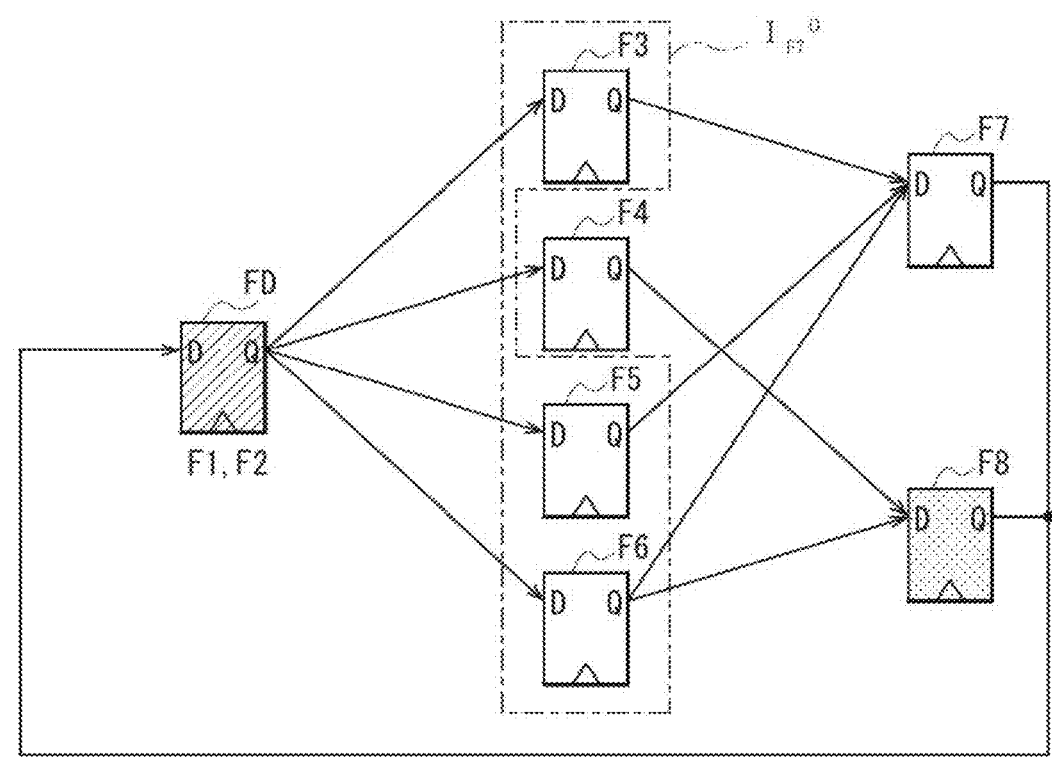

[ FIG. 24 ]
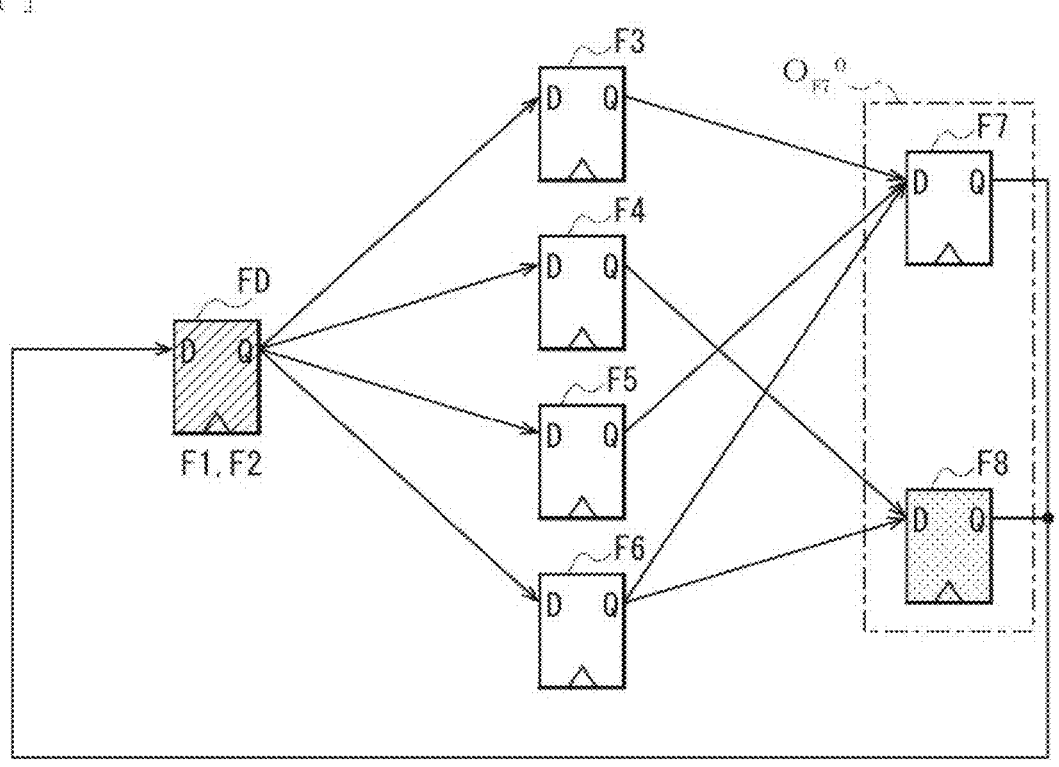
[ FIG. 25 ]
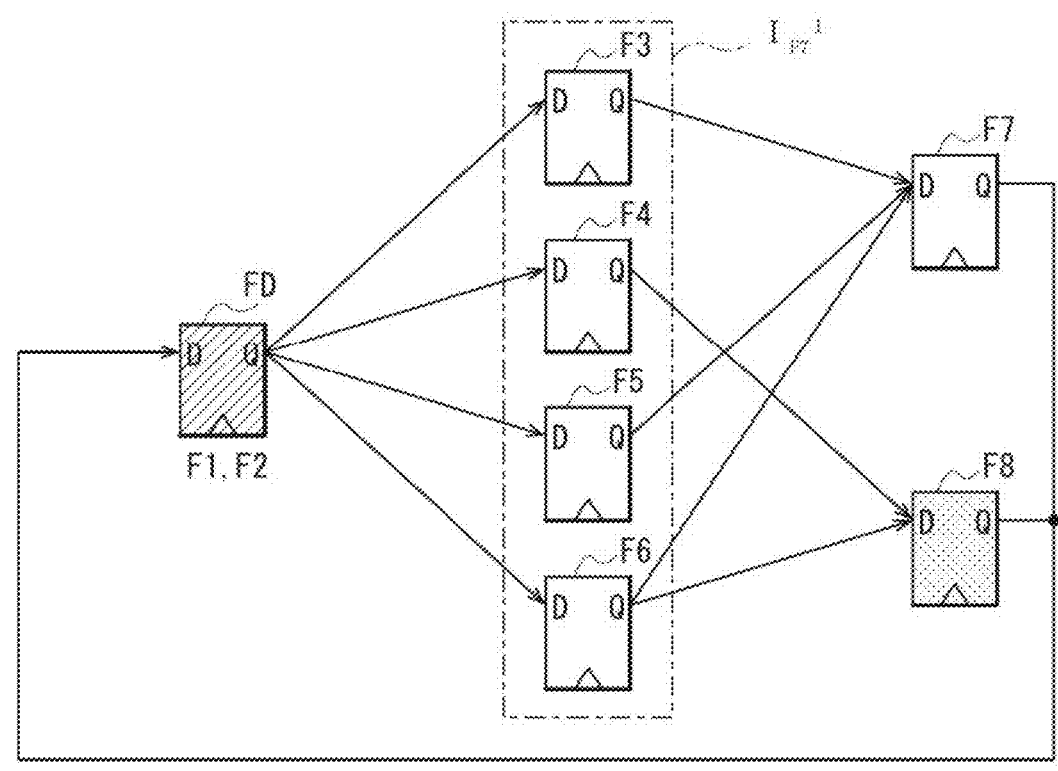

[ FIG. 26 ]
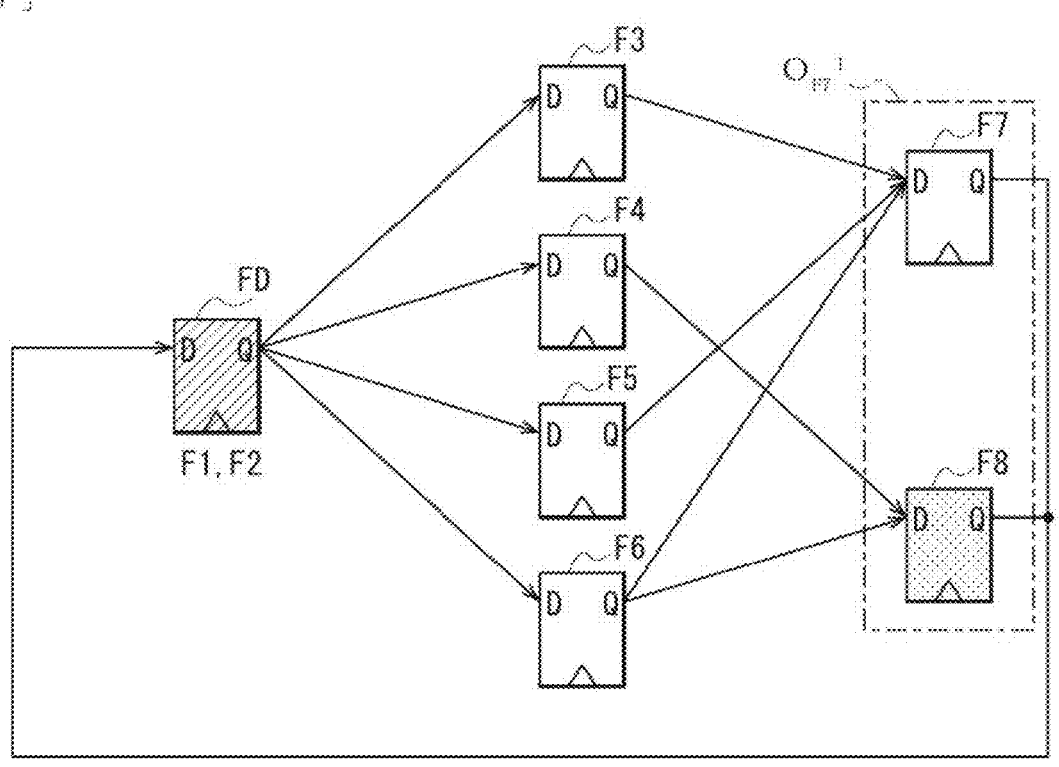
[ FIG. 27 ]
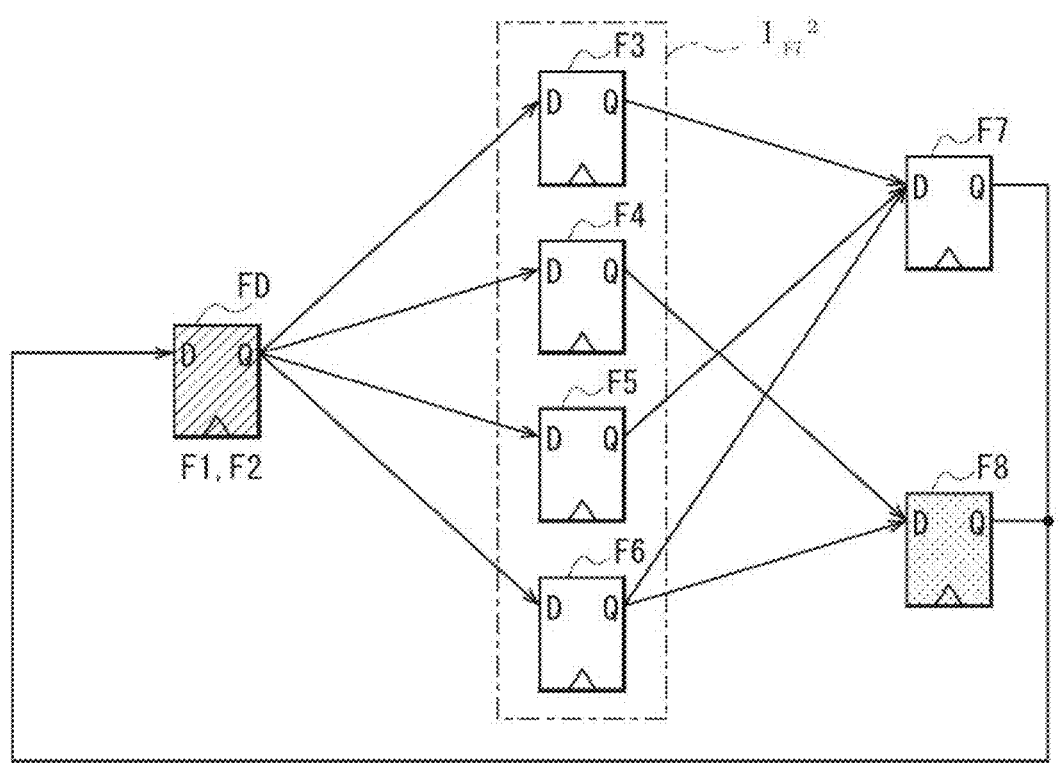

[ FIG. 28 ]
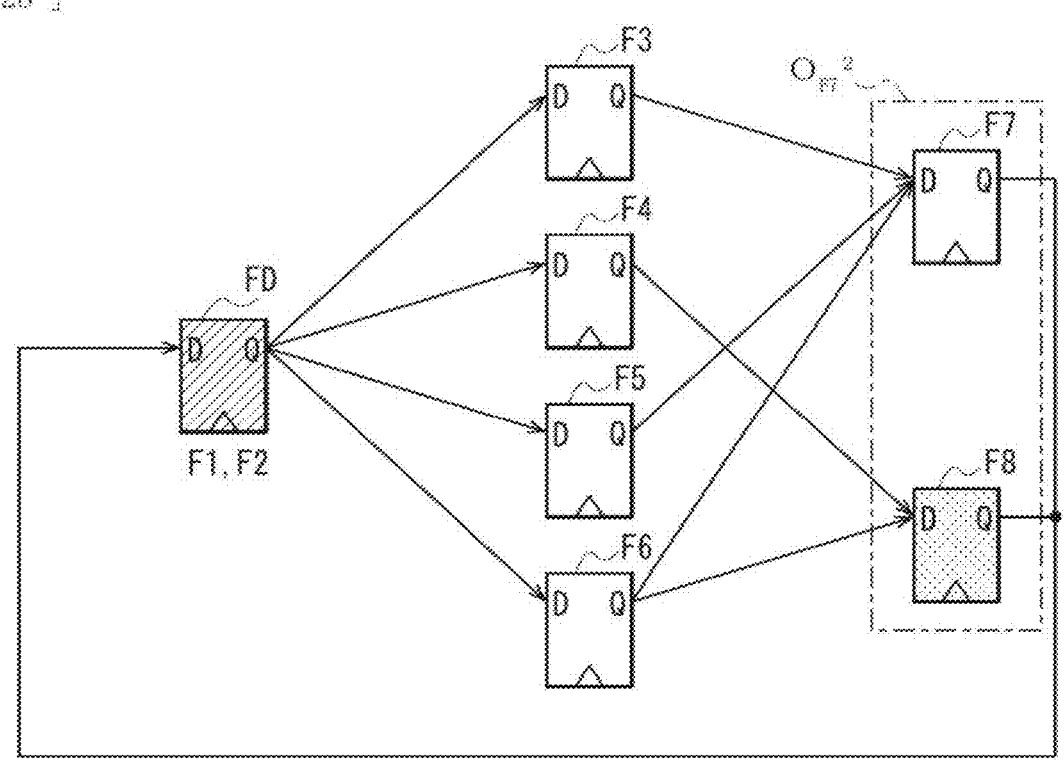
[ FIG. 29 ]
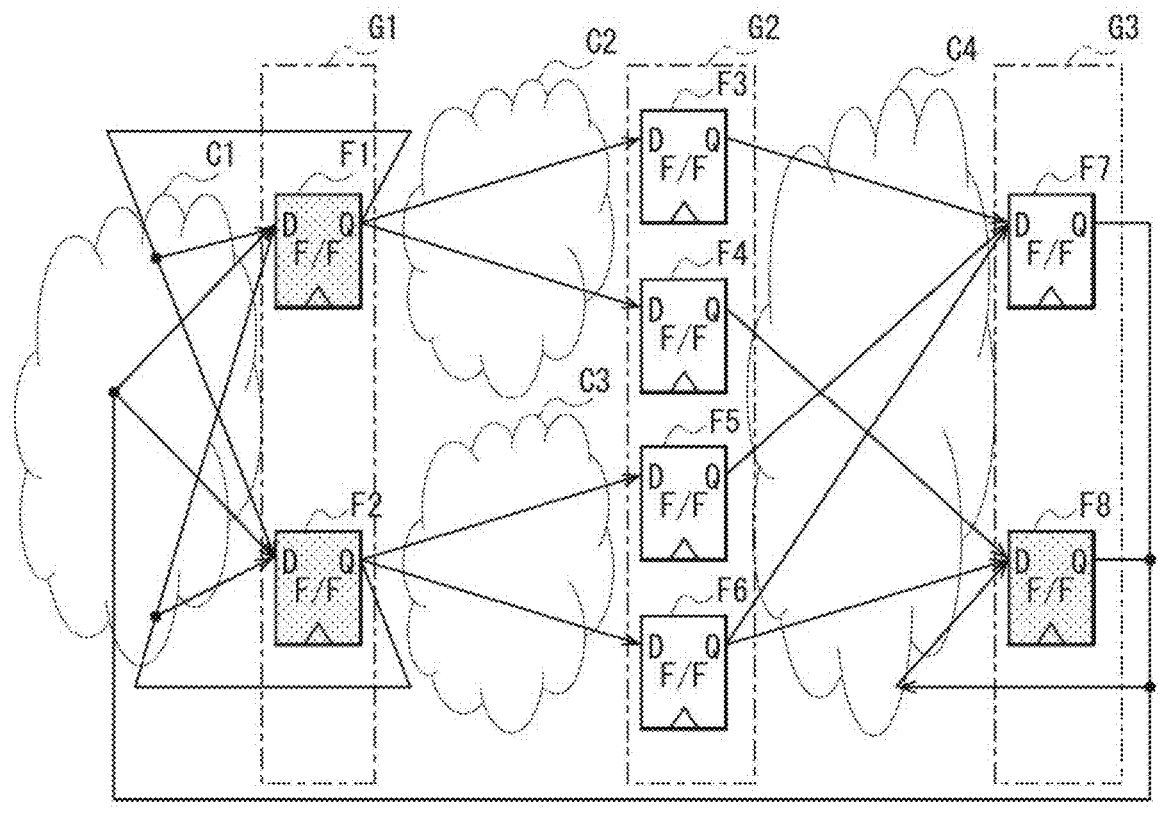

[ FIG. 30 ]

[FIG. 31]
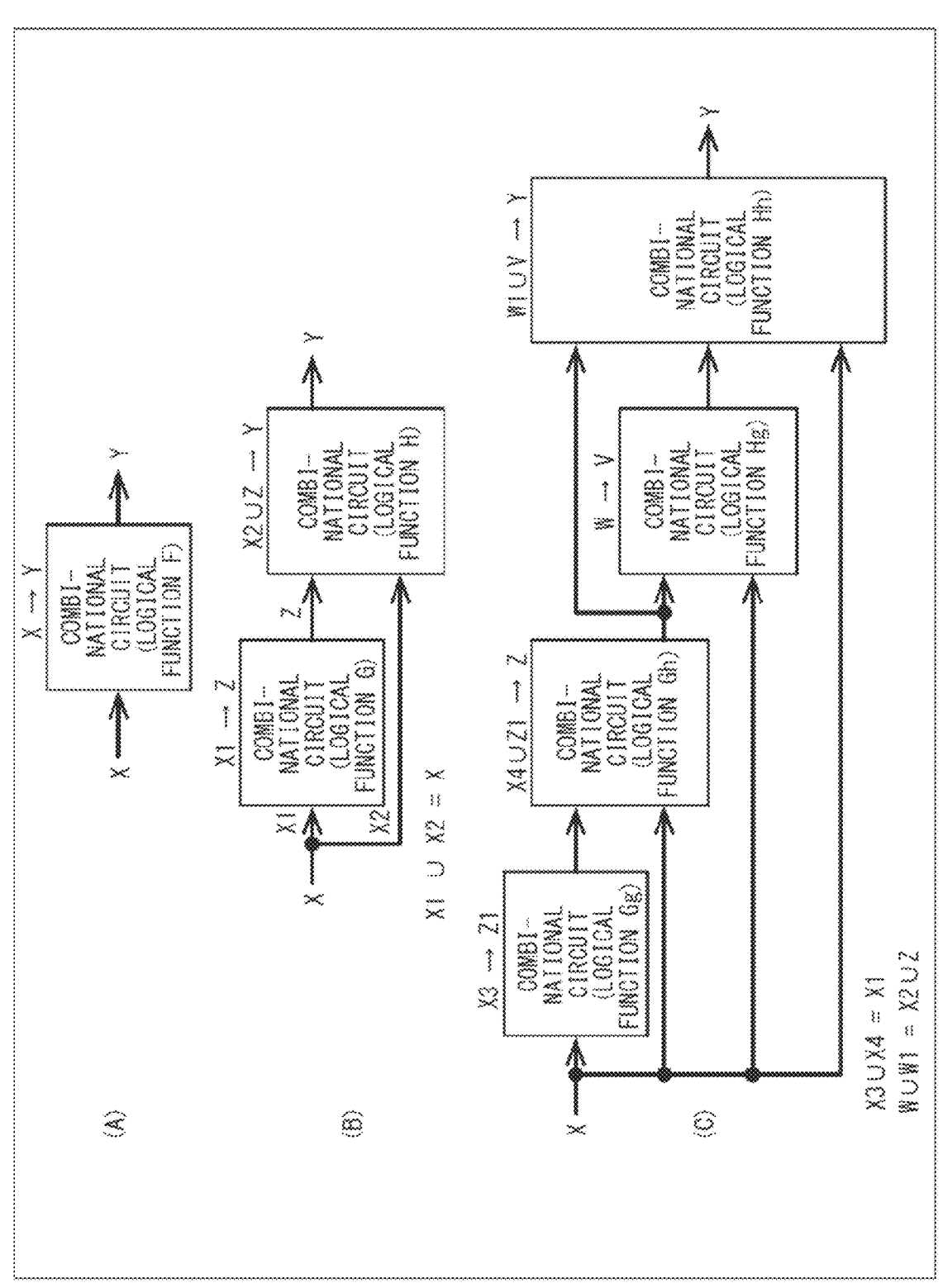

[ FIG. 32 ]

[FIG. 33]
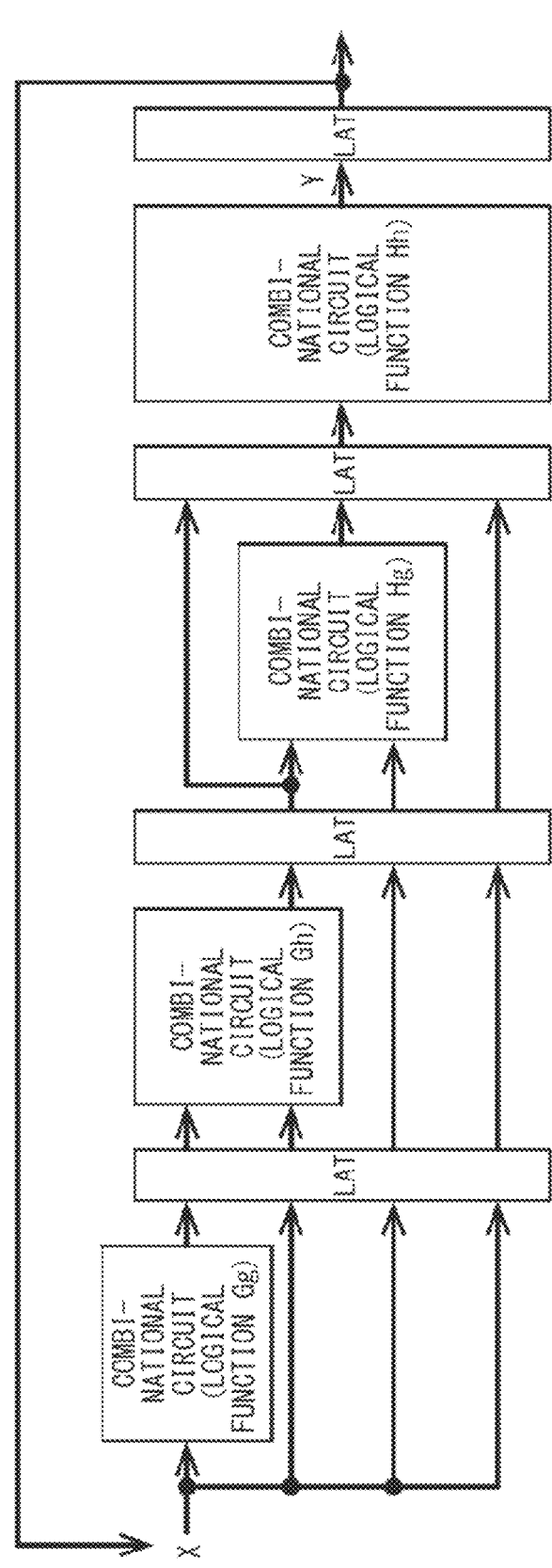

[FIG. 34]
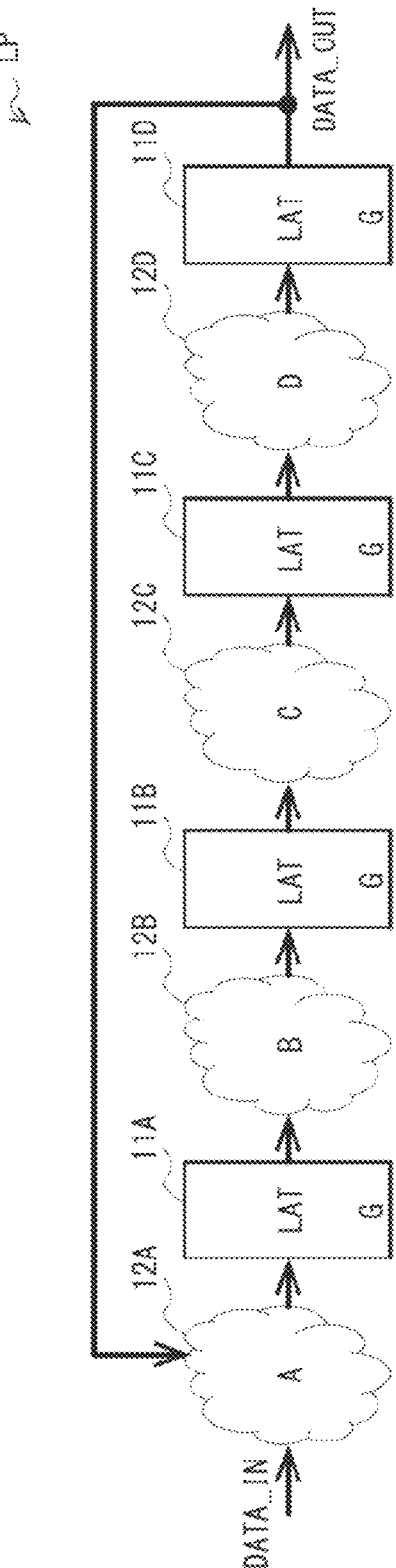

[ FIG. 35 ]
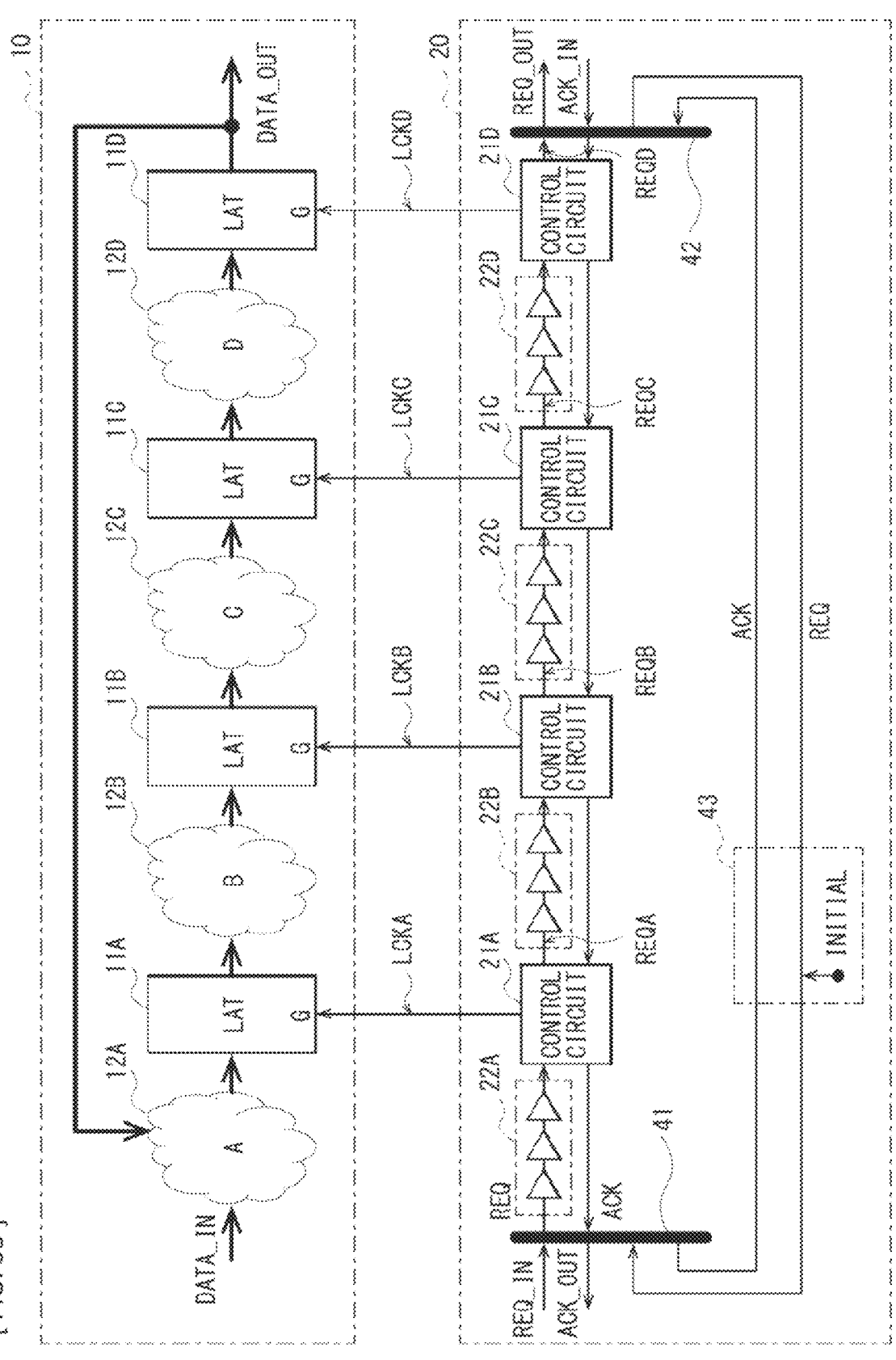

[ FIG. 36 ]
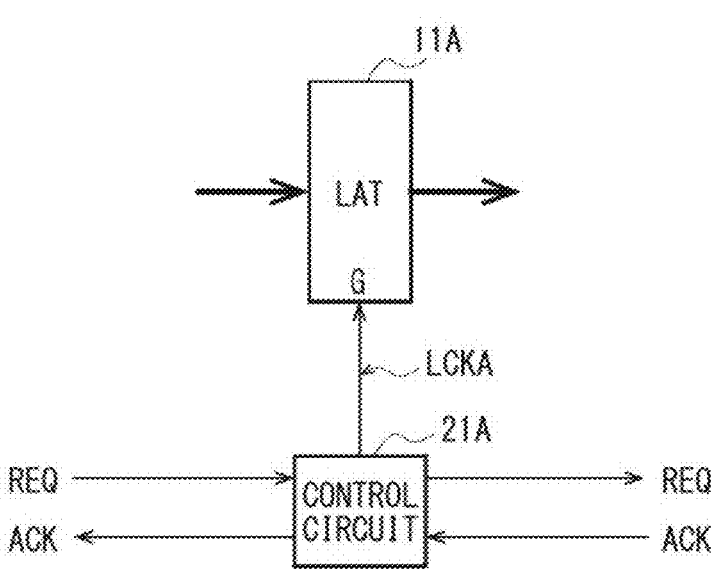

[ FIG. 37 ]
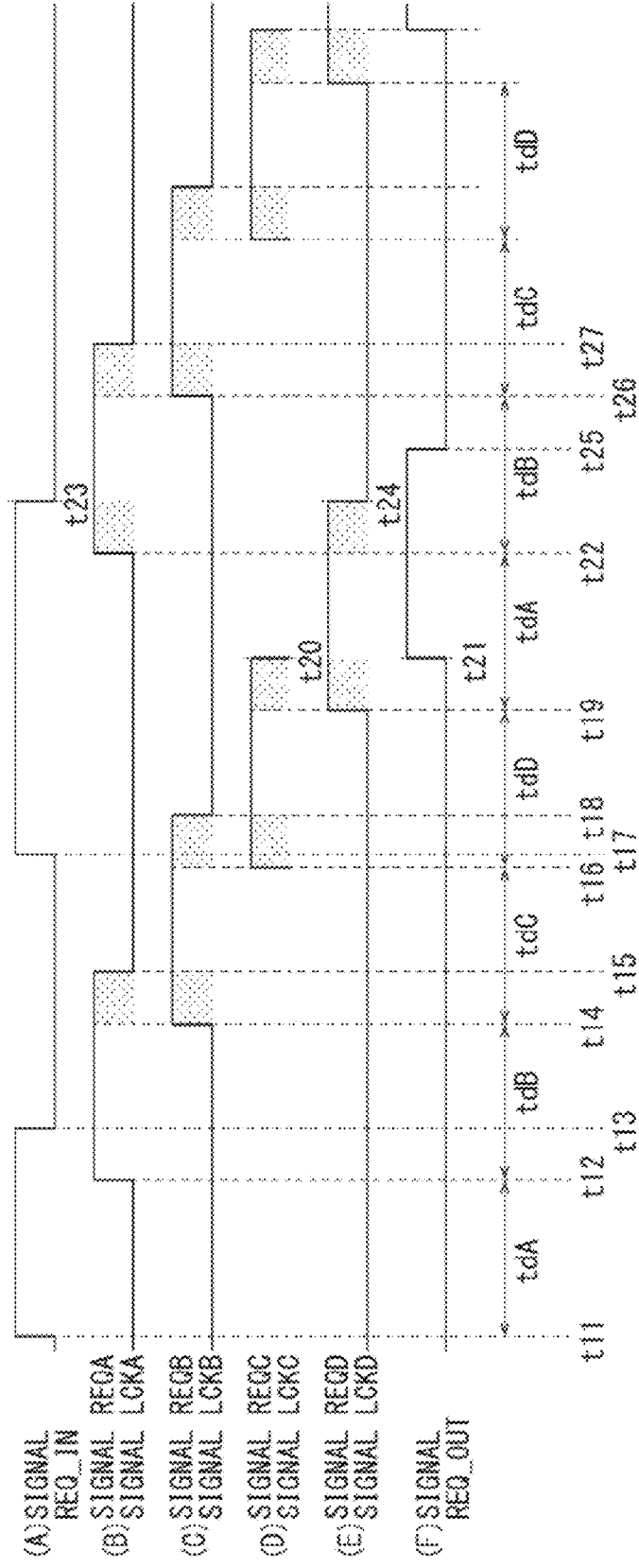

[ FIG. 38 ]
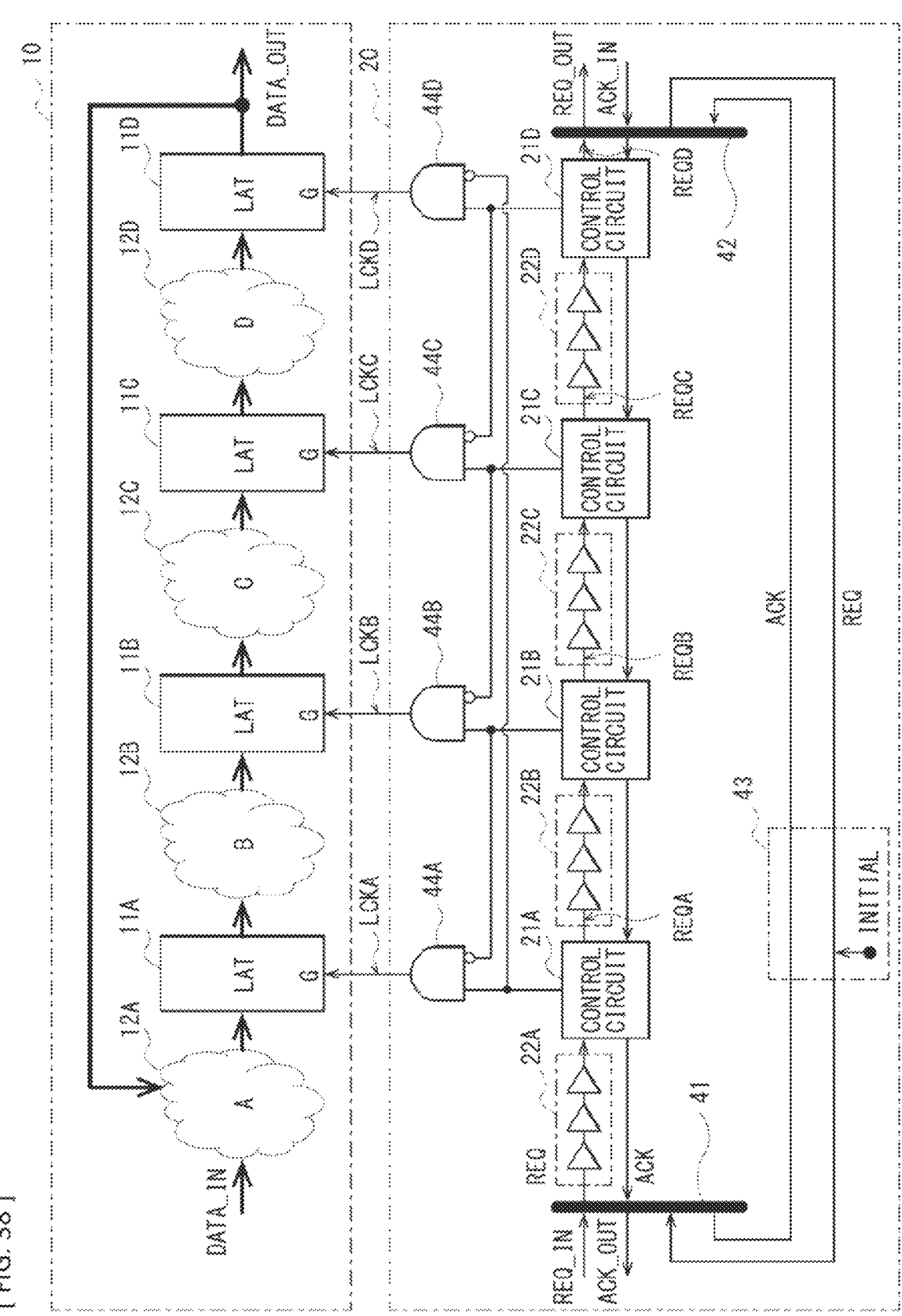

[ FIG. 39 ]
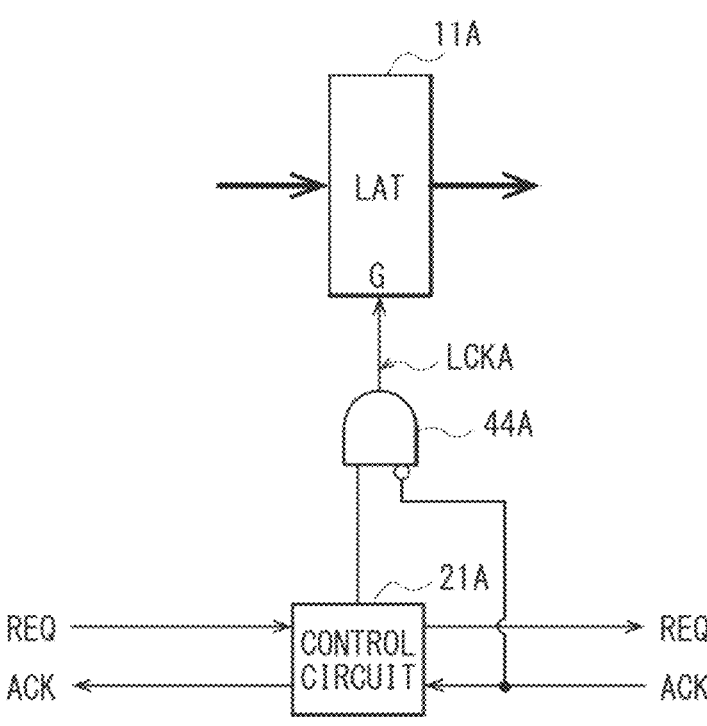

[FIG. 40]
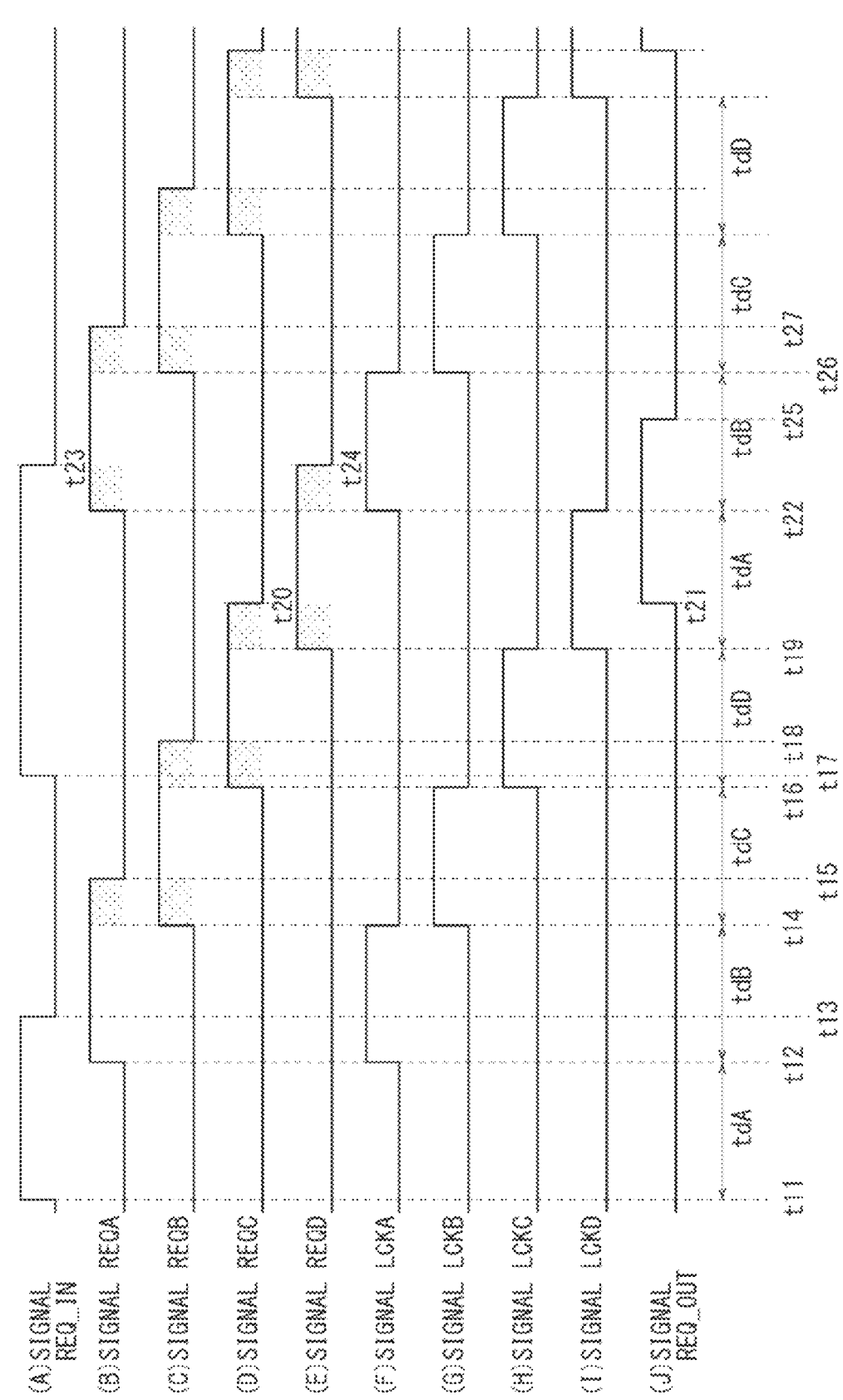

[FIG. 41]
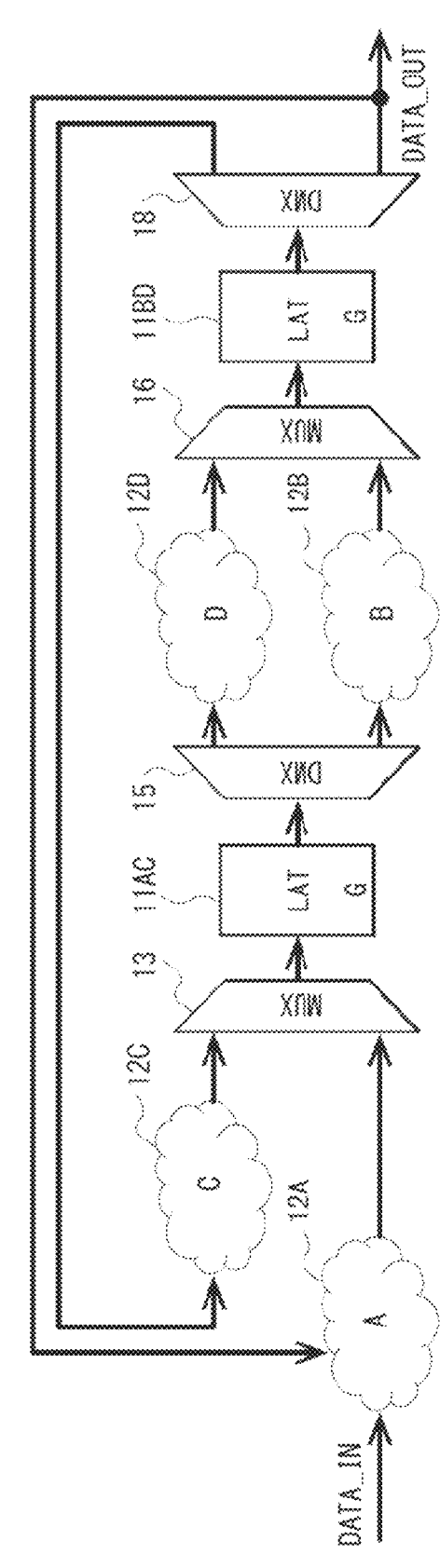

[ FIG. 42 ]
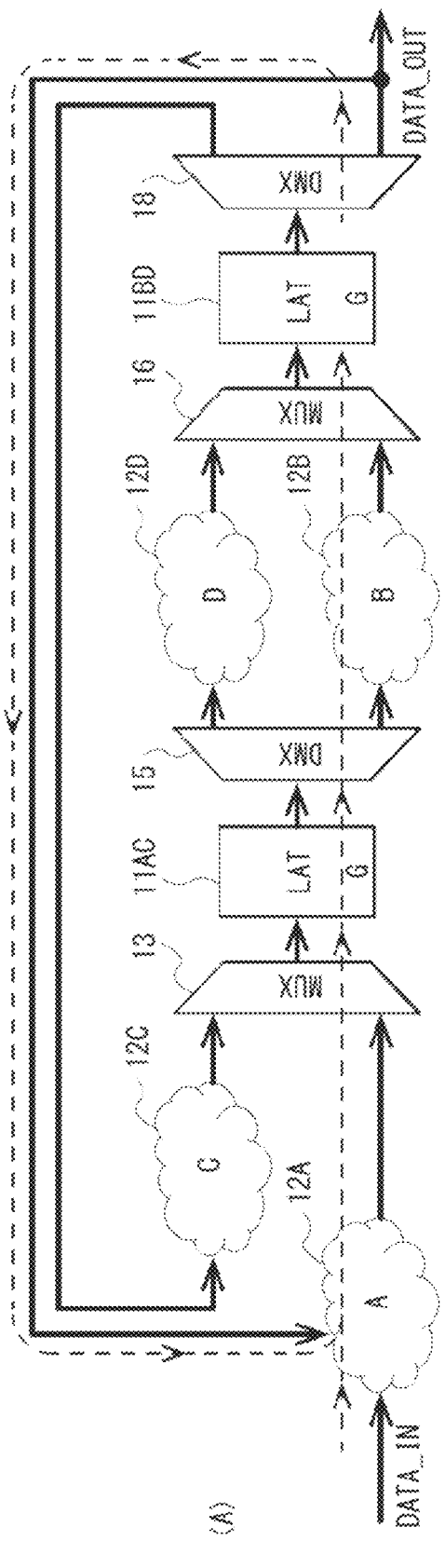
(A)
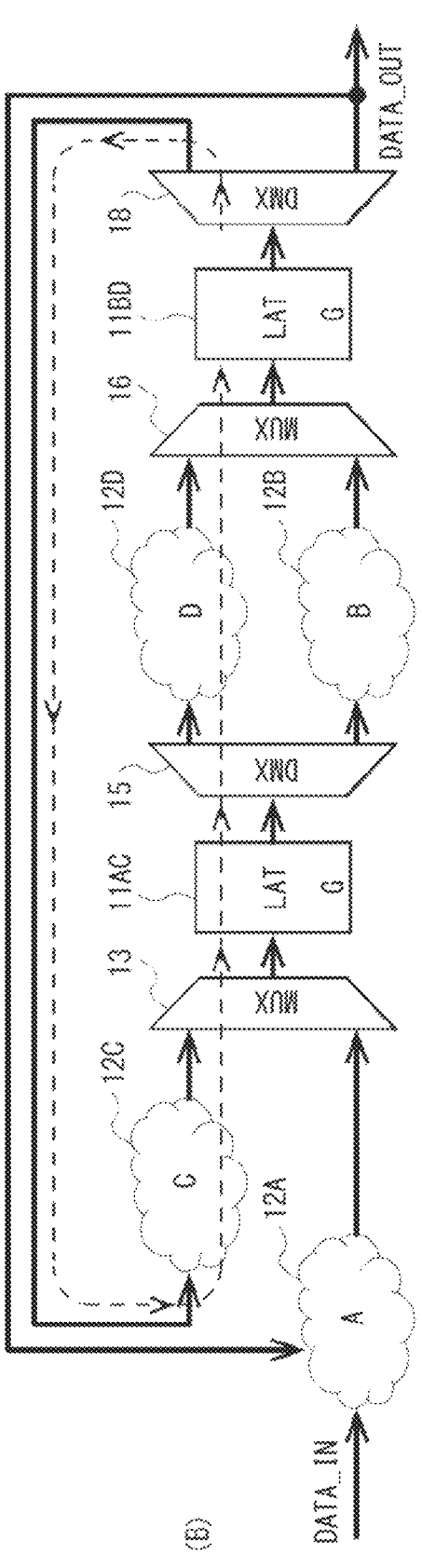
(B)

[ FIG. 43 ]
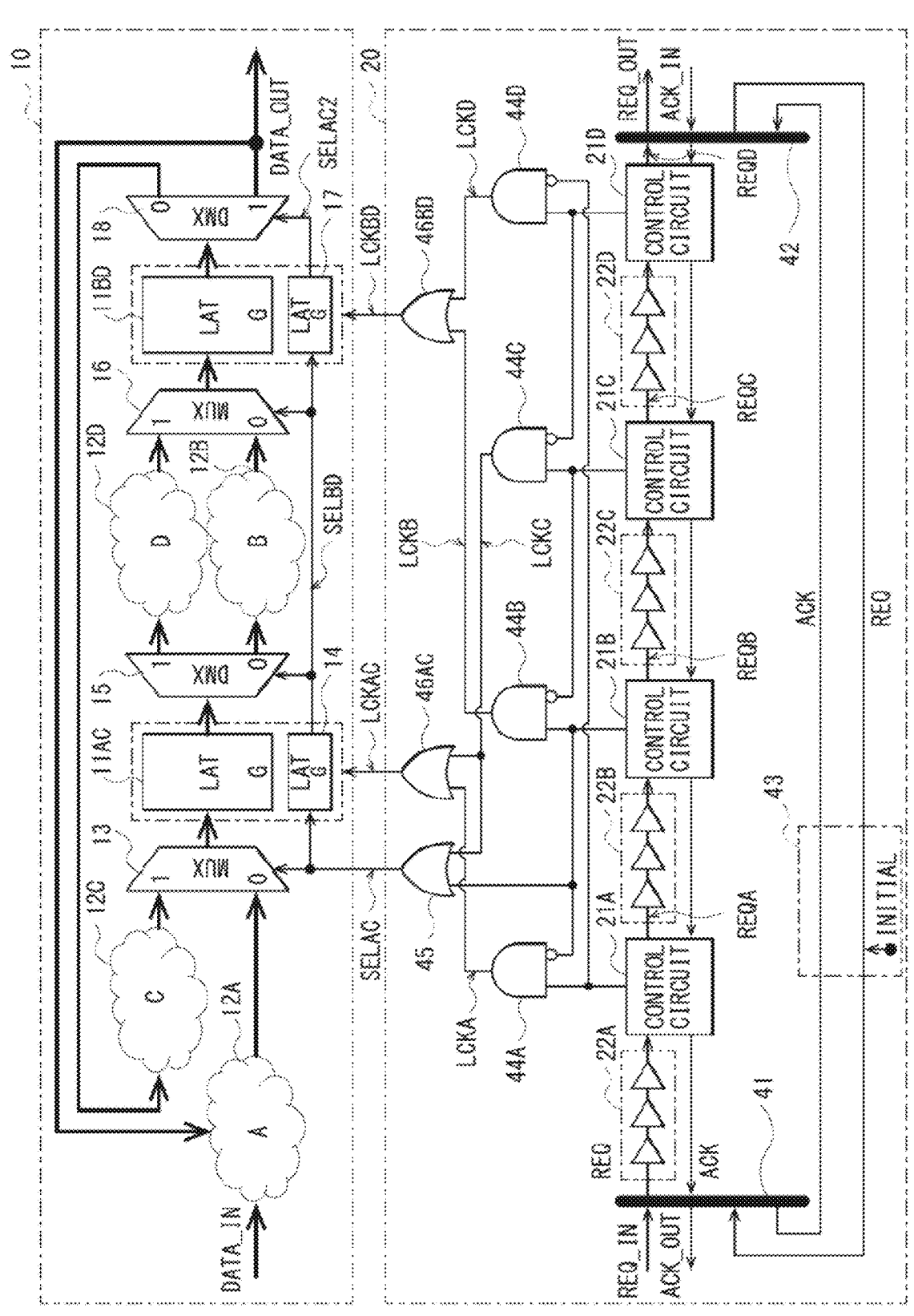

[FIG. 44]
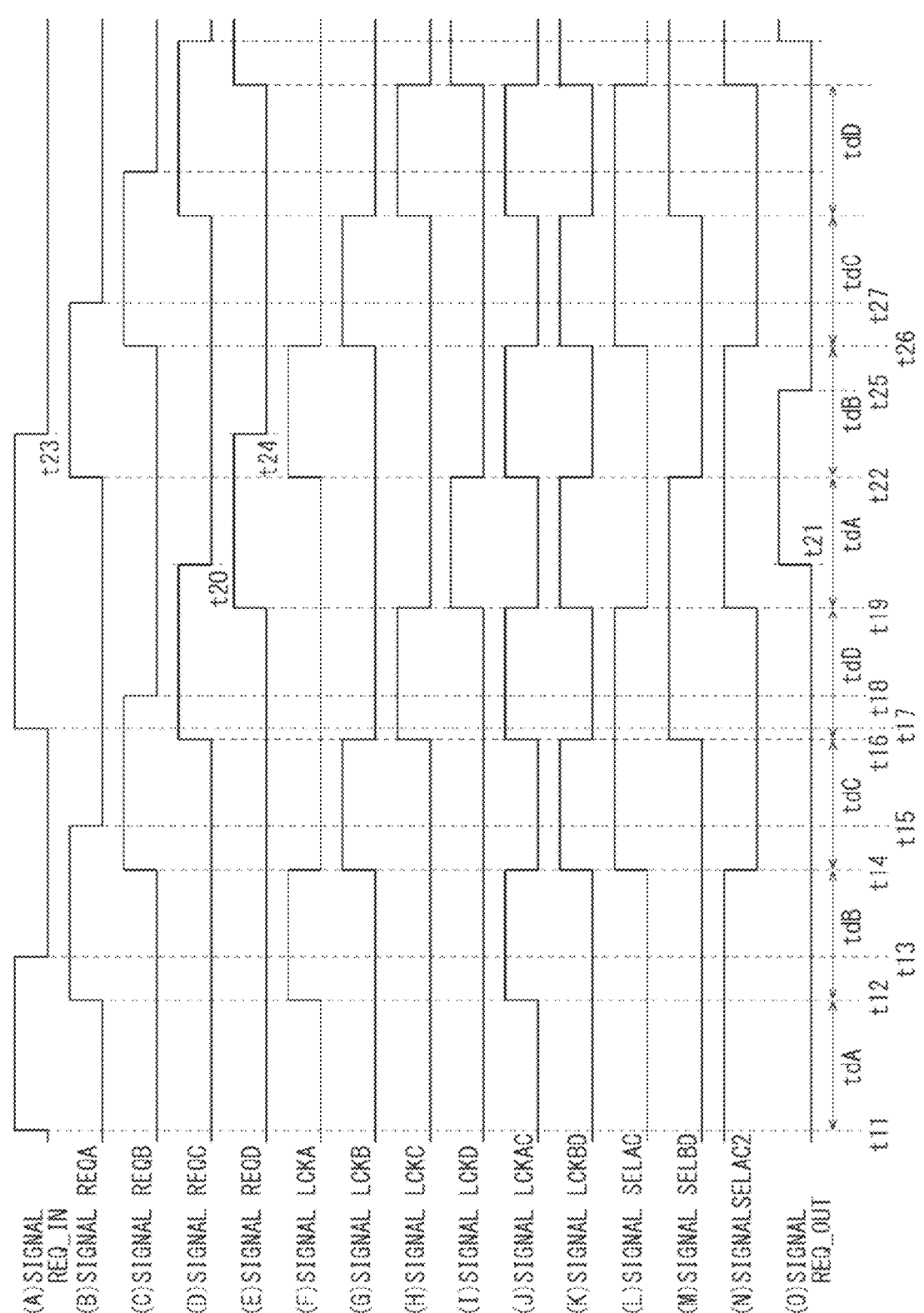

[ FIG. 45 ]
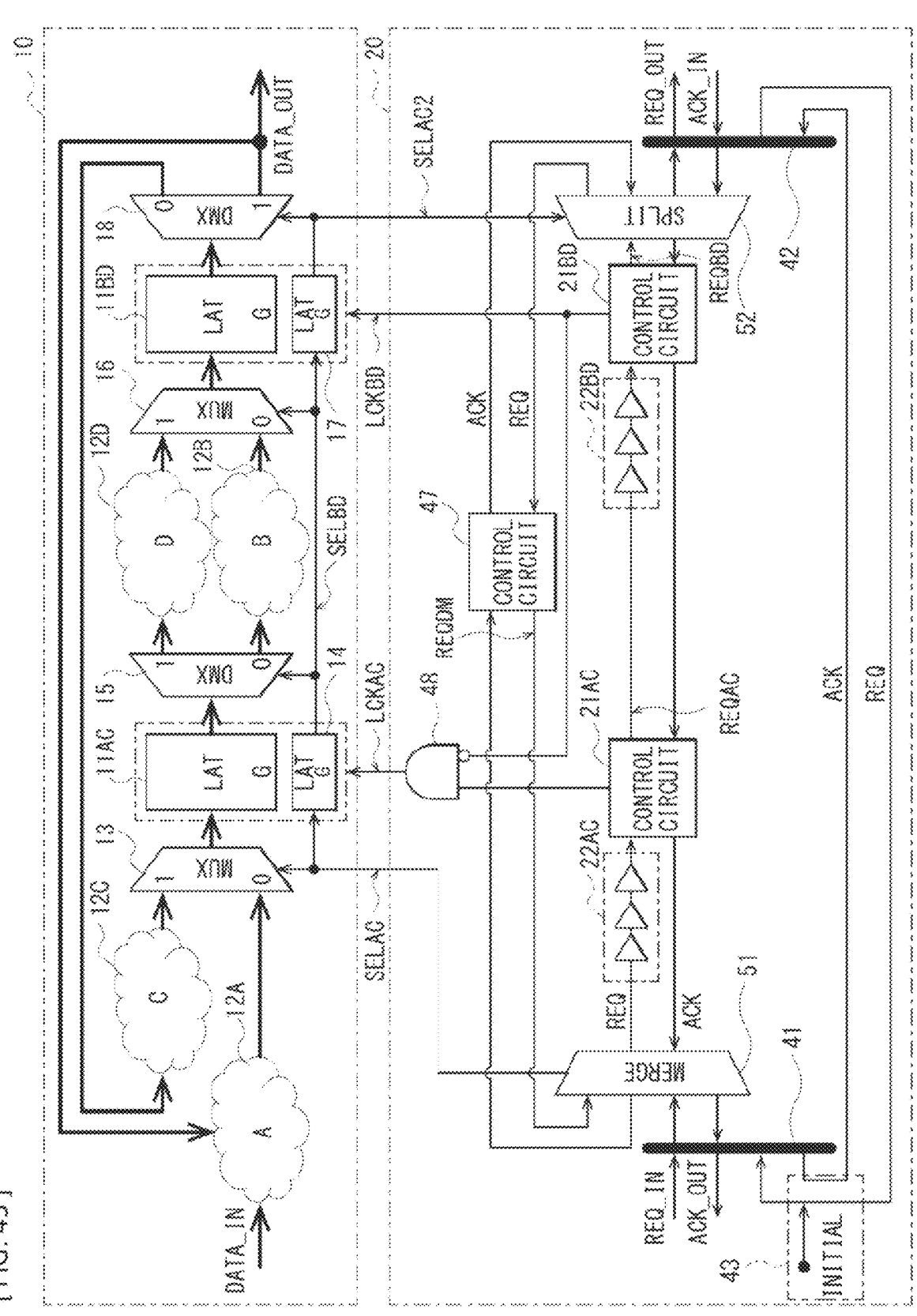

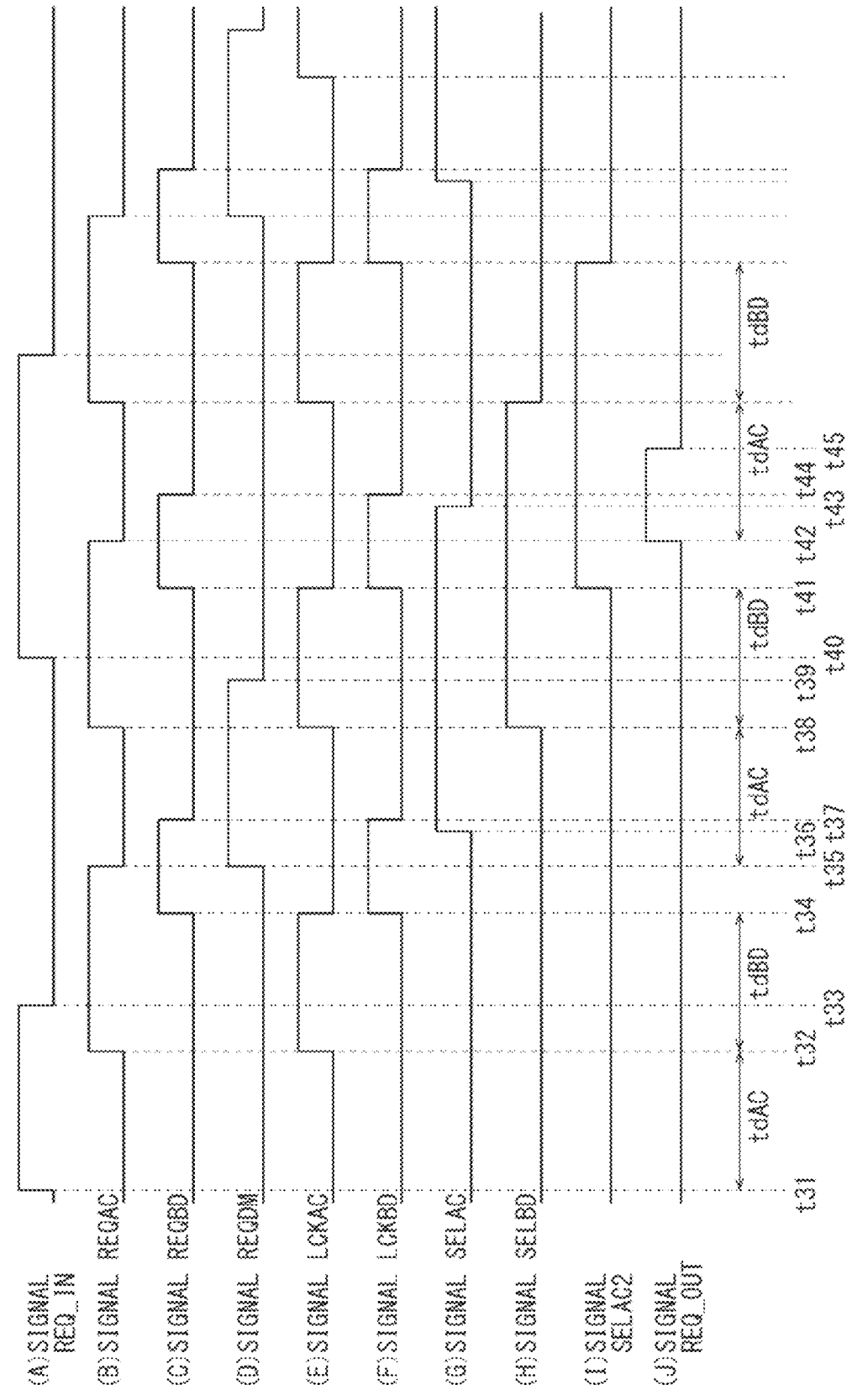
[FIG. 46]

[ FIG. 47 ]
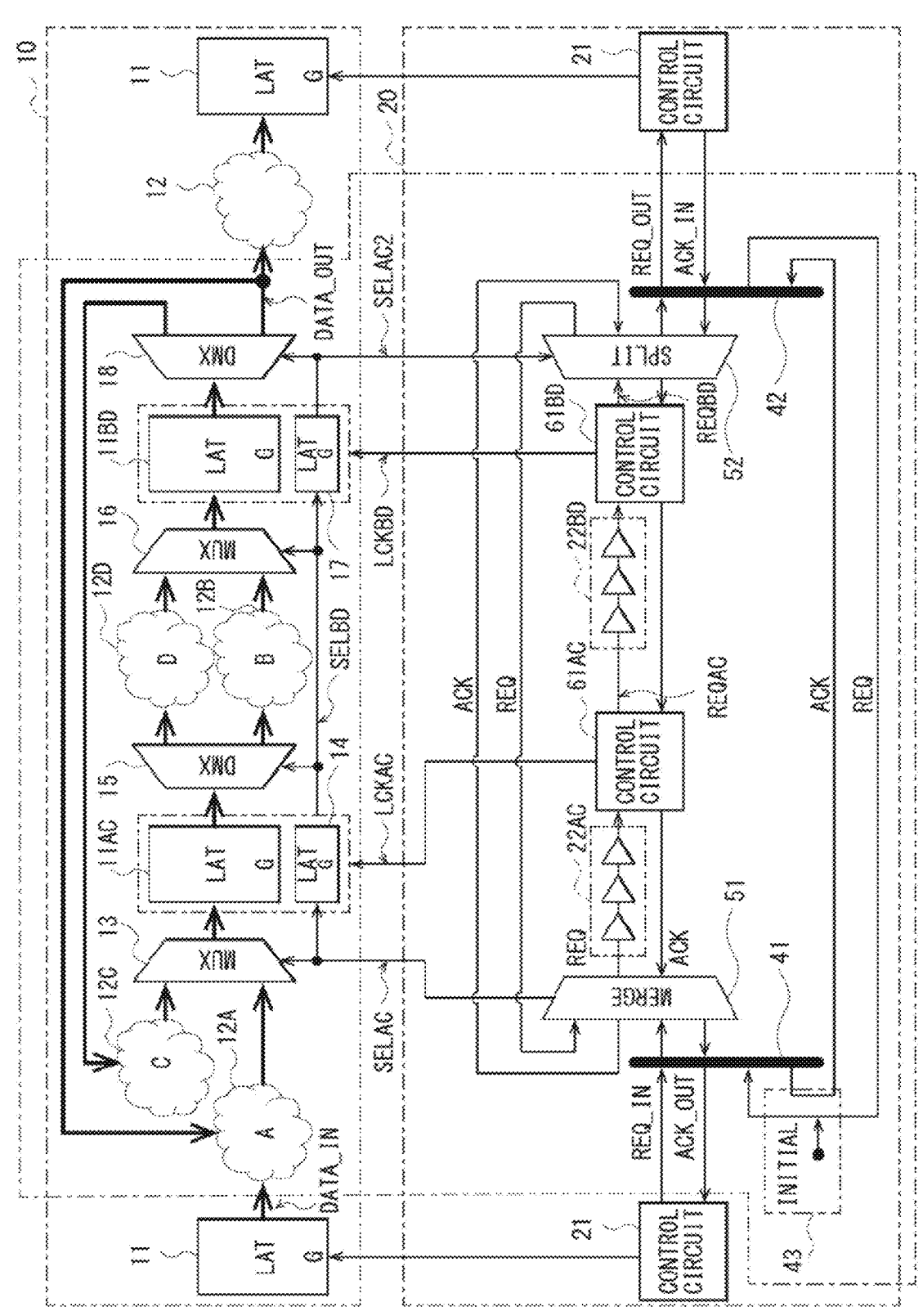

[ FIG. 48 ]
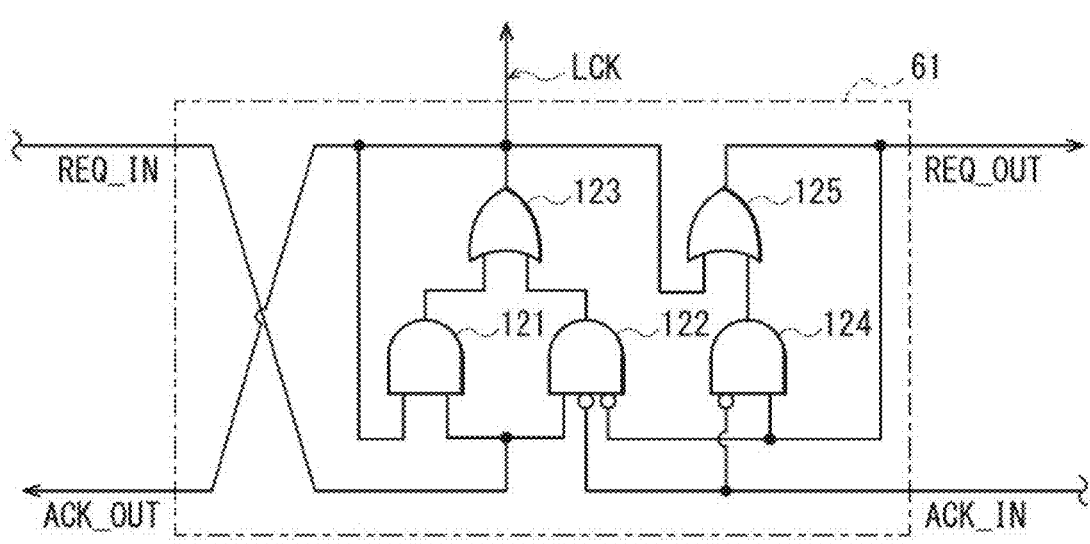

[ FIG. 49 ]
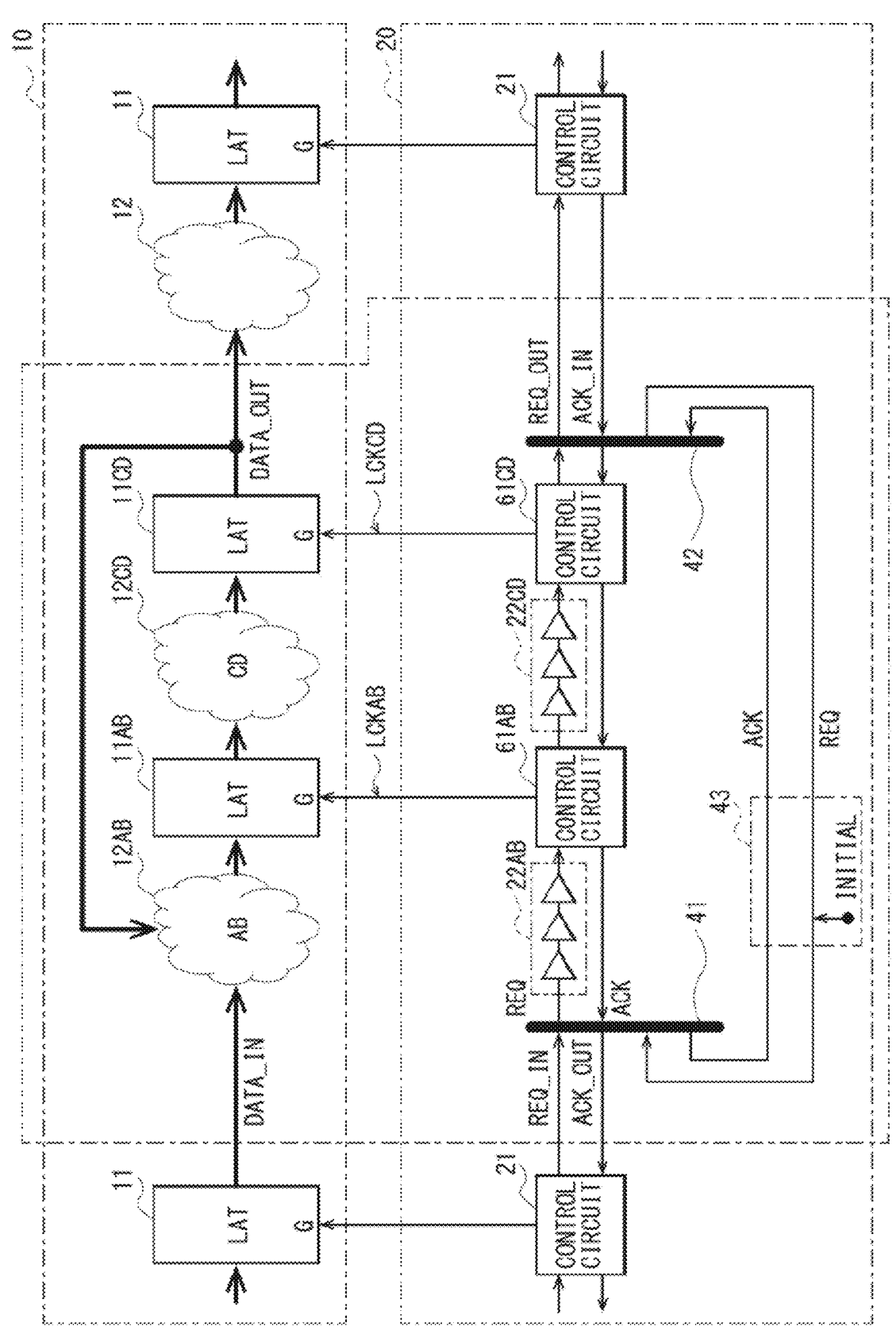

[ FIG. 50 ]
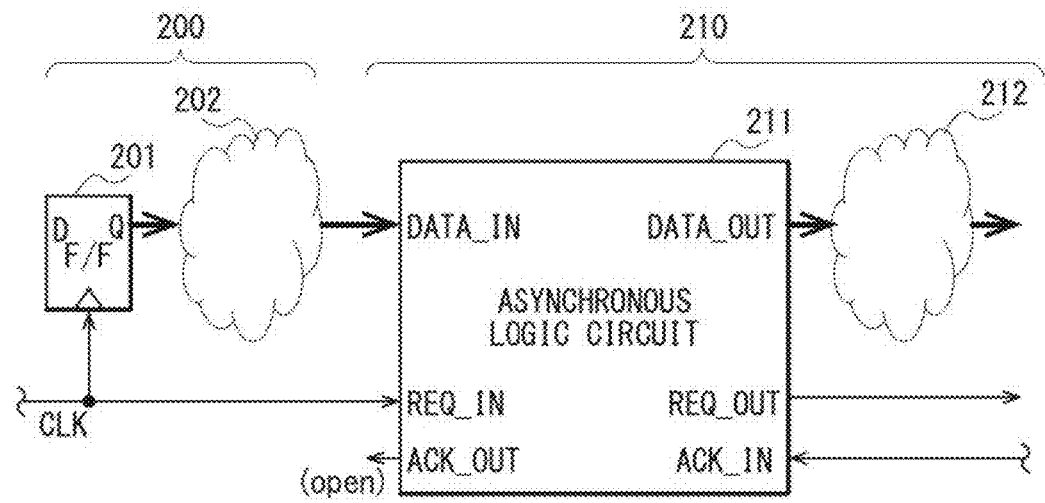
[ FIG. 51 ]
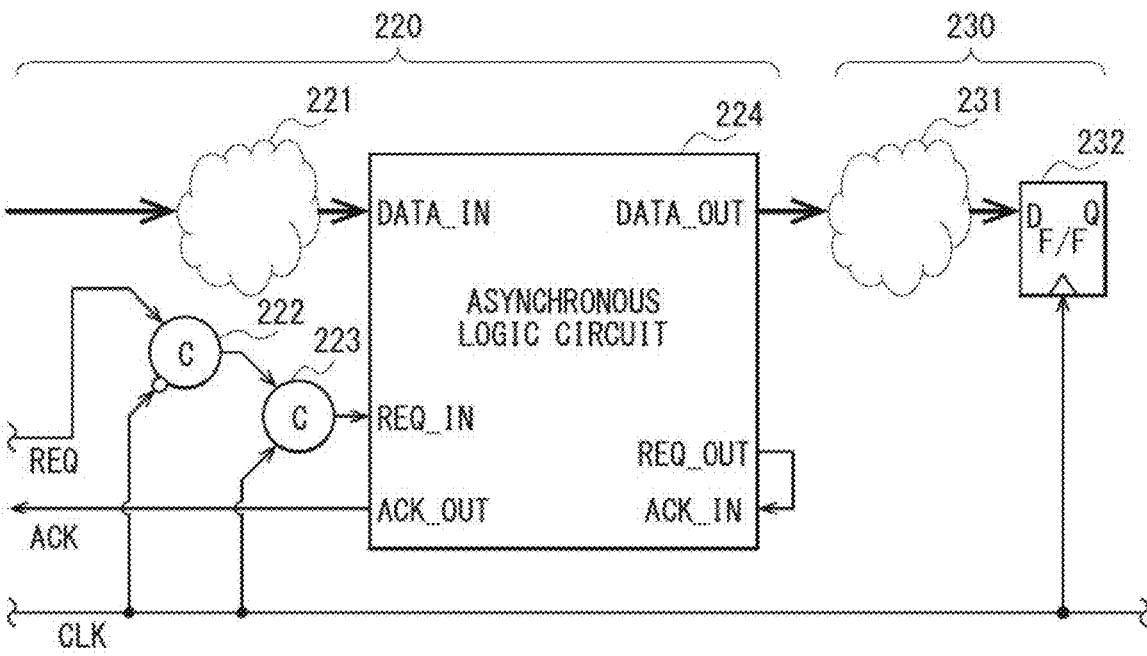

[ FIG. 52 ]
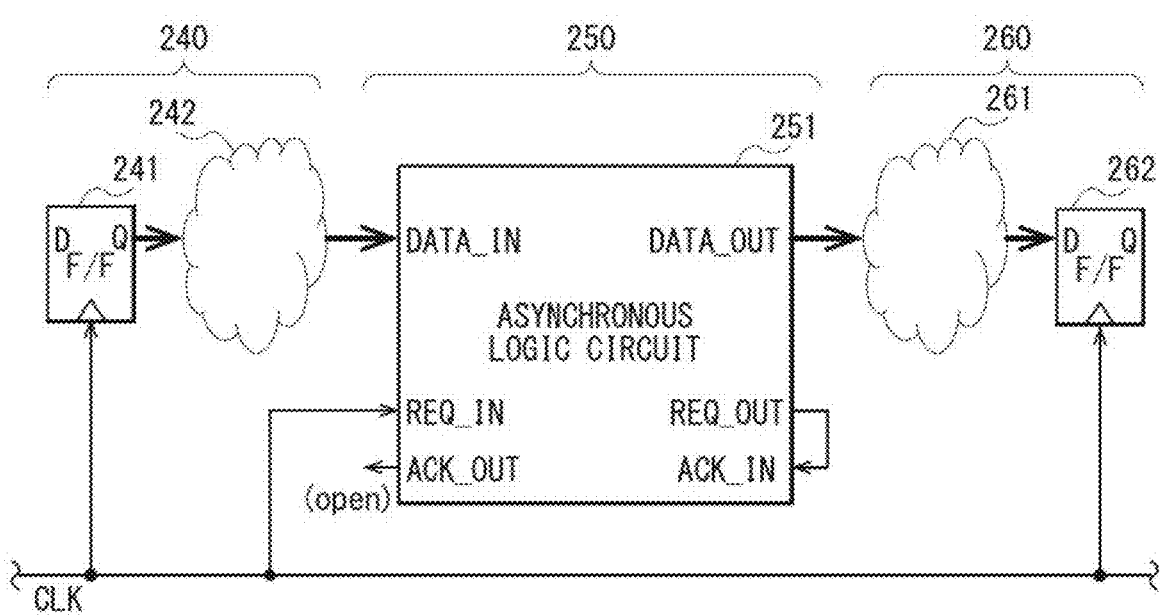

PROCESSING METHOD, ASYNCHRONOUS CIRCUIT, AND LOGIC CIRCUIT

TECHNICAL FIELD

The present disclosure relates to a processing method to be performed on a circuit, an asynchronous circuit generated with use of such a processing method, and a logic circuit.

BACKGROUND ART

Logic circuits include a synchronous logic circuit and an asynchronous logic circuit. For example, PTL 1 discloses a conversion method in which a synchronous circuit is converted into an asynchronous circuit while maintaining flow equivalence.

CITATION LIST

Non-Patent Literature

NPTL 1: I. Blunno, J. Cortadella, A. Kondratyev, L. Lavagno, K. Lwin, and C. Sotiriou, "Handshake Protocols for De-synchronization," 10th International Symposium on Asynchronous Circuits and Systems, 2004. Proceedings., 19-23 Apr. 2004.

SUMMARY OF THE INVENTION

In a synchronous circuit, a flip-flop circuit frequently forms a self-feedback loop. In a synchronous circuit having such a flip-flop circuit, it is desired to be able to effectively identify a flip-flop circuit preceding a combinational circuit and a flip-flop circuit subsequent to the combinational circuit.

It is desirable to provide a processing method, an asynchronous circuit, and a logic circuit that make it possible to effectively identify flip-flop circuits preceding and subsequent to a combinational circuit.

A processing method according to an embodiment of the present disclosure includes: causing a computer to perform first processing for identifying one or a plurality of flip-flop circuits each forming a self-feedback loop from among a plurality of flip-flop circuits in a synchronous circuit, deleting a feedback path in the self-feedback loop, identifying two or more flip-flop circuits forming strongly coupled components from among the one or plurality of flip-flop circuits, and replacing the two or more flip-flop circuits forming the strongly coupled components with one dummy flip-flop circuit; and causing the computer to perform second processing for alternately performing processing for searching for one or more flip-flop circuits coupled to input side of one or more flip-flop circuits out of the plurality of flip-flop circuits including the dummy flip-flop circuit through a combinational circuit, and processing for searching for one or more flip-flop circuits coupled to output side of the searched one or more flip-flop circuits through the combinational circuit a plurality of times to thereby identify first one or more flip-flop circuits coupled to input side of the combinational circuit and second one or more flip-flop circuits coupled to output side of the combinational circuit.

An asynchronous circuit according to an embodiment of the present disclosure includes a first combinational circuit, a second combinational circuit, a first multiplexer, a first latch circuit, a first control latch circuit, a first demultiplexer, a third combinational circuit, a fourth combinational circuit, a second multiplexer, a second latch circuit, a second control latch circuit, a second demultiplexer, and a handshake circuit. The first combinational circuit is configured to perform processing on the basis of a piece of input data and a piece of output data. The second combinational circuit is configured to perform processing on the basis of a piece of first data. The first multiplexer is configured to select one of a piece of data outputted from the first combinational circuit and a piece of data outputted from the second combinational circuit on the basis of a first selection signal. The first latch circuit is configured to latch a piece of data outputted from the first multiplexer on the basis of a first control signal. The first control latch circuit is configured to latch the first selection signal on the basis of the first control signal. The first demultiplexer outputs a piece of data outputted from the first latch as a piece of second data or a piece of third data on the basis of a second selection signal that is a signal outputted from the first control latch. The third combinational circuit is configured to perform processing on the basis of the piece of second data. The fourth combinational circuit is configured to perform processing on the basis of the piece of third data. The second multiplexer is configured to select one of a piece of data outputted from the third combinational circuit and a piece of data outputted from the fourth combinational circuit on the basis of the second selection signal. The second latch circuit is configured to latch a piece of data outputted from the second multiplexer on the basis of a second control signal. The second control latch is configured to latch the second selection signal on the basis of the second control signal. The second demultiplexer is configured to output a piece of data outputted from the second latch as the piece of first data or the piece of output data on the basis of a third selection signal that is a signal outputted from the second control latch. The handshake circuit is configured to perform handshake processing with one or both of a preceding-stage circuit and a subsequent-stage circuit, and is configured to generate the first selection signal, the first control signal, and the second control signal.

A logic circuit according to an embodiment of the present disclosure includes a first synchronous circuit, an asynchronous circuit, and a second synchronous circuit. The asynchronous circuit is provided subsequent to the first synchronous circuit. The second synchronous circuit is provided subsequent to the asynchronous circuit. The asynchronous circuit includes a data input terminal, a data output terminal, a first terminal, a second terminal, a third terminal, and a fourth terminal. The data input terminal serves as an input terminal of a piece of data from the first synchronous circuit. The data output serves as an output terminal of a piece of data to the second synchronous circuit. The first terminal serves as an input terminal of a request signal from a preceding stage. The second terminal serves as an output terminal of a response signal to the preceding stage. The third terminal serves as an output terminal of a request signal to a subsequent stage. The fourth terminal serves as an input terminal of a response signal from the subsequent stage. A clock signal in the first synchronous circuit is supplied to the first terminal. The second terminal is turned to an open state. The third terminal and the fourth terminal are coupled to each other.

In the processing method according to the embodiment of the present disclosure, the first processing and the second processing are performed by the computer. In the first processing, first, one or a plurality of flop-flop circuits each forming a self-feedback loop is identified from among the plurality of flip-flop circuits in the synchronous circuit, and the feedback path in the self-feedback loop is deleted. Thereafter, two or more flip-flop circuits forming strongly coupled components are identified from among the one or plurality of flip-flop circuits, and the two or more flip-flop circuits forming the strongly coupled components are replaced with one dummy flip-flop circuit. In the second processing, processing for searching for one or more flip-flop circuits coupled to input side of one or more flip-flop circuits out of the plurality of flip-flop circuits including the dummy flip-flop circuit through the combinational circuit, and processing for searching for one or more flip-flop circuits coupled to output side of the searched one or more flip-flop circuits through the combinational circuit are alternately performed a plurality of times to thereby identify first one or more flip-flop circuits coupled to input side of the combinational circuit and second one or more flip-flop circuits coupled to output side of the combinational circuit.

BRIEF DESCRIPTION OF DRAWINGS

FIG. 1 is a block diagram illustrating a configuration example of a synchronous logic circuit.

FIG. 2 is a block diagram illustrating a configuration example of an asynchronous logic circuit.

FIG. 3 is a circuit diagram illustrating a configuration example of a control circuit illustrated in FIG. 2.

FIG. 4 is a timing waveform diagram illustrating an operation example of the control circuit illustrated in FIG. 3.

FIG. 5 is a circuit diagram illustrating a specific example of a C-element illustrated in FIG. 3.

FIG. 6 is a circuit diagram illustrating another specific example of the C-element illustrated in FIG. 3.

FIG. 7 is an explanatory diagram illustrating an example of circuit coupling.

FIG. 8 is an explanatory diagram illustrating another example of circuit coupling.

FIG. 9 is a circuit diagram illustrating a specific example of a fork circuit related to fork coupling illustrated in FIG. 7.

FIG. 10 is a circuit diagram illustrating a specific example of a join circuit related to join coupling illustrated in FIG. 7.

FIG. 11 is a circuit diagram illustrating a specific example of a split circuit related to split coupling illustrated in FIG. 8.

FIG. 12 is a circuit diagram illustrating a specific example of merge coupling related to merge coupling illustrated in FIG. 8.

FIG. 13 is a circuit diagram illustrating a specific example of an initial token insertion circuit.

FIG. 14 is a block diagram illustrating an example of a circuit related to a self-feedback loop.

FIG. 15 is a flowchart illustrating an example of a processing method according to an embodiment of the present disclosure.

FIG. 16 is an explanatory diagram illustrating an example of processing illustrated in FIG. 15.

FIG. 17 is another explanatory diagram illustrating an example of the processing illustrated in FIG. 15.

FIG. 18 is another explanatory diagram illustrating an example of the processing illustrated in FIG. 15.

FIG. 19 is another explanatory diagram illustrating an example of the processing illustrated in FIG. 15.

FIG. 20 is another explanatory diagram illustrating an example of the processing illustrated in FIG. 15.

FIG. 21A is a flowchart illustrating an example of grouping processing illustrated in FIG. 15.

FIG. 21B is another flowchart illustrating the example of the grouping processing illustrated in FIG. 15.

FIG. 22 is an explanatory diagram illustrating an example of processing illustrated in FIGS. 21A and 21B.

FIG. 23 is another explanatory diagram illustrating the example of the processing illustrated in FIGS. 21A and 21B.

FIG. 24 is another explanatory diagram illustrating the example of the processing illustrated in FIGS. 21A and 21B.

FIG. 25 is another explanatory diagram illustrating the example of the processing illustrated in FIGS. 21A and 21B.

FIG. 26 is another explanatory diagram illustrating the example of the processing illustrated in FIGS. 21A and 21B.

FIG. 27 is another explanatory diagram illustrating the example of the processing illustrated in FIGS. 21A and 21B.

FIG. 28 is another explanatory diagram illustrating the example of the processing illustrated in FIGS. 21A and 21B.

FIG. 29 is another explanatory diagram illustrating the example of the processing illustrated in FIGS. 21A and 21B.

FIG. 30 is another explanatory diagram illustrating an example of the processing illustrated in FIG. 15.

FIG. 31 is another explanatory diagram illustrating an example of the processing illustrated in FIG. 15.

FIG. 32 is another explanatory diagram illustrating an example of the processing illustrated in FIG. 15.

FIG. 33 is another explanatory diagram illustrating an example of the processing illustrated in FIG. 15.

FIG. 34 is another explanatory diagram illustrating an example of the processing illustrated in FIG. 15.

FIG. 35 is a circuit diagram illustrating an example of a circuit generated by the processing method illustrated in FIG. 15.

FIG. 36 is a circuit diagram illustrating a part of the circuit illustrated in FIG. 35.

FIG. 37 is a timing waveform diagram illustrating an operation example of the circuit illustrated in FIG. 35.

FIG. 38 is a circuit diagram illustrating another example of the circuit generated by the processing method illustrated in FIG. 15.

FIG. 39 is a circuit diagram illustrating a part of the circuit illustrated in FIG. 38.

FIG. 40 is a timing waveform diagram illustrating an operation example of the circuit illustrated in FIG. 38.

FIG. 41 is a circuit diagram illustrating another example of the circuit generated by the processing method illustrated in FIG. 15.

FIG. 42 is an explanatory diagram illustrating an operation example of the circuit illustrated in FIG. 41.

FIG. 43 is a circuit diagram illustrating an example of the circuit generated by the processing method illustrated in FIG. 15.

FIG. 44 is a timing waveform diagram illustrating an operation example of the circuit illustrated in FIG. 43.

FIG. 45 is a circuit diagram illustrating another example of the circuit generated by the processing method illustrated in FIG. 15.

FIG. 46 is a timing waveform diagram illustrating an operation example of the circuit illustrated in FIG. 45.

FIG. 47 is a circuit diagram illustrating another example of the circuit generated by the processing method illustrated in FIG. 15.

FIG. 48 is a circuit diagram illustrating a configuration example of a control circuit illustrated in FIG. 47.

FIG. 49 is a circuit diagram illustrating another example of the circuit generated by the processing method illustrated in FIG. 15.

FIG. 50 is a circuit diagram illustrating an example of an interface between a synchronous logic circuit and an asynchronous logic circuit.

FIG. 51 is a circuit diagram illustrating another example of the interface between the synchronous logic circuit and the asynchronous logic circuit.

FIG. 52 is a circuit diagram illustrating another example of the interface between the synchronous logic circuit and the asynchronous logic circuit.

MODES FOR CARRYING OUT THE INVENTION

Some embodiments of the present disclosure are described below in detail with reference to the drawings.

Embodiment

Configuration Example

FIG. 1 illustrates a configuration example of a synchronous logic circuit 9 to which a processing method according to an embodiment is applied. The synchronous logic circuit 9 illustrated in FIG. 1 is an example of a most basic configuration. In actuality, the synchronous logic circuit 9 may be more complicated than this circuit configuration. The synchronous logic circuit 9 includes a data-path circuit 90 and a clock tree 99.

The data-path circuit 90 is configured to perform processing on a piece of data DT. The piece of data DT is supplied from the left to the right in FIG. 1. The data-path circuit 90 includes a plurality of flip-flop circuits (F/F) 91 and a plurality of combinational circuits 92. In this example, the flip-flop circuits 91 and the combinational circuits 92 are alternately disposed. The flip-flop circuit 91 includes, for example, a plurality of flip-flop circuits, and is configured to sample the piece of data DT supplied from the combinational circuit 92 in a preceding stage, on the basis of a clock signal CK. The combinational circuit 92 is configured to perform a logical operation on the piece of data DT supplied from the flip-flop circuit 91 in a preceding stage and supply a piece of data DT thus-obtained to the flip-flop circuit 91 in a subsequent stage.

The clock tree 99 is configured to supply the clock signal CK to the plurality of flip-flop circuits 91 in the data-path circuit 90.

In the present embodiment, processing is performed on such a synchronous logic circuit 9 to thereby convert this synchronous logic circuit 9 into, for example, an asynchronous logic circuit 1 to be described below.

FIG. 2 illustrates a configuration example of the asynchronous logic circuit 1. This asynchronous logic circuit 1 is what is called a bundled-data asynchronous logic circuit. This asynchronous logic circuit 1 illustrated in FIG. 1 is an example of a most basic configuration. In actuality, the asynchronous logic circuit 1 may be more complicated than this circuit configuration. The asynchronous logic circuit 1 includes a data-path circuit 10 and a handshake circuit 20.

The data-path circuit 10 is configured to perform processing on a piece of data DT. The piece of data DT is supplied from the left to the right in FIG. 2. The data-path circuit 10 includes a plurality of latch circuits (LAT) 11 and a plurality of combinational circuits 12. In this example, the latch circuits 11 and the combinational circuits 12 are alternately disposed. The latch circuit 11 includes, for example, a plurality of latch circuits, and is configured to latch the piece of data DT supplied from the combinational circuit 12 in a preceding stage, on the basis of a signal LCK that is a local clock. The combinational circuit 12 is configured to perform a logical operation on the piece of data DT supplied from the latch circuit 11 in a preceding stage and supply a piece of data DT thus-obtained to the latch circuit 11 in a subsequent stage.

The handshake circuit 20 is configured to generate a plurality of signals LCK on the basis of a signal REQ and a signal ACK and supply the plurality of signals LCK generated to the plurality of respective latch circuits 11 in the data-path circuit 10. The signal REQ is supplied from the left to the right in FIG. 2, and the signal ACK is supplied from the right to the left in FIG. 2. The handshake circuit 20 includes a plurality of control circuits 21 and a plurality of delay circuits 22.

The control circuit 21 is configured to generate the signal LCK that is a local clock, and the signals REQ and ACK on the basis of the supplied signal REQ and the supplied signal ACK. Specifically, the control circuit 21 is supplied with the signal REQ from the control circuit 21 in a preceding stage through the delay circuit 22, and is supplied with the signal ACK from the control circuit 21 in a subsequent stage, and generates the signals LCK, REQ, and ACK on the basis of these signals REQ and ACK. Thereafter, the control circuit 21 supplies the generated signal LCK to the latch circuit 11, supplies the generated signal REQ to the control circuit 21 in the subsequent stage through the delay circuit 22, and supplies the generated signal ACK to the control circuit 21 in the preceding stage.

FIG. 3 illustrates a configuration example of the control circuit 21. In FIG. 3, the signal REQ to be inputted to the control circuit 21 is represented by a signal REQ_IN, and the signal REQ to be outputted from the control circuit 21 is represented by a signal REQ_OUT. In addition, the signal ACK to be inputted to the control circuit 21 is represented by a signal ACK_IN, and the signal ACK to be outputted from the control circuit 21 is represented by a signal ACK_OUT.

The control circuit 21 includes a C-element 29. The C-element 29 is what is called a waiting circuit, and has two input terminals, a reset terminal, and an output terminal. The signal REQ_IN and an inverted signal of the signal ACK_IN are inputted to the two input terminals. A reset signal RST is inputted to the reset terminal. The C-element 29 changes the signal LCK at the output terminal to a high level in a case where both the signal REQ_IN and the inverted signal of the signal ACK_IN are at the high level, changes the signal LCK at the output terminal to a low level in a case where both the signal REQ_IN and the inverted signal of the signal ACK_IN are at the low level, and maintains the signal LCK at the output terminal in other cases. In addition, the C-element 29 changes the signal LCK at the output terminal to the low level on the basis of the reset signal RST.

FIG. 4 illustrates an operation example of the control circuit 21, where (A) indicates a waveform of the signal REQ_IN, (B) indicates a waveform of the signal ACK_IN, (C) indicates a waveform of the signal LCK, (D) indicates a waveform of the signal REQ_OUT, and (E) indicates a waveform of the signal ACK_OUT.

At a timing t1, the signal REQ_IN changes from the low level to the high level ((A) of FIG. 4). At this time, the signal ACK_IN is at the low level ((B) of FIG. 4); therefore, the inverted signal of the signal ACK_IN is at the high level. Accordingly, both the signal REQ_IN and the inverted signal of the signal ACK_IN are changed to the high level, which causes the C-element 29 to change the signal LCK from the low level to the high level ((C) of FIG. 4) and similarly change the signals REQ_OUT and ACK_OUT from the low level to the high level ((D) and (E) of FIG. 4).

Next, at a timing t2, the signal ACK_IN changes from the low level to the high level ((B) of FIG. 4). In other words, the inverted signal of the signal ACK_IN changes from the high level to the low level. At this time, the signal REQ_IN is at the high level ((A) of FIG. 4). Accordingly, the signals LCK. REQ_OUT, and ACK_OUT are unchanged and maintained at the high level ((C) to (E) of FIG. 4).

Next, at a timing 13, the signal REQ_IN changes from the high level to the low level ((A) of FIG. 4). At this time, the signal ACK_IN is at the high level ((B) of FIG. 4); therefore, the inverted signal of the signal ACK_IN is at the low level. Accordingly, both the signal REQ_IN and the inverted signal of the signal ACK_IN are changed to the low level, which causes the C-element 29 to change the signal LCK from the high level to the low level ((C) of FIG. 4) and similarly change the signals REQ_OUT and ACK_OUT from the high level to the low level ((D) and (E) of FIG. 4).

Next, at a timing 14, the signal ACK_IN changes from the high level to the low level ((B) of FIG. 4). In other words, the inverted signal of the signal ACK_IN changes from the low level to the high level. At this time, the signal REQ_IN is at the low level (A) of FIG. 4). Accordingly, the signals LCK, REQ_OUT, and ACK_OUT are unchanged and maintained at the low level ((C) to (E) of FIG. 4).

As described above, the control circuit 21 performs an operation on the basis of the signals REQ_IN and ACK_IN that are four-phase signals to thereby generate the signals LCK, REQ_OUT, and ACK_OUT.

Next, a specific circuit example of the C-element 29 is described with reference to some examples.

FIG. 5 illustrates a configuration example of the C-element 29. The C-element 29 includes two input terminals IN1 and IN2, a reset terminal INR, an output terminal OUT, a logical AND (AND) circuit 101, a logical OR (OR) circuit 102, a negative AND (NAND) circuit 103, and a latch circuit 104. The AND circuit 101 is configured to determine AND of a signal at the input terminal IN1 and a signal at the input terminal IN2. The OR circuit 102 is configured to determine OR of the signal at the input terminal IN1 and the signal at the input terminal IN2. The NAND circuit 103 is configured to determine NAND of an output signal of the OR circuit 102 and a signal at the reset terminal INR. The latch circuit 104 is a D-latch, and has a terminal D coupled to a power supply node of a power supply voltage VDD, a terminal G to be supplied with an output signal of the AND circuit 101, and a terminal R to be supplied with an output signal of the NAND circuit 103. The latch circuit 104 has a terminal Q coupled to the output terminal OUT.

FIG. 6 illustrates another configuration example of the C-element 29. In this example, the C-element 29 is configured with use of what is called a majority gate. The C-element 29 includes two input terminals IN1 and IN2, the reset terminal INR, the output terminal OUT, AND circuits 111 to 113, a negative OR (NOR) circuit 114, and an AND circuit 115. The AND circuit 111 is configured to determine AND of a signal at the input terminal IN1 and an output signal of the AND circuit 115. The AND circuit 112 is configured to determine AND of the signal at the input terminal IN1 and a signal at the input terminal IN2. The AND circuit 113 is configured to determine AND of the signal at the input terminal IN2 and the output signal of the AND circuit 115. The NOR circuit 114 is configured to determine NOR of output signals of the AND circuits 111 to 113. The AND circuit 115 is configured to determine AND of an inverted signal of an output signal of the NOR circuit 114 and a signal at the reset terminal INR. The AND circuit 115 has an output terminal coupled to the output terminal OUT.

As described above, it is possible to configure the C-element 29 with use of the latch circuit 104, for example, as illustrated in FIG. 5, or it is possible to configure the C-element 29 with use of the majority gate, for example, as illustrated in FIG. 6.

The delay circuit 22 (FIG. 2) is provided in a supply path of the signal REQ, and is configured to delay the signal REQ. A delay amount of the delay circuit 22 is set to a maximum value of a delay amount in a corresponding combinational circuit 12.

With this configuration, in the asynchronous logic circuit 1, the combinational circuit 12 supplies the piece of data DT to the latch circuit 11. The delay circuit 22 delays the signal REQ, and supplies the delayed signal REQ to the control circuit 21. This control circuit 21 generates the signal LCK on the basis of the delayed signal REQ, and the latch circuit 11 latches the piece of data DT supplied from the combinational circuit 12 on the basis of this signal LCK. Thereafter, the control circuit 21 supplies the signal ACK to the control circuit 21 in the preceding stage. In a case where the delay amount in the combinational circuit 12 is small, the delay amount in the delay circuit 22 is also set to a small value, and in a case where the delay amount in the combinational circuit 12 is large, the delay amount in the delay circuit 22 is set to a large value.

In the example in FIG. 2, the control circuit 21 is coupled one-to-one to the control circuit 21 in the preceding stage through the delay circuit 22, and is coupled one-to-one to the control circuit 21 in the subsequent stage through the delay circuit 22. Likewise, the latch circuit 11 is coupled one-to-one to the latch circuit 11 in the preceding stage with the combinational circuit 12 interposed therebetween, and is coupled one-to-one to the latch circuit 11 in the subsequent stage with the combinational circuit 12 interposed therebetween. However, this is not limitative, and the control circuit 21 may be coupled to one-to-multiple to a plurality of control circuits 21. In addition, the latch circuit 11 may be coupled to one-to-multiple to a plurality of latch circuits 11. Hereinafter, description is given of one-to-two coupling as an example.

FIG. 7 schematically illustrates an example of one-to-two coupling. A symbol FF indicates fork (fork) coupling in which a signal from one circuit is split into two, and a symbol JJ indicates join (join) coupling in which two signals from two circuits are joined into one. In the fork coupling, the signal from one circuit is supplied to both of two circuits, and in the join coupling, both of two signals from two circuits are supplied to one circuit.

FIG. 8 schematically illustrates another example of one-to-two coupling. A symbol SS indicates split (split) coupling in which a signal from one circuit is split into two, and a symbol MM indicates merge (merge) coupling in which two signals from two circuits are joined into one. In the split coupling, a signal from one circuit is supplied to one of two circuits, and in the merge coupling, one of two signals from two circuits is supplied to one circuit.

FIG. 9 illustrates a fork circuit used when fork coupling is performed in the handshake circuit 20, where (A) illustrates representation of the fork circuit, and (B) illustrates a configuration example of the fork circuit.

As illustrated in (A) of FIG. 9, the fork circuit receives the signal REQ_IN from a circuit in a preceding stage, and supplies the signal ACK_OUT to the circuit. The fork circuit supplies a signal REQ_OUT0 to a first circuit in a subsequent stage, and receives a signal ACK_IN0 from the first circuit. In addition, the fork circuit supplies a signal REQ_OUT1 to a second circuit in the subsequent stage, and receives a signal ACK_IN1 from the second circuit.

As illustrated in (B) of FIG. 9, this fork circuit includes a C-element 23. This fork circuit outputs the signal REQ_IN as it is as the signal REQ_OUT0 and the signal REQ_OUT1. The C-element 23 generates the signal ACK_OUT on the basis of two signals ACK_IN0 and ACK_IN1.

FIG. 10 illustrates a join circuit used when fork coupling is performed in the handshake circuit 20, where (A) illustrates representation of the join circuit, and (B) illustrates a configuration example of the join circuit.

As illustrated in (A) of FIG. 10, the join circuit receives a signal REQ_IN0 from a first circuit in a preceding stage, and supplies a signal ACK_OUT0 to the first circuit. The join circuit receives a signal REQ_IN1 from a second circuit in the preceding stage, and supplies a signal ACK_OUT1 to the second circuit. In addition, the join circuit supplies the signal REQ_OUT to a circuit in a subsequent stage, and receives the signal ACK_IN from the circuit.

As illustrated in (B) of FIG. 10, this join circuit includes a C-element 24. The C-element 24 generates the signal REQ_OUT on the basis of two signals REQ_IN0 and REQ_IN1. In addition, this join circuit outputs the signal ACK_IN as it is as the signal ACK_OUT0 and the signal ACK_OUT1.

FIG. 11 illustrates a split circuit used when split coupling is performed in the handshake circuit 20, where (A) illustrates representation of the split circuit, and (B) illustrates a configuration example of the split circuit.

As illustrated in (A) of FIG. 11, the split circuit receives the signal REQ_IN from a circuit in a preceding stage, and supplies the signal ACK_OUT to the circuit. The split circuit supplies the signal REQ_OUT0 to a first circuit in a subsequent stage, and receives the signal ACK_IN0 from the first circuit. The split circuit supplies the signal REQ_OUT1 to a second circuit in the subsequent stage, and receives the signal ACK_IN1 from the second circuit. In addition, the split circuit receives a signal SEL_IN. This signal SEL_IN is a signal indicating whether the signal REQ_IN is to be supplied to the first circuit or the second circuit in the subsequent stage.

As illustrated in (B) of FIG. 11, this split circuit includes a demultiplexer 25 and an OR circuit 26. This split circuit outputs the signal REQ_IN as a signal corresponding to the signal SEL_IN of two signals REQ_OUT0 and REQ_OUT1. In addition, the OR circuit 26 determines OR of two signals ACK_IN0 and ACK_IN1 to thereby generate the signal ACK_OUT.

FIG. 12 illustrates a merge circuit used when merge coupling is performed in the handshake circuit 20, where (A) illustrates representation of the merge circuit, and (B) illustrates a configuration example of the merge circuit.

As illustrated in (A) of FIG. 12, the merge circuit receives the signal REQ_IN0 from a first circuit in a preceding stage, and supplies the signal ACK_OUT0 to the first circuit. In addition, the merge circuit receives the signal REQ_IN1 from a second circuit in the preceding stage, and supplies the signal ACK_OUT1 to the second circuit. The merge circuit supplies the signal REQ_OUT to a circuit in a subsequent stage, and receives the signal ACK_IN from the circuit. In addition, the merge circuit outputs the signal SEL_OUT. The signal SEL_OUT is a signal indicating which one of the signals REQ_IN0 and REQ_IN1 becomes active.

As illustrated in (B) of FIG. 12, this merge circuit includes an OR circuit 31 and C-elements 32 to 334. The OR circuit 31 determines OR of two signals REQ_IN0 and REQ_IN1 to thereby generate the signal REQ_OUT. The C-element 32 generates the signal ACK_OUT0 on the basis of the signal REQ_IN0 and the signal ACK_OUT. The C-element 33 generates the signal ACK_OUT1 on the basis of the signal REQ_IN1 and the signal ACK_OUT. That is, in a case where the signal REQ_IN0 is active, the C-element 32 outputs the signal ACK_IN as the signal ACK_OUT0, and in a case where the signal REQ_IN1 is active, the C-element 33 outputs the signal ACK_IN as the signal CLK_OUT1. The C-element 34 generates the signal SEL_OUT on the basis of the signal REQ_IN0 and an inverted signal of the signal REQ_IN1. That is, the C-element 34 changes the signal SEL_OUT to the high level in a case where the signal REQ_IN0 is active, and changes the signal SEL_OUT to the low level in a case where the signal REQ_IN1 is active.

In addition, in the handshake circuit 20 of the asynchronous logic circuit 1, for the sake of setting set an initial state of a circuit, the following initial token insertion circuit is provided.

FIG. 13 illustrates the initial token insertion circuit used in the handshake circuit 20, where (A) illustrates representation of the initial token insertion circuit, and (B) illustrates a configuration example of the initial token insertion circuit.

The initial token insertion circuit is configured to set the signal REQ active in the initial state. This initial token insertion circuit includes a C-element 35 and an OR circuit 36. The C-element 35 operates on the basis of the signal ACK and a signal indicating the high level ("1"). The OR circuit 36 determines OR of the inputted signal REQ (the signal REQ_IN) and an inverted signal of an output signal of the C-element 35 to thereby generate the signal REQ (the signal REQ_OUT).

In general, in the initial state, both the signal REQ and the signal ACK are at the low level. Accordingly, in this initial token insertion circuit, two signals to be inputted to the C-element 35 are at the low level and the high level; therefore, the C-element 35 outputs a signal at the low level. Accordingly, the inverted signal of the output signal of the C-element 35 is at the high level; therefore, the OR circuit 36 changes the signal REQ (the signal REQ_OUT) to the high level. A circuit subsequent to this initial token insertion circuit changes the signal ACK to the high level on the basis of this signal REQ. Accordingly, both of the two signals to be inputted to the C-element 35 of this initial token insertion circuit are at the high level; therefore, the C-element 35 outputs a signal at the high level. As a result, the OR circuit 36 changes the signal REQ (the signal REQ_OUT) to the low level. This allows the initial token insertion circuit to set the signal REQ active in the initial state.

In the present technology, a computer executes a program to thereby convert the synchronous logic circuit 9 illustrated in FIG. 1 into the asynchronous logic circuit 1 illustrated in FIG. 2 on the basis of a piece of design data of the synchronous logic circuit 9. In this conversion processing, the computer identifies a flip-flop circuit having a self-feedback loop that is included in the synchronous logic circuit 9.

FIG. 14 illustrates an example of a loop circuit LP related to the self-feedback loop in the synchronous logic circuit 9. In FIG. 14, a piece of data having one or a plurality of pieces of bit data is indicated by a thick line. The loop circuit LP related to the self-feedback loop includes a combinational circuit 92A and a flip-flop circuit 91A. The combinational circuit 92A corresponds to the combinational circuit 92 illustrated in FIG. 1, and the flip-flop circuit 91A corresponds to the flip-flop circuit 91 illustrated in FIG. 1.

The combinational circuit 92A performs a logical operation on the basis of a piece of data Din supplied from a preceding stage and a piece of data Dout outputted from the flip-flop circuit 91A, and supplies a piece of data thus-obtained to the flip-flop circuit 91A in a subsequent stage. The flip-flop circuit 91A samples a piece of data DT supplied from the combinational circuit 92A in a preceding stage to thereby generate a piece of data DT. Thereafter, the flip-flop circuit 91A supplies the piece of data DT generated to the combinational circuit 92A preceding to this flip-flop circuit 91A, and also supplies the piece of data DT generated to a stage subsequent to this flip-flop circuit 91A. Thus, the flip-flop circuit 91A forms a self-feedback loop that supplies its own piece of output data to the combinational circuit 92A preceding to the flip-flop circuit 91A.

The computer identifies a flip-flop circuit having such a self-feedback loop. Thereafter, for each of the plurality of combinational circuits 92 included in the synchronous logic circuit 9, the computer identifies the flip-flop circuit 91 preceding to that combinational circuit 92 and the flip-flop circuit 91 subsequent to that combinational circuit 92. The computer converts the loop circuit LP including one flip-flop circuit 91A into, for example, a loop circuit including two stages of latch circuits. Thereafter, the computer converts the synchronous logic circuit 9 into the asynchronous logic circuit 1 with use of these processing results.

For example, various methods have been proposed as a method of converting the loop circuit LP related to the self-feedback loop in the synchronous logic circuit 9 into an asynchronous circuit. For example, a method is known of converting the loop circuit LP from a circuit including one flip-flop circuit 91A into, for example, a circuit including three or more stages of latch circuits. In this case, idle phases are increased, which slightly decreases circuit efficiency. In addition, for example, a method is known of converting the loop circuit LP into a circuit including two stages of latch circuits by using a control circuit described in PTL 1 in a handshake circuit. In this case, there is a possibility that a plurality of gate loops is generated, and competition among the plurality of gate loops occurs.

In particular, in recent years, a semiconductor process size has been further reduced, and a power supply voltage has been further lowered. In such a situation, there is a possibility that, for example, an Ion/Off ratio of a transistor is lowered and the control circuit described in PTL 1 does not stably operate. In such a case, for example, to enhance stability of a feedback operation, measures such as inserting a delay circuit is necessary, and a circuit area and power consumption may be increased. In addition, delay variations are becoming complicated due to reduction in semiconductor process size and a decrease in power supply voltage, and there is a possibility that a system of delay variations deteriorates.

Accordingly, in the present technology, for example, the loop circuit LP related to the self-feedback loop is converted into, for example, a circuit including two stages of latch circuits while adding a circuit that stably operates. This makes it possible to implement an asynchronous logic circuit that stably operates while reducing the idle phases. [Operation and Workings]

Next, description is given of the processing method according to the present embodiment. In this processing method, a computer executes a program to thereby convert the synchronous logic circuit 9 into the asynchronous logic circuit 1 as illustrated in FIG. 2 on the basis of the piece of design data of the synchronous logic circuit 9. The piece of design data may include a piece of data described in RTL (Resister Transfer Level), or may include a gate-level netlist. In a case where the piece of design data includes the piece of data described in RTL, this piece of data is converted into a gate-level netlist in advance. In this case, for example, it is desirable to store, for example, a correspondence between description in RTL and the gate-level netlist. In addition, the piece of design data includes coupling information about coupling of flip-flop circuits (fork coupling, join coupling, split coupling, and merge coupling).

FIG. 15 illustrates an example of the processing method by the computer. The computer performs the following processing on the basis of the piece of design data of the synchronous logic circuit 9.

First, the computer identifies a flip-flop circuit forming a self-feedback loop (step S101).

FIG. 16 illustrates an example of a circuit indicated by the piece of design data of the synchronous logic circuit 9. In this example, the circuit indicated by the piece of design data includes combinational circuits C1 to C4 and flip-flop circuits F1 to F8. Here, the flip-flop circuits F1 to F8 are, for example, flip-flop circuits that store a piece of 1-bit bit data.

The computer first recognizes coupling of flip-flop circuits on the basis of the coupling information about the coupling of flip-flop circuits that is included in the piece of design data. The computer recognizes the coupling of the flip-flop circuits by creating a graph in which the flip-flop circuit is a vertex and a path between the flip-flop circuits is a side. In this graph, a path of a clock signal and a path of a reset signal are eliminated.

FIG. 17 illustrates coupling of the flip-flop circuits F1 to F8. In this example, for example, an input terminal of the flip-flop circuit F1 is coupled to output terminals of the flip-flop circuits F1, F2, F7 and F8 through the combinational circuit C1. An input terminal of the flip-flop circuit F2 is coupled to the output terminals of the flip-flop circuits F1, F2, F7 and F8 through the combinational circuit C1. An input terminal of the flip-flop circuit F3 is coupled to the output terminal of the flip-flop circuit F1 through the combinational circuit C2. An input terminal of the flip-flop circuit F4 is coupled to the output terminal of the flip-flop circuit F1 through the combinational circuit C2. An input terminal of the flip-flop circuit F5 is coupled to the output terminal of the flip-flop circuit F2 through the combinational circuit C3. An input terminal of the flip-flop circuit F6 is coupled to the output terminal of the flip-flop circuit F2 through the combinational circuit C3. An input terminal of the flip-flop circuit F7 is coupled to output terminals of the flip-flop circuit F3, F5, and F6 through the combinational circuit C4. An input terminal of the flip-flop circuit F8 is coupled to output terminals of the flip-flop circuits F4 and F6 through the combinational circuit C4.

The computer recognizes coupling of the flip-flop circuits on the basis of the coupling information about the coupling of the flip-flop circuits in such a manner. Thereafter, the computer identifies a flip-flop circuit forming a self-feed-back loop from among the plurality of flip-flop circuits. For example, the computer is allowed to identify the flip-flop circuit forming the self-feedback loop by performing a depth-first search or a width-first search for a path from the input terminal of the flip-flop circuit as a starting point to the output terminal of the flip-flop circuit.

As illustrated in FIG. 17, the input terminal of the flip-flop circuit F1 is coupled to the output terminal of the flip-flop circuit F1 through the combinational circuit C1; therefore, the flip-flop circuit F1 forms a self-feedback loop. The same applies to the flip-flop circuits F2 and F8. The computer identifies three flip-flop circuits F1, F2, and F8 that each form a self-feedback loop in such a manner.

Next, the computer provides a self-feedback loop attribute to the flip-flop circuit forming the self-feedback loop and deletes a feedback path (step S102).

FIG. 18 illustrates an example of processing in step S102. The flip-flop circuits F1, F2, and F8 each form a self-feedback loop; therefore, the computer provides the self-feedback loop attribute to the flip-flop circuits F1, F2, and F8. In FIG. 18, the flip-flop circuits F1. F2, and F8 to which the self-feedback loop attribute is provided are shaded with dots. Thereafter, as illustrated in FIG. 18, the computer deletes a feedback path from the output terminal of the flip-flop circuit F1 to the input terminal of the flip-flop circuit F1, a feedback path from the output terminal of the flip-flop circuit F2 to the input terminal of the flip-flop circuit F2, and a feedback path from the output terminal of the flip-flop circuit F8 to the input terminal of the flip-flop circuit F8.

Next, the computer identifies strongly coupled components from among the flip-flop circuits each forming a self-feedback loop, and replaces a plurality of flip-flop circuits related to the strongly coupled components with one dummy flip-flop circuit (step S103).

FIGS. 19 and 20 illustrate an example of processing in step S103. In this example, circuits include the flip-flop circuits F1, F2, and F8 to which the self-feedback loop attribute is provided. As illustrated in FIG. 19, the output terminal of the flip-flop circuit F1 is coupled to the input terminal of the flip-flop circuit F2, and the output terminal of the flip-flop circuit F2 is coupled to the input terminal of the flip-flop circuit F1. Accordingly, the flip-flop circuits F1 and F2 are strongly coupled components. The output terminal of the flip-flop circuit F8 is coupled to the input terminals of the flip-flop circuits F1 and F2, but the output terminals of the flip-flop circuits F1 and F2 are not coupled to the input terminal of the flip-flop circuit F8. Accordingly, the flip-flop circuit F8 is not a strongly coupled component. Accordingly, the computer finally determines that the flip-flop circuits F1 and F2 are strongly coupled components. Thereafter, as illustrated in FIG. 20, the flip-flop circuits F1 and F2 are replaced with one dummy flip-flop circuit FD. In this example, the dummy flip-flop circuit FD is shaded with diagonal lines.

Next, the computer performs grouping processing for grouping the plurality of flip-flop circuits in the synchronous logic circuit 9 into a plurality of groups (step S104). In this example, the computer groups the flip-flop circuits F3 to F8 and the dummy flip-flop circuit FD illustrated in FIG. 20 into a plurality of groups.

FIGS. 21A and 21B illustrates an example of the grouping processing. In this grouping processing, the computer identifies one or more flip-flop circuits in a preceding stage and identifies one or more flip-flop circuits in a subsequent stage for each of the plurality of combinational circuits to thereby group the plurality of flip-flop circuits into a plurality of groups. This processing is described in detail below.

First, the computer sets a set Λtotal as a set of all the flip-flop circuits, and sets a set Γ as an empty set (step S121).

Next, the computer sets a set Λ as the set Λtotal (step S122).

Next, the computer selects one flip-flop circuit as λ from the set Λ (step S123).

Next, the computer sets a parameter j to 0 (zero) (step S124).

Next, the computer identifies one or more flip-flop circuits coupled to an input side of the flip-flop circuit λ, and sets the identified one or more flip-flop circuits as a set $L_\lambda^i$ (step S125).

Next, the computer identifies one or more flip-flop circuits coupled to an output side of each of the one or more flip-flop circuits belonging to the set $I_\lambda^j$, and sets a union of the identified one or more flip-flop circuits as a set $O_\lambda^j$ (step S126).

Next, the computer identifies one or more flip-flop circuits coupled to an input side of each of the one or more flip-flop circuits belonging to the set $O_\lambda^j$, and sets a union of the identified one or more flip-flop circuits as a set $I_\lambda^{j+1}$ (step S127).

Next, the computer identifies one or more flip-flop circuits coupled to an output side of each of the one or more flip-flop circuits belonging to the set $I_\lambda^{j+1}$, and sets a union of the identified one or more flip-flop circuits as a set $O_\lambda^{j+1}$ (step S128).

Next, the computer confirms whether or not the set $I_\lambda^j$ and the set $I_\lambda^{j+1}$ are equal to each other ($I_\lambda^j = I_\lambda^{j+1}$) and the set $I_\lambda^j$ and the set $I_\lambda^{j+1}$ are equal to each other ($I_\lambda^j == I_\lambda^{j+1}$) (step S129). In a case where this condition is not satisfied ("N" in step S129), j is incremented (step S130), and the processing returns to step S127. The computer repeats processing in steps S127 to S130 until the condition in step S129 is satisfied.

In a case where the condition is satisfied in this step S129 ("Y" in step S129), the computer updates the sets Γ and Λ by adding a set $\{I_\lambda, O_\lambda\}$ to the set Γ and deleting the set $O_\lambda$ from the set Λ (step S131).

Thereafter, the computer confirms whether or not the set Γ is equal to the set Λtotal (Γ==Λtotal) (step S132). In a case where this condition is not satisfied ("N" in step S131), the processing returns to step S123. The computer repeats processing in steps S127 to S132 until the condition in step S131 is satisfied.

In a case where the condition is satisfied in this step S132 ("Y" in step S132), the computer ends a sub-routine of this grouping processing.

This grouping processing is described in detail below with reference to examples.

FIGS. 22 to 27 illustrate a specific example of processing in steps S123 to S131 in the grouping processing.

In this example, in step S123, the computer selects flip-flop circuit F7 from the set Λ (FIG. 22). Thereafter, in step S124, the computer sets the parameter j to 0 (zero).

Next, in step S125, the computer identifies the flip-flop circuits F3, F5, and F6 coupled to an input side of the flip-flop circuit F7, and sets these flip-flop circuits F3, F5, and F6 as a set $I_{F7}^0$ (FIG. 23).

Next, in step S126, the computer identifies a flip-flop circuit coupled to an output side of each of the flip-flop circuits F3, F5, and F6 belonging to the set $I_{F7}^0$ to thereby identify the flip-flop circuit F7 and F8, and sets these flip-flop circuits F7 and F8 as a set $O_{F7}^0$ (FIG. 24).

Next, the computer identifies a flip-flop circuit coupled to an input side of each of the flip-flop circuits F7 and F8 belonging to the set $O_{F7}^0$ to thereby identify the flip-flop circuits F3 to F6, and sets these flip-flop circuits F3 to F6 as a set $I_{F7}^1$ (FIG. 25).

Next, in step S128, the computer identifies a flip-flop circuit coupled to an output side of each of the flip-flop circuits F3 to F6 belonging to the set $I_{F7}^1$ to thereby identify the flip-flop circuits F7 and F8, and sets these flip-flop circuits F7 and F8 as a set $O_{F7}^1$ (FIG. 26).

The set $I_{F7}^0$ illustrated in FIG. 23 is different from the set $I_{F7}^1$ illustrated in FIG. 25. The set $O_{F7}^0$ illustrated in FIG. 24 is equal to the set $O_{F7}^1$ illustrated in FIG. 26. Accordingly, the condition in step S129 is not satisfied; therefore, in step S130, the computer increments the parameter j to thereby set the parameter j to 1. Thereafter, the processing returns to step S127.

Next, in step S127, the computer identifies a flip-flop circuit coupled to the input side of each of the flip-flop circuits F7 and F8 belonging to the set $O_{F7}^1$ to thereby identify the flip-flop circuits F3 to F6, and sets these flip-flop circuits F3 to F6 as a set $I_{F7}^2$ (FIG. 27).

Next, the computer identifies a flip-flop circuit coupled to the output side of each of the flip-flop circuits F3 to F6 belonging to the set $I_{F7}^1$ to thereby identify the flip-flop circuits F7 and F8, and sets these flip-flop circuits F7 and F8 as a set $O_{F7}^2$ (FIG. 28).

The set $I_{F7}^1$ illustrated in FIG. 25 is equal to the set $I_{F7}^2$ illustrated in FIG. 27. The set $O_{F7}^1$ illustrated in FIG. 26 is equal to the set $O_{F7}^2$ illustrated in FIG. 28. Accordingly, the condition in step S129 is satisfied; therefore, the computer updates the sets Γ and Λ by adding {F3, F4, F5, F6, F7, F8} to the set Γ and deleting {F7, F8} from the set Λ.

For each of the combinational circuits C1 to C4, the computer identifies one or more flip-flop circuits preceding to the combinational circuit and one or more flip-flop circuits subsequent to the combinational circuit by repeating such processing, thereby grouping a plurality of flip-flop circuits into a plurality of groups.

FIG. 29 illustrates a processing result of the grouping processing. FIG. 29 illustrates the dummy flip-flop circuit FD converted back into the flip-flop circuits F1 and F2. This grouping processing allows the computer to perform grouping so that the flip-flop circuits F1 and F2 belong to the same group (a group G1), the flip-flop circuits F3 to F6 belong to the same group (a group G2), and the flip-flop circuits F7 and F8 belong to the same group (a group G3). For example, this makes it possible for a handshake circuit of the asynchronous circuit to supply the same signal LCK to the flip-flop circuits F1 and F2 belonging to the group G1, supply the same signal LCK to the flip-flop circuits F3 to F6 belonging to the group G2, and supply the same signal LCK to the flip-flop circuit F7 and F8 belonging to the group G3.

Next, in FIG. 15, the computer converts the flip-flop circuit forming the self-feedback loop into four stages of latch circuits, and converts the flip-flop circuit other than the flip-flop circuit forming the self-feedback loop into two stages of latch circuits (step S105).

Figure 30:
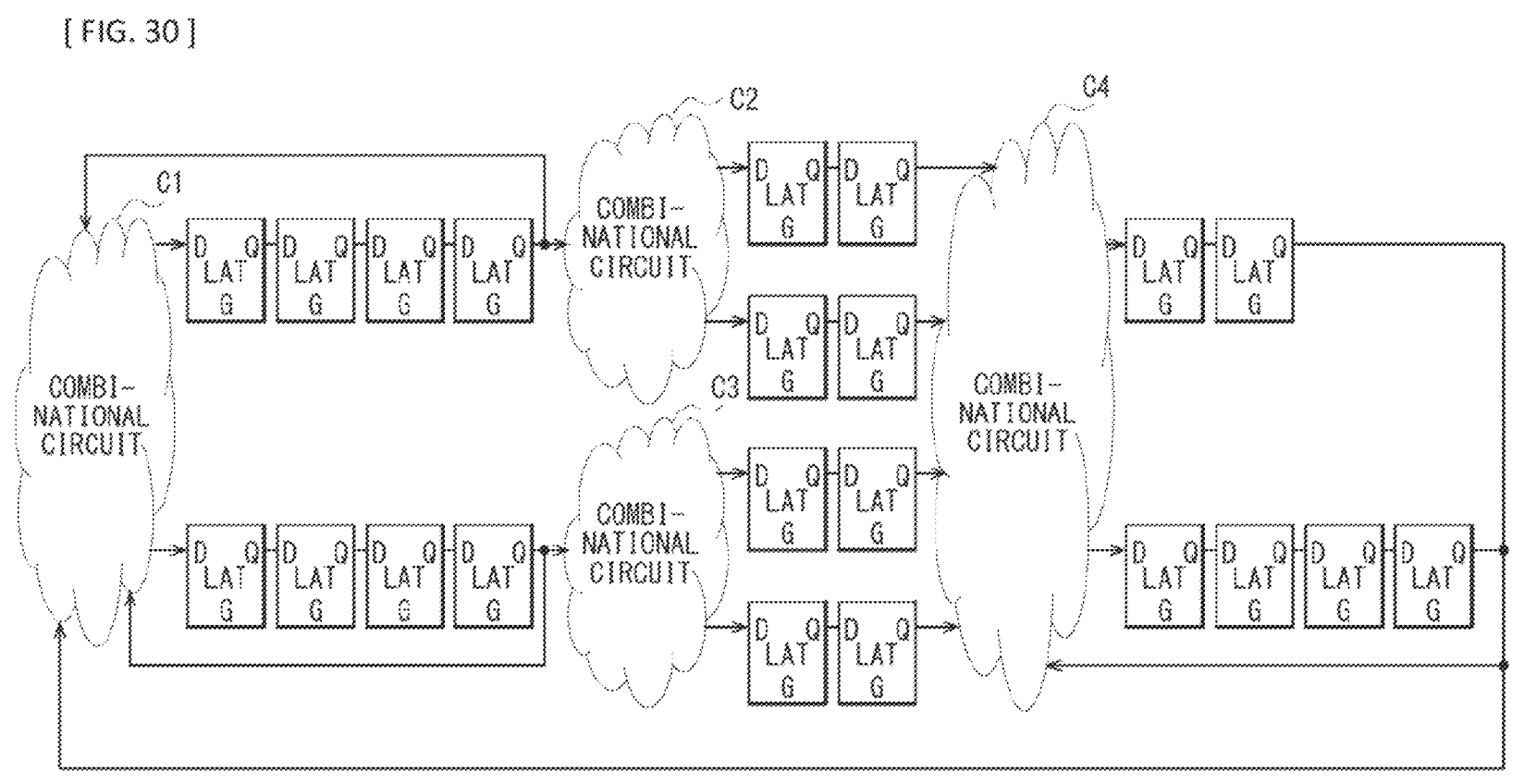

FIG. 30 illustrates an example of processing in step S105. In this example, the computer converts each of the flip-flop circuits F1, F2, and F8, illustrated in FIG. 29, to which the self-feedback loop attribute is provided into four stages of latch circuits as illustrated in FIG. 30. In addition, the computer converts each of the flip-flop circuits F3 to F7, illustrated in FIG. 29, to which the self-feedback loop attribute is not provided into two stages of latch circuits as illustrated in FIG. 30.

Next, the computer converts the combinational circuit preceding to the flip-flop circuit forming the self-feedback loop into four combinational circuits by logically dividing the combinational circuit into four in a logical stage number direction, and alternately disposes the logically divided four combinational circuits and four stages of latch circuits obtained in step S105 (step S106). For example, in the example in FIG. 29, the computer focuses on the flip-flop circuits F1 and F2 each forming the self-feedback loop, and converts the combinational circuit C1 preceding to the flip-flop circuits F1 and F2 into four combinational circuits by logically dividing the combinational circuit C1 into four in the logical stage number direction. Thereafter, the computer alternately disposes the logically divided four combinational circuits and the four stages of latch circuits.

FIG. 31 illustrates an example of processing for logically dividing one combinational circuit into four in the logical stage number direction. It is possible for the computer to logically divide one combinational circuit into four in the logical stage number direction by dividing a logical function with use of, for example, a technology described in the following literature or the like.

Tadeusz Luba and Henry Selvaraj, H. "A General Approach to Boolean Function Decomposition and its Application in FPGA Based Synthesis." In Proc. of VLSI Design, 3(3-4), 289-300, 1995.

As illustrated in (A) of FIG. 31, a combinational circuit of a logical function F generates a piece of data Y on the basis of a piece of data X. In this example, it is possible for the computer to convert the combinational circuit of the logical function F illustrated in (A) of FIG. 31 into two stages of combinational circuits including a combinational circuit of a logical function G and a combinational circuit of a logical function H illustrated in (B) of FIG. 31. The combinational circuit of the logical function G generates a piece of data Z on the basis of a piece of data X1. The combinational circuit of the logical function H generates the piece of data Y on the basis of a piece of data indicated by a union of a piece of data X2 and the piece of data Z. Here, a union of the piece of data X1 and the piece of data X2 is the piece of data X.

Thereafter, similarly, it is possible for the computer to convert the combinational circuit of the logical function G illustrated in (B) of FIG. 31 into two stages of combinational circuits including a combinational circuit of a logical function Gg and a combinational circuit of a logical function Gh illustrated in (C) of FIG. 31. The combinational circuit of the logical function Gg generates a piece of data Z1 on the basis of a piece of data X3. The combinational circuit of the logical function Gh generates the piece of data Z on the basis of a piece of data indicated by a union of a piece of data X4 and the piece of data Z1. Here, a union of the piece of data X3 and the piece of data X4 is the piece of data X1.

In addition, similarly, it is possible for the computer to convert the combinational circuit of the logical function H illustrated in (B) of FIG. 31 into two stages of combinational circuits including a combinational circuit of a logical function Hg and a combinational circuit of a logical function Hh illustrated in (C) of FIG. 31. The combinational circuit of the logical function Hg generates a piece of data V on the basis of a piece of data W. The combinational circuit of the logical function Hh generates the piece of data Y on the basis of a data indicated by a union of a piece of data WI and the piece of data V. Here, a union of the piece of data W and the piece of data WI is equal to the union of the piece of data X2 and the piece of data Z.

Thus, the computer converts one combinational circuit into four combinational circuits by logically dividing the one combinational circuit into four in the logical stage number direction. Thereafter, the computer alternately disposes the logically divided four combinational circuits and four stages of latch circuits by performing retiming processing. This retiming processing may be implemented by, for example, a retiming function provided by a commercially available logic synthesis tool.

Figure 32:
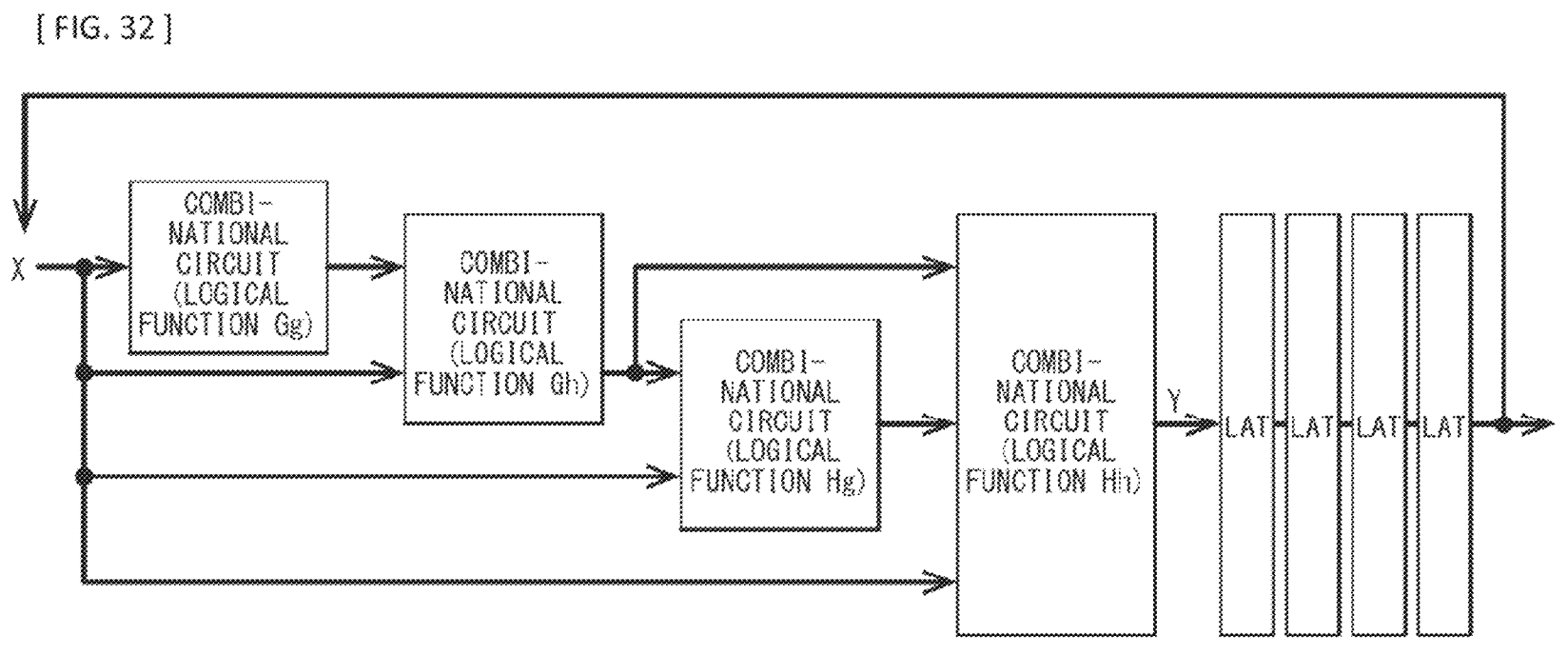

FIGS. 32 and 33 illustrates an example of this processing. As illustrated in FIG. 32, in this example, the combinational circuit of the logical function Gg, the combinational circuit of the logical function Gh, the combinational circuit of the logical function Hg, and the combinational circuit of the logical function Hh illustrated in (C) of FIG. 31, and four stages of latch circuits into which the flip-flop circuit has been converted in step S105 are disposed in this order. The computer performs the retiming processing on such circuits to obtain circuits illustrated in FIG. 33. In this example, the circuits are disposed in order of the combinational circuit of the logical function Gg, the latch circuit, the combinational circuit of the logical function Gh, the latch circuit, the combinational circuit of the logical function Hg, the latch circuit, the combinational circuit of the logical function Hh, and the latch circuit. Each of these four latch circuits includes a plurality of latch circuits of which the number corresponds to the number of bits of data to be handled. Thus, the computer alternately disposes the logically divided four combinational circuits and four stages of latch circuits by performing the retiming processing.

It is to be noted that in a case where logic synthesis is performed with use of two logic circuits logically divided into two in the logical stage number direction, it is necessary to perform logic synthesis again after this retiming processing. A reason for this is that, in a case where this retiming processing is performed after performing logic synthesis with use of two logic circuits logically divided into two in the logical stage number direction, there is a possibility that an unintended latch circuit is inserted by this retiming processing. In addition, as with the grouping processing illustrated in step S104, a plurality of latch circuits obtained may be grouped into a plurality of groups on the basis of the plurality of latch circuits.

For explanatory convenience, the circuits illustrated in FIG. 33 are drawn as illustrated in FIG. 34. The circuit (the loop circuit LP) related to the self-feedback loop includes combinational circuits 12A to 12D and latch circuits 11A to 11D. The combinational circuits 12A to 12D and the latch circuits 11A to 11D are disposed in order of the combinational circuit 12A, the latch circuit 11A, the combinational circuit 12B, the latch circuit 11B, the combinational circuit 12C, the latch circuit 11C, the combinational circuit 12D, and the latch circuit 11D. A piece of data DATA_IN is inputted to this loop circuit LP, and a piece of data DATA_OUT is outputted from the loop circuit LP. The piece of data DATA_IN and a piece of data outputted from the latch circuit 11D are supplied to the combinational circuit 12A.

Next, in FIG. 15, the computer adds a handshake circuit to the circuit related to the self-feedback loop generated in step S106 (step S107). A circuit example is described in detail later. As processing for adding the handshake circuit, it is possible to use a method described in the following literature, for example.

Chammika Mannakkara, "Asynchronous Pipeline Controller Based on Early Acknowledgement Protocol," PHD Thesis, SOKENDAI, 2010.

Next, the computer converts the combinational circuit preceding to the flip-flop circuit other than the flip-flop forming the self-feedback loop into two combinational circuits by logically dividing the combinational circuit into two in the logical stage number direction, and alternately disposes the logically divided two combinational circuits and two stages of latch circuits obtained in step S105 (step S108). Specific processing is similar to that in step S106.

Next, the computer adds a handshake circuit to the circuits generated in step S108 (step S109).

Thereafter, the computer couples the circuits in the entire circuit on the basis of the coupling information about the coupling of flip-flop circuits (fork coupling, join coupling, split coupling, and merge coupling) that is included in the piece of design data (step S110).

Thus, this flow ends.

(Circuit Example of Asynchronous Circuit Related to Self-Feedback Loop)

Next, a circuit example of the asynchronous circuit converted in step S107 is described in detail below with reference to some examples.

Circuit Example E1

FIG. 35 illustrates a circuit example E1 of a circuit related to a self-feedback loop. The data-path circuit 10 includes the circuit illustrated in FIG. 34. The handshake circuit 20 includes a join circuit 41, delay circuits 22A to 22D, control circuits 21A to 21D, a fork circuit 42, and an initial token insertion circuit 43.

The join circuit 41 exchanges signals (the signal REQ_IN and the signal ACK_OUT) with the unillustrated control circuit 21 in a preceding stage, and exchanges signals (the signals REQ and ACK) with the fork circuit 42. In addition, the join circuit 41 exchanges signals (the signals REQ and ACK) with the control circuit 21A.

Specifically, the join circuit 41 receives the signal REQ_IN supplied from the control circuit 21 in the preceding stage and supplies the signal ACK_OUT to this control circuit 21, and receives the signal REQ from the fork circuit 42 and supplies the signal ACK to this fork circuit 42. In addition, the join circuit 41 supplies the signal REQ to the control circuit 21A and receives the signal ACK supplied from this control circuit 21A.

The control circuit 21A exchanges signals (the signals REQ and ACK) each with the join circuit 41 and with the control circuit 21B. Specifically, the control circuit 21A receives the signal REQ supplied from the join circuit 41 and supplies the signal ACK to this join circuit 41, and supplies the signal REQ (a signal REQA) to the control circuit 21B and receives the signal ACK supplied from the control circuit 21B. In addition, the control circuit 21A supplies the signal LCK (a signal LCKA) to the latch circuit 11A.

The control circuit 21B exchanges signals (the signals REQ and ACK) each with the control circuit 21A and with the control circuit 21C. Specifically, the control circuit 21B receives the signal REQ (the signal REQA) supplied from the control circuit 21A and supplies the signal ACK to this control circuit 21A, and supplies the signal REQ (a signal REQB) to the control circuit 21C and receives the signal ACK from this control circuit 21C. In addition, the control circuit 21B supplies the signal LCK (a signal LCKB) to the latch circuit 11B.

The control circuit 21C exchanges signals (the signals REQ and ACK) each with the control circuit 21B and with the control circuit 21D. Specifically, the control circuit 21C receives the signal REQ (the signal REQB) supplied from the control circuit 21B and supplies the signal ACK to this control circuit 21B, and supplies the signal REQ (a signal REQC) to the control circuit 21D and receives the signal ACK supplied from this control circuit 21D. In addition, the control circuit 21C supplies the signal LCK (a signal LCKC) to the latch circuit 11C.

The control circuit 21D exchanges signals (the signals REQ and ACK) each with the control circuit 21C and with the fork circuit 42. Specifically, the control circuit 21D receives the signal REQ (the signal REQC) supplied from the control circuit 21C and supplies the signal ACK to this control circuit 21C, and supplies the signal REQ (a signal REQD) to the fork circuit 42 and receives the signal ACK supplied from this fork circuit 42. In addition, the control circuit 21D supplies the signal LCK (a signal LCKD) to the latch circuit 11D.

The fork circuit 42 exchanges signals (the signals REQ and ACK) with the control circuit 21D. In addition, the fork circuit 42 exchanges signals (the signal REQ_IN and the signal ACK_OUT) with the unillustrated control circuit 21 in a subsequent stage, and exchanges signals (the signals REQ and ACK) with the join circuit 41.

Specifically, the fork circuit 42 receives the signal REQ (the signal REQD) supplied from the control circuit 21D and supplies the signal ACK to this control circuit 21D. In addition, the fork circuit 42 supplies the signal REQ_OUT to the control circuit 21 in the subsequent stage and receives the signal REQ_IN supplied from this control circuit 21, and supplies the signal REQ to the join circuit 41 and receives the signal ACK supplied from this join circuit 41.

The initial token insertion circuit 43 is provided in a signal path between the join circuit 41 and the fork circuit 42. The initial token insertion circuit 43 sets the signal REQ from the fork circuit 42 to the join circuit 41 active in the initial state.

Thus, in the circuit example E1, as illustrated in FIG. 36, the signal LCKA outputted from the control circuit 21A is directly supplied to the latch circuit 11A. The same applies to the latch circuits 11B to 11D.

FIG. 37 illustrates an operation example of the circuit according to this circuit example E1, where (A) indicates a waveform of the signal REQ_IN, (B) indicates waveforms of the signals REQA and LCKA, (C) indicates waveforms of the signals REQB and LCKB. (D) indicates waveforms of the signals REQC and LCKC, (E) indicates waveforms of the signals REQD and LCKD, and (F) indicates a waveform of the signal REQ_OUT.

At a timing t11, the signal REQ_IN supplied from control circuit 21 in the preceding stage changes from the low level to the high level ((A) of FIG. 37). Although not illustrated, in this example, at the timing t11, the signal REQ from the fork circuit 42 to the join circuit 41 is at the high level. Accordingly, the join circuit 41 changes the signal REQ to the control circuit 21A from the low level to the high level on the basis of this signal REQ_IN. Accordingly, at a timing t12 delayed from the timing t1 by a delay amount tdA of the delay circuit 22A, the control circuit 21A changes the signals REQA and LCKA from the low level to the high level ((B) of FIG. 37). The control circuit 21A supplies the signal ACK (the signal ACK_OUT) to the control circuit 21 in the preceding stage through the join circuit 41. Accordingly, at a timing t13, the signal REQ_IN changes from the high level to the low level ((A) of FIG. 37). Although not illustrated, the signal REQ from the fork circuit 42 to the join circuit 41 changes from the high level to the low level. This turns the join circuit 41 to a waiting state.

At a timing t14 delayed from the timing t12 at which the signals REQA and LCKA change by a delay amount tdB of the delay circuit 22B, the control circuit 21B changes the signals REQB and LCKB from the low level to the high level ((C) of FIG. 37). The control circuit 21B supplies the signal ACK to the control circuit 21A. Accordingly, at a timing 115, the control circuit 21A changes the signals REQA and LCKA from the high level to the low level ((B) of FIG. 37).

At a timing t16 delayed from the timing 114 at which the signals REQB and LCKB change by a delay amount tdC of the delay circuit 22C, the control circuit 21C changes the signals REQC and LCKC from the low level to the high level ((D) of FIG. 37). The control circuit 21C supplies the signal ACK to the control circuit 21B. Accordingly, at a timing t18, the control circuit 21B changes the signals REQB and LCKB from the high level to the low level ((C) of FIG. 37).

In this example, at a timing t17, the signal REQ_IN supplied from the control circuit 21 in the preceding stage changes from the low level to the high level ((A) of FIG. 37). However, the signal REQ from the fork circuit 42 to the join circuit 41 is at the low level; therefore, the join circuit 41 is in the waiting state, and maintains the signal REQ to the control circuit 21A at the low level.

At a timing 119 delayed from the timing t16 at which the signals REQC and LCKC change by a delay amount tdD of the delay circuit 22D, the control circuit 21D changes the signals REQD and LCKD from the low level to the high level ((E) of FIG. 37). The control circuit 21D supplies the signal ACK to the control circuit 21C. Accordingly, at a timing 120, the control circuit 21C changes the signals REQC and LCKC from the high level to the low level ((D) of FIG. 37).

The fork circuit 42 changes the signal REQ_OUT from the low level to the high level at a timing t21 on the basis of change of the signal REQD from the control circuit 21D ((F) of FIG. 37).

In addition, the fork circuit 42 changes the signal REQ to the join circuit 41 from the low level to the high level on the basis of the change of the signal REQD. The signal REQ_IN is at the high level ((A) of FIG. 37); therefore, waiting in the join circuit 41 is established. Accordingly, the join circuit 41 changes the signal REQ to the control circuit 21A from the low level to the high level on the basis of change of the signal REQ from the fork circuit 42. Accordingly, at a timing t22 delayed from the timing t19 at which the signals REQD and LCKD change by the delay amount tdA of the delay circuit 22A, the control circuit 21A changes the signals REQA and LCKA from the low level to the high level ((B) of FIG. 37). The control circuit 21A supplies the signal ACK (the signal ACK_OUT) to the control circuit 21 in the preceding stage through the join circuit 41. Thus, at a timing 123, the signal REQ_IN changes from the high level to the low level ((A) of FIG. 37). Likewise, the control circuit 21A supplies the signal ACK to the control circuit 21D through the join circuit 41 and the fork circuit 42. Thus, at a timing t24, the control circuit 21D changes the signals REQD and LCKD from the high level to the low level ((E) of FIG. 37).

The fork circuit 42 changes the signal REQ_OUT from the high level to the low level at a timing t25 on the basis of change of the signal REQD from the control circuit 21D ((F) of FIG. 37).

At a timing 126 delayed from the timing t21 at which the signals REQA and LCKA change by the delay amount tdB of the delay circuit 22B, the control circuit 21B changes the signals REQB and LCKB from the low level to the high level ((C) of FIG. 37). The control circuit 21B supplies the signal ACK to the control circuit 21A. Thus, at a timing t27, the control circuit 21A changes the signals REQA and LCKA from the high level to the low level ((B) of FIG. 37).

The same applies thereafter.

In this example, the signal LCKA is at the high level in a period from the timing t12 to the timing t15. Accordingly, the latch circuit 11A outputs a piece of data inputted as it is in the period from the timing t12 to the timing t15. In addition, the signal LCKB is at the high level in a period from the timing t14 to the timing t18. Accordingly, the latch circuit 11B outputs a piece of data inputted as it is in the period from the timing t14 to the timing t18. A period in which the signal LCKA is at the high level and a period in which the signal LCKB is at the high level overlap each other in a period from the timing t14 to the timing t15. In the period from the timing t14 to the timing t15, both the latch circuits 11A and 11B output the pieces of data inputted as they are. In other words, three combinational circuits 12A, 12B, and 12C are coupled.

Likewise, in a period from the timing t16 to the timing t18, both the signals LCKB and LCKC are at the high level, and three combinational circuits 12B, 12C, and 12D are coupled. In a period from the timing t19 to the timing t20, both the signals LCKC and LCKD are at the high level, and three combinational circuits 12C, 12D, and 12A are coupled. In a period from the timing t22 to the timing 124, both the signals LCKD and LCKA are at the high level, and three combinational circuits 12D, 12A, and 12B are coupled.

It is possible to use the circuit according to the circuit example E1 in a case where no trouble occurs even if three combinational circuits are coupled in such a manner.

Circuit Example E2

A circuit example E2 is an example configured to eliminate overlap described above and prevent three combinational circuits from being coupled.

FIG. 38 illustrates the circuit example E2 of a circuit related to a self-feedback loop. As with the circuit example E1 (FIG. 35), the data-path circuit 10 includes the combinational circuits 12A to 12D and the latch circuits 11A to 11D. The handshake circuit 20 includes the join circuit 41, the delay circuits 22A to 22D, the control circuits 21A to 21D, the fork circuit 42, the initial token insertion circuit 43, and AND circuits 44A to 44D.

The AND circuit 44A determines AND of the signal LCK supplied from the control circuit 21A and an inverted circuit of the signal LCK supplied from the control circuit 21B, and outputs a thus-obtained result as the signal LCKA. Accordingly, the signal LCK supplied from the control circuit 21B is the same as the signal ACK from the control circuit 21B to the control circuit 21A. The AND circuit 44B determines AND of the signal LCK supplied from the control circuit 21B and an inverted signal of the signal LCK supplied from the control circuit 21C, and outputs a thus-obtained result as the signal LCKB. The AND circuit 44C determines AND of the signal LCK supplied from the control circuit 21C and an inverted signal of the signal LCK supplied from the control circuit 21D, and outputs a thus-obtained result as the signal LCKC. The AND circuit 44D determines AND of the signal LCK supplied from the control circuit 21D and an inverted signal of the signal LCK supplied from the control circuit 21A, and outputs a thus-obtained result as the signal LCKD.

Thus, in the circuit example E2, as illustrated in FIG. 39, the signal LCKA supplied from the AND circuit 44A is supplied to the latch circuit 11A. The same applies to the latch circuits 11B to 11D. It is to be noted that while, in FIG. 38, for example, the AND circuit 44A determines AND of the signal LCK supplied from the control circuit 21A and the inverted signal of the signal LCK supplied from the control circuit 21B, in FIG. 39, the AND circuit 44A determines AND of the signal LCK supplied from the control circuit 21A and an inverted signal of the signal ACK from the control circuit 21B to the control circuit 21A. As illustrated in FIG. 3, the signals LCK, REQ, and ACK generated by the control circuit 21B are the same signals as each other, and are therefore substantially the same.

FIG. 40 illustrates an operation example of the circuit according to this circuit example E2, where (A) indicates a waveform of the signal REQ_IN, (B) indicates a waveform of the signal REQA, (C) indicates a waveform of the signal REQB, (D) indicates a waveform of the signal REQC. (E) indicates a waveform of the signal REQD, (F) indicates a waveform of the signal LCKA generated by the AND circuit 44A, (G) indicates a waveform of the signal LCKB generated by the AND circuit 44B, (H) indicates a waveform of the signal LCKC generated by the AND circuit 44C, (I) indicates a waveform of the signal LCKD generated by the AND circuit 44D, and (J) indicates a waveform of the signal REQ_OUT. The waveforms of the signals REQ_IN, REQA to REQD, and REQ_OUT are similar to those in the case of the circuit example E1 (FIG. 37).

The AND circuit 44A determines AND of the signal LCK generated by the control circuit 21A and the inverted signal of the signal LCK generated by the control circuit 21B to thereby generate the signal LCKA. The signal LCK generated by the control circuit 21A has the same waveform as that of the signal REQA illustrated in (B) of FIG. 40, and the signal LCK generated by the control circuit 21B has the same waveform as that of the signal REQB illustrated in (C) of FIG. 40. In this example, the AND circuit 44A changes the signal LCKA to the high level in a period from the timing t12 to the timing t14, for example ((F) of FIG. 40).

Likewise, the AND circuit 44B determines AND of the signal LCK (the signal REQB) supplied from the control circuit 21B and the inverted signal of the signal LCK (the signal REQC) supplied from the control circuit 21C to thereby generate the signal LCKB. In this example, the AND circuit 44B changes the signal LCKB to the high level in a period from the timing t14 to the timing t16, for example, ((G) of FIG. 40).

Likewise, the AND circuit 44C determines AND of the signal LCK (the signal REQC) supplied from the control circuit 21C and the inverted signal of the signal LCK (the signal REQD) supplied from the control circuit 21D to thereby generate the signal LCKC. In this example, the AND circuit 44C changes the signal LCKC to the high level in a period from the timing t16 to the timing 119, for example ((H) of FIG. 40).

Likewise, the AND circuit 44D determines AND of the signal LCK (the signal REQD) supplied from the control circuit 21D and the inverted signal of the signal LCK (the signal REQA) supplied from the control circuit 21A to thereby generate the signal LCKD. In this example, the AND circuit 44D changes the signal LCKD to the high level in a period from the timing t19 to the timing t22, for example ((I) of FIG. 40).

In this example, the signal LCKA is at the high level in the period from the timing t12 to the timing t14. Accordingly, the latch circuit 11A outputs a piece of data inputted as it is in this period from the timing t12 to the timing t14. In addition, the signal LCKB is at the high level in the period from the timing t14 to the timing t16. Accordingly, the latch circuit 11B outputs a piece of data inputted as it is in this period from the timing t14 to the timing t16. In this example, the period in which the signal LCKA is at the high level and the period in which the signal LCKB is at the high level hardly overlap each other. Accordingly, unlike the case of the circuit example E1, three combinational circuits 12D, 12A, and 12B are not coupled.

Likewise, the period in which the signal LCKB is at the high level and a period in which the signal LCKC is at the high level hardly overlap each other. The period in which the signal LCKC is at the high level and a period in which the signal LCKD is at the high level hardly overlap each other. The period in which the signal LCKD is at the high level and the period in which the signal LCKA is at the high level hardly overlap each other.

Thus, for example, it is possible for the circuit according to the circuit example E2 is stably operate, as compared with the circuit according to the circuit example E1.

Circuit Example E3

A circuit example E3 is an example in which the stage number of latch circuits in the data-path circuit 10 in the circuit example E2 is reduced to two stages.

FIG. 41 illustrates a configuration example of the loop circuit LP according to the circuit example E3. This loop circuit LP includes the combinational circuits 12A to 12D, latch circuits 11AC and 11BD, multiplexers (MUX) 13 and 16, and demultiplexers (DMX) 15 and 18. The multiplexer 13 selects one of a piece of data supplied from the combinational circuit 12A and a piece of data supplied from the combinational circuit 12C, and outputs the selected piece of data. The latch circuit 11AC latches the piece of data supplied from the multiplexer 13. The demultiplexer 15 supplies the piece of data supplied from the latch circuit 11AC to one of the combinational circuit 12B and the combinational circuit 12D. The multiplexer 16 selects one of a piece of data supplied from the combinational circuit 12B and a piece of data supplied from the combinational circuit 12D, and outputs the selected piece of data. The latch circuit 11BD latches the piece of data supplied from the multiplexer 16. The demultiplexer 18 outputs the piece of data supplied from the latch circuit 11BD as the piece of data DATA_OUT, or supplies the piece of data supplied from the latch circuit 11BD to the combinational circuit 12C.

FIG. 42 illustrates an operation example of the loop circuit LP illustrated in FIG. 41, where (A) indicates a certain operation state and (B) indicate another operation state. This loop circuit LP alternately repeats the operation state illustrated in (A) of FIG. 42 and the operation state illustrated in (B) of FIG. 42.

In (A) of FIG. 42, the demultiplexer 18 outputs the piece of data supplied from the latch circuit 11BD as the piece of data DATA_OUT. The combinational circuit 12A performs a logical operation on the basis of the piece of data DATA_IN and the piece of data DATA_OUT. The multiplexer 13 supplies the piece of data supplied from the combinational circuit 12A to the latch circuit 11AC. The latch circuit 11AC latches the piece of data supplied from the multiplexer 13. The demultiplexer 15 supplies the piece of data supplied from the latch circuit 11AC to the combinational circuit 12B. The combinational circuit 12B performs a logical operation on the basis of the piece of data supplied from the demultiplexer 15. The multiplexer 16 supplies the piece of data supplied from the combinational circuit 12B to the latch circuit 11BD.

In (B) of FIG. 42, the demultiplexer 18 supplies the piece of data supplied from the latch circuit 11BD to the combinational circuit 12C. The combinational circuit 12C performs a logical operation on the basis of the piece of data supplied from the demultiplexer 18. The multiplexer 13 supplies the piece of data supplied from the combinational circuit 12C to the latch circuit 11AC. The latch circuit 11AC latches the piece of data supplied from the multiplexer 13. The demultiplexer 15 supplies the piece of data supplied from the latch circuit 11AC to the combinational circuit 12D. The combinational circuit 12D performs a logical operation on the basis of the piece of data supplied from the demultiplexer 15. The multiplexer 16 supplies the piece of data supplied from the combinational circuit 12D to the latch circuit 11BD.

Thus, the loop circuit LP illustrated in FIG. 41 performs the same processing as that of the loop circuit LP illustrated in FIG. 34 by circulating the piece of data twice.

The computer converts the circuit illustrated in FIG. 34 into the circuit illustrated in FIG. 41, and adds this circuit to the handshake circuit 20, thereby generating a circuit according to the circuit example E3 to be described below.

FIG. 43 illustrates the circuit example E3 of a circuit related to a self-feedback loop. The data-path circuit 10 is the circuit illustrated in FIG. 41 to which the latch circuits 14 and 17 are added. The latch circuit 14 latches a signal SELAC to thereby generate a signal SELBD. The latch circuit 17 latches the signal SELBD to thereby generate a signal SELAC2. The handshake circuit 20 includes the join circuit 41, the delay circuits 22A to 22D, the control circuits 21A to 21D, the fork circuit 42, the initial token insertion circuit 43, the AND circuits 44A to 44D, and OR circuits 45, 46AC, and 46BD.

The OR circuit 45 determines OR of the signal LCK supplied from the control circuit 21B and an output signal (the signal LCKC) of the AND circuit 44C, and outputs a thus-obtained result as the signal SELAC. The OR circuit 46AC determines OR of an output signal (the signal LCKA) of the AND circuit 44A and the output signal (the signal LCKC) of the AND circuit 44C, and supplies a thus-obtained result as a signal LCKAC to the latch circuits 11AC and 14. The OR circuit 46BD determines OR of an output signal (the signal LCKB) of the AND circuit 44B and an output signal (the signal LCKD) of the AND circuit 44D, and supplies a thus-obtained result as a signal LCKBD to the latch circuits 11BD and 17.

Here, the combinational circuit 12A corresponds to a specific example of a "first combinational circuit" in an embodiment of the present disclosure. The combinational circuit 12C corresponds to a specific example of a "second combinational circuit" in an embodiment of the present disclosure. The multiplexer 13 corresponds to a specific example of a "first multiplexer" in an embodiment of the present disclosure. The latch circuit 11AC corresponds to a specific example of a "first latch circuit" in an embodiment of the present disclosure. The latch circuit 14 corresponds to a specific example of a "first control latch circuit" in an embodiment of the present disclosure. The demultiplexer 15 corresponds to a specific example of a "first demultiplexer" in an embodiment of the present disclosure. The combinational circuit 12B corresponds to a specific example of a "third combinational circuit" in an embodiment of the present disclosure. The combinational circuit 12D corresponds to a specific example of a "fourth combinational circuit" in an embodiment of the present disclosure. The multiplexer 16 corresponds to a specific example of a "second multiplexer" in an embodiment of the present disclosure. The latch circuit 11BD corresponds to a specific example of a "second latch circuit" in an embodiment of the present disclosure. The latch circuit 17 corresponds to a specific example of a "second control latch circuit" in an embodiment of the present disclosure. The demultiplexer 18 corresponds to a specific example of a "second demultiplexer" in an embodiment of the present disclosure.

The join circuit 41 corresponds to a specific example of a "join circuit" in an embodiment of the present disclosure. The control circuit 21A corresponds to a specific example of a "first control circuit" in an embodiment of the present disclosure. The control circuit 21B corresponds to a specific example of a "second control circuit" in an embodiment of the present disclosure. The control circuit 21C corresponds to a specific example of a "third control circuit" in an embodiment of the present disclosure. The control circuit 21D corresponds to a specific example of a "fourth control circuit" in an embodiment of the present disclosure. The fork circuit 42 corresponds to a specific example of a "fork circuit" in an embodiment of the present disclosure. The AND circuit 44A corresponds to a specific example of a "first AND circuit" in an embodiment of the present disclosure. The AND circuit 44B corresponds to a specific example of a "second AND circuit" in an embodiment of the present disclosure. The AND circuit 44C corresponds to a specific example of a "third AND circuit" in an embodiment of the present disclosure. The AND circuit 44D corresponds to a specific example of a "fourth AND circuit" in an embodiment of the present disclosure. The OR circuit 46AC corresponds to a specific example of a "first OR circuit" in an embodiment of the present disclosure. The OR circuit 46BD corresponds to a specific example of a "second OR circuit" in an embodiment of the present disclosure. The OR circuit 45 corresponds to a specific example of a "third OR circuit" in an embodiment of the present disclosure. The signals REQ, REQ_IN, and REQ_OUT correspond to specific examples of a "request signal" in an embodiment of the present disclosure. The signals ACK, ACK_IN, and ACK_OUT correspond to specific examples of a "response signal" in an embodiment of the present disclosure.

FIG. 44 illustrates an operation example of the circuit according to this circuit example E3, where (A) indicates a waveform of the signal REQ_IN, (B) indicates a waveform of the signal REQA, (C) indicates a waveform of the signal REQB, (D) indicates a waveform of the signal REQC, (E) indicates a waveform of the signal REQD, (F) indicates a waveform of the signal LCKA generated by the AND circuit 44A, (G) indicates a waveform of the signal LCKB generated by the AND circuit 44B, (H) indicates a waveform of the signal LCKC generated by the AND circuit 44C, (I) indicates a waveform of the signal LCKD generated by the AND circuit 44D, (J) indicates a waveform of the signal LCKAC generated by the OR circuit 46AC, (K) indicates a waveform of the signal LCKBD generated by the OR circuit 46BD, (L) indicates a waveform of the signal SELAC, (M) indicates a waveform of the signal SELBD, (N) indicates a waveform of the signal SELAC2, and (O) indicates a waveform of the signal REQ_OUT. The waveforms of the signals REQ_IN, REQA to REQD, LCKA to LCKD, and REQ_OUT are similar to those in the case of the circuit example E2 (FIG. 40).

The OR circuit 46AC determines OR of the signal LCKA generated by the AND circuit 44A and the signal LCKC generated by the AND circuit 44C to thereby generate the signal LCKAC. In this example, the OR circuit 46AC changes the signal LCKAC to the high level, for example, in the period from the timing t12 to the timing t14 and the period from the timing t16 to the timing t19 ((J) of FIG. 44).

The OR circuit 46BD determines OR of the signal LCKB generated by the AND circuit 44B and the signal LCKD generated by the AND circuit 44D to thereby generate the signal LCKBD. In this example, the OR circuit 46BD changes the signal LCKAC to the high level, for example, in the period from the timing t14 to the timing t16 and a period from the timing t19 to the timing 121 ((K) of FIG. 44).

The OR circuit 45 determines OR of the signal LCK generated by the control circuit 21B and the signal LCKC generated by the AND circuit 44C to thereby generate the signal SELAC. The signal LCK generated by the control circuit 21B has the same waveform as that of the signal REQC illustrated in (C) of FIG. 44. Accordingly, in this example, for example, the OR circuit 45 changes the signal SELAC from the low level to the high level at the timing t14, and changes the signal SELAC from the high level to the low level at the timing t19 ((L) of FIG. 44).

The latch circuit 14 of the data-path circuit 10 latches this signal SELAC on the basis of the signal LCKAC to thereby generate the signal SELBD. Accordingly, in this example, the latch circuit 14 changes the signal SELBD from the low level to the high level at the timing t16, and changes the signal SELBD from the high level to the low level at the timing 121 ((M) of FIG. 44).

The latch circuit 17 of the data-path circuit 10 latches this signal SELBD on the basis of the signal LCKBD to thereby generate the signal SELAC2. Accordingly, in this example, the latch circuit 17 changes the signal SELAC2 from the high level to the low level timing t14, and changes the signal SELAC2 from the low level to the high level at the timing t19 ((N) of FIG. 44).

For example, in the period from the timing t12 to the timing t14, the signal SELAC is at the low level ((L) of FIG. 44); therefore, the multiplexer 13 supplies the piece of data supplied from the combinational circuit 12A to the latch circuit 11AC.

In the period from the timing t14 to the timing t16, the signal SELBD is at the low level ((M) of FIG. 44); therefore, the demultiplexer 15 supplies the piece of data supplied from the latch circuit 11AC to the combinational circuit 12B, and the multiplexer 16 supplies the piece of data supplied from the combinational circuit 12B to the latch circuit 11BD.

In the period from the timing t16 to the timing 119, the signal SELAC2 is at the low level and the signal SELAC is at the high level ((L) and (N) of FIG. 44); therefore, the demultiplexer 18 supplies the piece of data supplied from the latch circuit 11BD to the combinational circuit 12C, and the multiplexer 13 supplies the piece of data supplied from the combinational circuit 12C to the latch circuit 11AC.

In the period from the timing t19 to the timing t22, the signal SELBD is at the high level ((K) of FIG. 44); therefore, the demultiplexer 15 supplies the piece of data supplied from the latch circuit 11AC to the combinational circuit 12D, and the multiplexer 16 supplies the piece of data supplied from the combinational circuit 12D to the latch circuit 11BD.

Thereafter, in a period from the timing t22 to the timing t26, the signal SELAC2 is at the high level ((N) of FIG. 44); therefore, the demultiplexer 18 outputs the piece of data supplied from the latch circuit 11BD as the piece of data DATA_OUT.

In the circuit example E3, it is possible to reduce the stage number of latch circuits in the data-path circuit 10 to two stages, which makes it possible to reduce a circuit scale. As a result, it is possible to reduce a circuit area and power consumption.

In addition, in the circuit example E3, as illustrated in FIG. 43, the flip-flop circuit forming the self-feedback loop is finally configured with use of two stages of latch circuits 11AC and 11BD. Meanwhile, as illustrated in step S105 in FIG. 15, a flip-flop circuit other than the flip-flop circuit forming the self-feedback loop is also configured with use of two stages of latch circuits. This facilitates static timing analysis. Accordingly, it is possible to simplify a test circuit in design for facilitating a test, which makes it possible to reduce a circuit scale of the test circuit.

Circuit Example E4

A circuit example E4 is an example in which the stage number of latch circuits in a forward path in the handshake circuit 20 in the circuit example E3 is reduced to two stages.

FIG. 45 illustrates the circuit example E4 of a circuit related to a self-feedback loop. As with the circuit example E3 (FIG. 43), the data-path circuit 10 includes the combinational circuits 12A to 12D, the latch circuits 11AC, 11BD, 14, and 17, the multiplexers 13 and 16, and the demultiplexers 15 and 18. The handshake circuit 20 includes the join circuit 41, a merge circuit 51, delay circuits 22AC and 22BD, control circuits 21AC, 21BD, and 47, a split circuit 52, the fork circuit 42, the initial token insertion circuit 43, and an AND circuit 48.

The join circuit 41 exchanges signals (the signal REQ_IN and the signal ACK_OUT) with the unillustrated control circuit 21 in a preceding stage, and exchanges signals (the signals REQ and ACK) with the fork circuit 42. In addition, the join circuit 41 exchanges signals (the signals REQ and ACK) with the merge circuit 51.

Specifically, the join circuit 41 receives the signal REQ_IN supplied from the control circuit 21 in the preceding stage and supplies the signal ACK_OUT to this control circuit 21, and receives the signal REQ supplied from the fork circuit 42 and supplies the signal ACK to this fork circuit 42. In addition, the join circuit 41 supplies the signal REQ to the merge circuit 51 and receives the signal ACK supplied from this merge circuit 51.

The merge circuit 51 exchanges signals (the signals REQ and ACK) with the join circuit 41 and with the control circuit 47. In addition, the merge circuit 51 exchanges signals (the signals REQ and ACK) with the control circuit 21AC. In addition, the merge circuit 51 generates the signal SELAC.

Specifically, the merge circuit 51 receives the signal REQ supplied from the join circuit 41 and supplies the signal ACK to this merge circuit 51, and receives the signal REQ supplied from the control circuit 47 and supplies the signal ACK to this control circuit 47. In addition, the merge circuit 51 supplies the signal REQ to the control circuit 21AC and receives the signal ACK supplied from this control circuit 21AC.

The control circuit 21AC exchanges signals (the signals REQ and ACK) each with the merge circuit 51 and with the control circuit 21BD. Specifically, the control circuit 21AC receives the signal REQ supplied from the merge circuit 51 and supplies the signal ACK to this merge circuit 51, and supplies the signal REQ (a signal REQAC) to the control circuit 21BD and receives the signal ACK supplied from this control circuit 21BD. In addition, the control circuit 21AC supplies the signal LCK to the AND circuit 48.

The control circuit 21BD exchanges signals (the signals REQ and ACK) each with the control circuit 21AC and with the split circuit 52. Specifically, the control circuit 21BD receives the signal REQAC supplied from the control circuit 21AC and supplies the signal ACK to this control circuit 21AC, and supplies the signal REQ (a signal REQBD) to the split circuit 52 and receives the signal ACK supplied from this split circuit 52. In addition, the control circuit 21BD supplies the signal LCK (the signal LCKBD) to the latch circuits 11BD and 17.

The control circuit 47 exchanges signals (the signals REQ and ACK) with the split circuit 52. In addition, the control circuit 47 exchanges signals (the signals REQ and ACK) with the merge circuit 51. Specifically, the control circuit 47 receives the signal REQ supplied from the split circuit 52, and supplies the signal ACK to this split circuit 52, and supplies the signal REQ (a signal REQDM) to the merge circuit 51 and receives the signal ACK supplied from this merge circuit 51.

The split circuit 52 exchanges signals (the signals REQ and ACK) with the control circuit 21BD. In addition, the split circuit 52 exchanges signals (the signals REQ and ACK) with the fork circuit 42 and with the control circuit 47. The signal SELAC2 is inputted to the split circuit 52.

Specifically, the split circuit 52 receives the signal REQBD supplied from the control circuit 21BD and supplies the signal ACK to this control circuit 21BD. In addition, the split circuit 52 supplies the signal REQ to the fork circuit 42 and receives the signal REQ supplied from this fork circuit 42, and supplies the signal REQ to the control circuit 47 and receives the signal ACK supplied from the control circuit 47.

The fork circuit 42 exchanges signals (the signals REQ and ACK) with the split circuit 52. In addition, the fork circuit 42 exchanges signals (the signal REQ_IN and the signal ACK_OUT) with the unillustrated control circuit 21 in a subsequent stage, and exchanges signals (the signals REQ and ACK) with the join circuit 41.

Specifically, the fork circuit 42 receives the signal REQ supplied from the split circuit 52 and supplies the signal ACK to this split circuit 52. In addition, the fork circuit 42 supplies the signal REQ_OUT to the control circuit 21 in the subsequent stage and receives the signal REQ_IN supplied from this control circuit 21, and supplies the signal REQ to the join circuit 41 and receives the signal ACK supplied from this join circuit 41.

The AND circuit 48 determines AND of the signal LCK supplied from the control circuit 21AC and an inverted signal of the signal LCK (the signal LCKBD) supplied from the control circuit 21BD, and outputs a thus-obtained result as the signal LCKAC.

Here, the merge circuit 51 corresponds to a specific example of a "merge circuit" in an embodiment of the present disclosure. The control circuit 21AC corresponds to a specific example of a "first control circuit" in an embodiment of the present disclosure. The control circuit 21BD corresponds to a specific example of a "second control circuit" in an embodiment of the present disclosure. The split circuit 52 corresponds to a specific example of a "split circuit" in an embodiment of the present disclosure. The control circuit 47 corresponds to a specific example of a "third control circuit" in an embodiment of the present disclosure. The AND circuit 48 corresponds to a specific example of a "fifth AND circuit" in an embodiment of the present disclosure.

FIG. 46 illustrates an operation example of the circuit according to this circuit example E4, where (A) indicate a waveform of the signal REQ_IN, (B) indicates a waveform of the signal REQAC. (C) indicates a waveform of the signal REQBD. (D) indicates a waveform of the signal REQDM, (E) indicates a waveform of the signal LCKAC generated by the AND circuit 48, (F) indicates a waveform of the signal LCKBD generated by the control circuit 21BD, (G) indicates a waveform of the signal SELAC, (H) indicates a waveform of the signal SELBC, (I) indicates a waveform of the signal SELAC2, and (J) indicates a waveform of the signal REQ_OUT.

At a timing t31, the signal REQ_IN supplied from the control circuit 21 in the preceding stage changes from the low level to the high level ((A) of FIG. 46). Although not illustrated, in this example, at the timing t31, the signal REQ from the fork circuit 42 to the join circuit 41 is at the high level. Accordingly, the join circuit 41 changes the signal REQ to the merge circuit 51 from the low level to the high level on the basis of this signal REQ_IN. The merge circuit 51 supplies this signal REQ to the control circuit 21AC. Accordingly, at a timing t32 delayed from the timing t31 by a delay amount tdAC of the delay circuit 22AC, the control circuit 21AC changes the signal REQAC from the low level to the high level ((B) of FIG. 46). The control circuit 21AC supplies the signal ACK (the signal ACK_OUT) to the control circuit 21 in the preceding stage through the merge circuit 51 and the join circuit 41. Thus, at a timing t33, the signal REQ_IN changes from the high level to the low level ((A) of FIG. 46). Although not illustrated, the signal REQ from the fork circuit 42 to the join circuit 41 changes from the high level to the low level. This turns the join circuit 41 to the waiting state.

At a timing 134 delayed from the timing t32 at which the signal REQAC changes by a delay amount tdBD of the delay circuit 22BD, the control circuit 21BD changes the signals REQBD and LCKBD from the low level to the high level ((C) and (F) of FIG. 46). The control circuit 21BD supplies the signal ACK to the control circuit 21AC. Thus, at a timing 135, the control circuit 21AC changes the signals REQAC and LCK from the high level to the low level ((B) of FIG. 46).

The split circuit 52 supplies the signal REQBD to the control circuit 47 on the basis of the signal SELAC2. At the timing 135, the control circuit 47 changes the signal REQDM from the low level to the high level ((D) of FIG. 46). The control circuit 47 supplies the signal ACK to the control circuit 21BD through the split circuit 52. Thus, at a timing t37, the control circuit 21BD changes the signals REQBD and LCKBD from the high level to the low level ((C) and (F) of FIG. 46).

The merge circuit 51 changes the signal SELAC from the low level to the high level at a timing 136 on the basis of change of the signal REQDM ((G) of FIG. 46).

In addition, the merge circuit 51 changes the signal REQ to the control circuit 21AC from the low level to the high level on the basis of the change of the signal REQDM. At a timing t38 delayed from the timing t35 at which the signal REQDM changes by the delay amount tdAC of the delay circuit 22AC, the control circuit 21AC changes the signal REQAC from the low level to the high level ((B) of FIG. 46). The control circuit 21AC supplies the signal ACK to the control circuit 47 through the merge circuit 51. Thus, at a timing 139, the control circuit 47 changes the signal REQDM from the high level to the low level ((D) of FIG. 46).

In this example, at a timing 140, the signal REQ_IN supplied from the control circuit 21 in the preceding stage changes from the low level to the high level ((A) of FIG. 46). However, the signal REQ from the fork circuit 42 to the join circuit 41 is at the low level; therefore, the join circuit 41 is in the waiting state, and maintains the signal REQ to the merge circuit 51 at the low level.

At a timing 141 delayed from the timing t38 at which the signal REQAC changes by the delay amount tdBD of the delay circuit 22BD, the control circuit 21BD changes the signals REQBD and LCKBD from the low level to the high level ((C) and (F) of FIG. 46). The control circuit 21BD supplies the signal ACK to the control circuit 21AC. Thus, at a timing t42, the control circuit 21AC changes the signal REQAC from the high level to the low level ((B) of FIG. 46).

The split circuit 52 supplies this signal REQBD to the fork circuit 42 on the basis of the signal SELAC2. The fork circuit 42 changes the signal REQ_OUT from the low level to the high level at the timing t42 on the basis of the signal REQ (the signal REQBD) supplied from the split circuit 52 ((J) of FIG. 46).

In addition, the fork circuit 42 changes the signal REQ to the join circuit 41 from the low level to the high level on the basis of the signal REQ (the signal REQBD) supplied from the split circuit 52. The signal REQ_IN is at the high level ((A) of FIG. 46); therefore, the join circuit 41 changes the signal REQ to the merge circuit 51 from the low level to the high level on the basis of the signal REQ from the fork circuit 42. The merge circuit 51 changes the signal SELAB from the high level to the low level at a timing 143 on the basis of this signal REQ ((G) of FIG. 46).

Thereafter, the control circuit 21BD changes the signals REQBD and LCKBD from the high level to the low level at a timing 144 ((C) and (F) of FIG. 46). The split circuit 52 supplies this signal REQBD to the fork circuit 42 on the basis of the signal SELAC2. The fork circuit 42 changes the signal REQ_OUT from the high level to the low level at a timing t45 on the basis of the signal REQ (the signal REQBD) supplied from the split circuit 52 ((J) of FIG. 46).

The same applies thereafter.

In the circuit example E4, it is possible to reduce the stage number of latch circuits in the handshake circuit 20. In addition, it is possible to omit the AND circuits 44A to 44D and the OR circuits 45, 46AC, and 46BD, as compared with, for example, the circuit according to the circuit example E3 (FIG. 43). Even if the AND circuits 44A to 44D are omitted in such a manner, as illustrated in FIG. 46, it is possible to cause a period in which the signal LCKAC is at the high level and a period in which the signal LCKBD is at the high level to hardly overlap each other. Such an operation order is secured by providing the control circuit 47. Thus, it is possible for the circuit example E4 to stably operate while reducing a circuit scale.

Circuit Example E5

In a circuit according to a circuit example E5, a control circuit in a circuit related to a self loop is configured with a circuit different from the control circuit 21 in a circuit other than the circuit related to the self loop.

FIG. 47 illustrates an example of the circuit example E5 of a circuit related to a self-feedback loop. The data-path circuit 10 has the same circuit configuration as that of the circuit example E4 (FIG. 45). The handshake circuit 20 includes the join circuit 41, the merge circuit 51, the delay circuits 22AC and 22BD, control circuits 61AC and 61BD, the split circuit 52, the fork circuit 42, and the initial token insertion circuit 43. That is, in the handshake circuit 20 according to the circuit example E5, the control circuits 21AC and 21BD in the handshake circuit 20 (FIG. 45) according to the circuit example E4 are changed into the control circuits 61AC and 61BD, and the control circuit 47 and the AND circuit 48 are omitted.

As with the control circuit 21AC (FIG. 45), the control circuit 61AC exchanges signals (the signals REQ and ACK) each with the merge circuit 51 and with the control circuit 61BD. In addition, the control circuit 61AC supplies the signal LCK (the signal LCKAC) to the latch circuits 11AC and 14.

As with the control circuit 21BD (FIG. 45), the control circuit 61BD exchanges signals (the signals REQ and ACK) each with the control circuit 61AC and with the split circuit 52. In addition, the control circuit 61BD supplies the signal LCK (the signal LCKBD) to the latch circuits 11BD and 17.

FIG. 48 illustrates a configuration example of a control circuit 61. It is possible for each of the control circuits 61AC and 61BD to use this control circuit 61. This control circuit 61 includes AND circuits 121 and 122, an OR circuit 123, an AND circuit 124, and an OR circuit 125. The signal LCK and the signal ACK_OUT are the same signals as each other.

The AND circuit 121 is configured to determine AND of the signal LCK and the signal REQ_IN. The AND circuit 122 is configured to determine AND of the signal REQ_IN, the inverted signal of the signal ACK_IN, and an inverted signal of the signal REQ_OUT. The OR circuit 123 is configured to generate the signal LCK and the signal ACK_OUT by determining OR of an output signal of the AND circuit 121 and an output signal of the AND circuit 122. The AND circuit 124 is configured to determine AND of the inverted signal of the signal ACK_IN and the signal REQ_OUT. The OR circuit 125 is configured to generate the signal REQ_OUT by determining OR of the signal LCK and an output signal of the AND circuit 124.

The control circuit 21 preceding to the circuit related to this self loop is configured with use of the circuit illustrated in FIG. 3, for example. Likewise, the control circuit 21 subsequent to the circuit related to this self loop is configured with use of the circuit illustrated in FIG. 3, for example. Thus, in the circuit example E5, the control circuit 61 in the circuit related to the self loop is configured with use of the circuit illustrated in FIG. 48, and the control circuit 21 in a circuit other than the circuit related to the self loop is configured with use of the circuit illustrated in FIG. 3.

Using the control circuit 61 makes it possible to eliminate overlap between the period in which the signal LCKAC is at the high level and the period in which the signal LCKBD is at the high level. It is possible to use the circuit according to the circuit example E5, for example, in a case of operating a circuit manufactured by what is called a submicron process not at a low power supply voltage but at a normal power supply voltage.

It is to be noted that in FIG. 47, in the circuit according to the circuit example E4 (FIG. 45), the control circuit 21 of the circuit related to the self loop is replaced with the control circuit 61, but this is not limitative. For example, in the circuit according to the circuit example E1 (FIG. 35), the circuit according to the circuit example E2 (FIG. 38), and the circuit according to the circuit example E3 (FIG. 43), the control circuit 21 in the circuit related to the self loop is replaced with the control circuit 61.

Here, the control circuit 61AC corresponds to a specific example of a "first control circuit" in an embodiment of the present disclosure. The control circuit 61BD corresponds to a specific example of a "second control circuit" in an embodiment of the present disclosure. The AND circuit 121 corresponds to a specific example of a "sixth AND circuit" in an embodiment of the present disclosure. The AND circuit 122 corresponds to a specific example of a "seventh AND circuit" in an embodiment of the present disclosure. The OR circuit 123 corresponds to a specific example of a "fourth OR circuit" in an embodiment of the present disclosure. The AND circuit 124 corresponds to a specific example of an "eighth AND circuit in an embodiment of the present disclosure. The OR circuit 125 corresponds to a specific example of a "fifth OR circuit" in an embodiment of the present disclosure.

FIG. 49 illustrates another example of the circuit example E6. The data-path circuit 10 includes combinational circuits 12AB and 12CD and latch circuits 11AB and 11CD. The combinational circuit 12AB is configured to perform a logical operation on the basis of the piece of data DATA_IN and the piece of data DATA_OUT supplied from the latch circuit 11CD. The latch circuit 11AB is configured to latch a piece of data supplied from the combinational circuit 12AD on the basis of the signal LCKAB. The combinational circuit 12CD is configured to perform a logical operation on the basis of a piece of data supplied from the latch circuit 11AB. The latch circuit 11CD is configured to generate the piece of data DATA_OUT by latching a piece of data supplied from the combinational circuit 12CD. The combinational circuits 12AB and 12CD are generated by causing the computer to convert one combinational circuit into two stage of combinational circuits in, for example, processing in step S106 illustrated in FIG. 15, as illustrated in (A) and (B) of FIG. 31, for example.

The handshake circuit 20 includes the join circuit 41, delay circuits 22AB and 22CD, control circuits 61AB and 61CD, the fork circuit 42, and the initial token insertion circuit 43.

The join circuit 41 exchanges signals (the signal REQ_IN and the signal ACK_OUT) with the control circuit 21 in the preceding stage, and exchanges signals (the signals REQ and ACK) with the fork circuit 42. In addition, the join circuit 41 exchanges signals (the signals REQ and ACK) with the control circuit 61AB.

The control circuit 61AB exchanges signals (the signals REQ and ACK) each with the join circuit 41 and with the control circuit 21B. The control circuit 61CD exchanges signals (the signals REQ and ACK) each with the control circuit 61AB and with the fork circuit 42. It is possible for each of the control circuits 61AB and 61CD to use the control circuit 61 illustrated in FIG. 48.

The fork circuit 42 exchanges signals (the signals REQ and ACK) with the control circuit 61CD. In addition, the fork circuit 42 exchanges signals (the signal REQ_IN and the signal ACK_OUT) with the control circuit 21 in the subsequent stage, and exchanges signals (the signals REQ and ACK) with the join circuit 41.

Thus, in the circuit related to the self-feedback loop, the stage number of latch circuits 11 in the data-path circuit 10 may be two stages and the stage number of control circuits 61 in the handshake circuit 20 may be two stages.

(About Flow Equivalence)

In the process method according to the present technology, as illustrated in FIG. 15, a circuit related to a self-feedback loop (FIG. 14) in a synchronous logic circuit is converted into an asynchronous logic circuit as described in the circuit examples E1 to E5 (e.g., FIGS. 35, 38, 43, 45, 47, and 49). In this conversion, it is necessary to satisfy flow equivalence. Here, the flow equivalence means that, in a case where a signal of the same signal change sequence is inputted to each of the circuit before conversion and the circuit after conversion, the signal change sequence of a signal outputted from the circuit before conversion and the signal change sequence of a signal outputted from the circuit after conversion are the same as each other. Hereinafter, description is given of the flow equivalence in a case where the circuit is converted by the method illustrated in FIG. 15.

A method of proving the flow equivalence may be, for example, a method of comparing a signal change sequence for each corresponding latch circuit. For example, a flip-flop circuit in the circuit related to the self-feedback loop (FIG. 14) in the synchronous logic circuit corresponds to a plurality of latch circuits in the asynchronous logic circuit as described the circuit examples E1 to E5. From the viewpoint of a circuit configuration and an operating principle, the signal change sequences in these coincide with each other.

For example, in a case where there is no relationship such as fork coupling, join coupling, split coupling, or merge coupling between a flip-flop circuit forming a self-feedback loop and another flip-flop circuit disposed preceding to or subsequent to the flip-flop circuit forming the self-feedback loop, the change sequence of the signal outputted from the circuit before conversion and the signal change sequence of the signal outputted from the circuit after conversion coincide with each other.

For example, in a case where the flip-flop circuit forming the self-feedback loop and the other flip-flop circuit disposed preceding to or subsequent to the flip-flop circuit forming the self-feedback loop are coupled by fork coupling or join coupling, for example, waiting may occur in a join circuit; therefore, a delay may occur, but the signal change sequence itself does not change. Accordingly, the change sequence of the signal outputted from the circuit before conversion and the signal change sequence of the signal outputted from the circuit after conversion coincide with each other. In fork coupling, synchronization is accomplished by handshaking; therefore, these signal change sequences coincide with each other.

For example, in a case where the flip-flop circuit forming the self-feedback loop and the other flip-flop circuit disposed preceding to or subsequent to the flip-flop circuit forming the self-feedback loop are coupled by split coupling or merge coupling, waiting may occur in a merge circuit; therefore, a delay may occur, but the signal change sequence itself does not change. Accordingly, the change sequence of the signal outputted from the circuit before conversion and the signal change sequence of the signal outputted from the circuit after conversion coincide with each other. In split coupling, synchronization is accomplished by handshaking; therefore, these signal change sequences coincide with each other.

Accordingly, in a case where the signal of the same signal change sequence is inputted to each of the circuit before conversion and the circuit after conversion, the signal change sequence of the signal outputted from the circuit before conversion and the signal change sequence of the signal outputted from the circuit after conversion are the same as each other. As a result, the conversion of the circuit by the processing method illustrated in FIG. 15 satisfies the flow equivalence.

As described above, in this processing method, for example, as described in steps S101 to S103, the computer performs first processing for identifying one or a plurality of flip-flop circuits each forming a self-feedback loop from among a plurality of flip-flop circuits in a synchronous logic circuit, deleting a period path in the self-feedback loop, identifying two or more flip-flop circuits forming strongly coupled components from among the one or plurality of flip-flop circuits, and replacing the two or more flip-flop circuits forming the strongly coupled components with one dummy flip-flop circuit. Thereafter, for example, as described in the grouping processing in step S104, the computer performs second processing for alternately performing processing for searching for one or more flip-flop circuits coupled to input side of one or more flip-flop circuits out of the plurality of flip-flop circuits including the dummy flip-flop through a combinational circuit and processing for searching for one or more flip-flop circuits coupled to output side of the searched one or more flip-flop circuits through the combinational circuit a plurality of times to thereby identify first one or more flip-flop circuits coupled to input side of the combinational circuit and second one or more flip-flop circuits coupled to output side of the combinational circuit. Thus, in the synchronous circuit including the flip-flop circuit forming the self-feedback loop, it is possible to effectively identify the flip-flop circuits preceding to and subsequent to the combinational circuit.

Effects

As described above, in the present embodiment, the computer performs the first processing for identifying one or a plurality of flip-flop circuits each forming a self-feedback loop from among a plurality of flip-flop circuits in a synchronous logic circuit, deleting a period path in the self-feedback loop, identifying two or more flip-flop circuits forming strongly coupled components from among the one or plurality of flip-flop circuits, and replacing the two or more flip-flop circuits forming the strongly coupled components with one dummy flip-flop circuit. Thereafter, the computer performs the second processing for alternately performing processing for searching for one or more flip-flop circuits coupled to input side of one or more flip-flop circuits out of the plurality of flip-flop circuits including the dummy flip-flop through a combinational circuit and processing for searching for one or more flip-flop circuits coupled to output side of the searched one or more flip-flop circuits through the combinational circuit a plurality of times to thereby identify first one or more flip-flop circuits coupled to input side of the combinational circuit and second one or more flip-flop circuits coupled to output side of the combinational circuit. Thus, in the synchronous circuit including the flip-flop circuit forming the self-feedback loop, it is possible to effectively identify the flip-flop circuits preceding to and subsequent to the combinational circuit.

Modification Examples

In the embodiment described above, a synchronous logic circuit is converted into an synchronous logic circuit. For example, in some cases, the thus-converted asynchronous logic circuit may be coupled to a synchronous logic circuit. Specifically, there may be, for example, a case where a piece of data is supplied from the synchronous logic circuit to the asynchronous logic circuit, or a case where a piece of data is supplied from the asynchronous logic circuit to the synchronous logic circuit. Hereinafter, description is given of an interface between the synchronous logic circuit and the asynchronous logic circuit in this case.

FIG. 50 illustrates an example of an interface in a case where a piece of data is supplied from a synchronous logic circuit 200 to an asynchronous logic circuit 210.

The synchronous logic circuit 200 includes a flip-flop circuit 201 and a combinational circuit 202. The flip-flop circuit 201 operates on the basis of a clock signal CLK. The combinational circuit 202 performs a logical operation on the basis of a piece of data supplied from the flip-flop circuit 201.

The asynchronous logic circuit 210 includes an asynchronous logic circuit 211 and a combinational circuit 212. The asynchronous logic circuit 211 is generated by, for example, the processing method according to the embodiment described above. The asynchronous logic circuit 211 may include the circuits described in the circuit examples E1 to E5. A piece of data supplied from the combinational circuit 202 is inputted to this asynchronous logic circuit 211, and the clock signal CLK is inputted as the signal REQ to the asynchronous logic circuit 211. A terminal at which the signal ACK is to be outputted of the asynchronous logic circuit 211 is turned to an open state.

The computer prepares such an interface in a case where the piece of data is supplied from the synchronous logic circuit 200 to the asynchronous logic circuit 210.

FIG. 51 illustrates an example of an interface in a case where a piece of data is supplied from an asynchronous logic circuit 220 to a synchronous logic circuit 230.

The asynchronous logic circuit 220 includes a combinational circuit 221, C-elements 222 and 223, and an asynchronous logic circuit 224. The combinational circuit 221 performs a logical operation on the basis of a piece of data supplied from a preceding stage. The C-element 222 operates on the basis of the signal REQ supplied from a preceding stage and an inverted signal of the clock signal CLK used in the synchronous logic circuit 230. The C-element 223 operates on the basis of an output signal of the C-element 222 and the clock signal CLK. The asynchronous logic circuit 224 is generated by, for example, the processing method according to the embodiment described above. The asynchronous logic circuit 224 may include the circuits described in the circuit examples E1 to E5. A piece of data supplied from the combinational circuit 221 is inputted to the asynchronous logic circuit 224, and an output signal of the C-element 223 is inputted as the signal REQ to the asynchronous logic circuit 224. The signal ACK outputted from the asynchronous logic circuit 224 is supplied to a circuit in a preceding stage. The signal REQ outputted from the asynchronous logic circuit 224 is inputted as the signal ACK to this asynchronous logic circuit 224.

The synchronous logic circuit 230 includes a combinational circuit 231 and a flip-flop circuit 232. A piece of data outputted from the asynchronous logic circuit 224 is supplied to the combinational circuit 231.

The computer prepares such an interface in a case where the piece of data is supplied from the asynchronous logic circuit 220 to the synchronous logic circuit 230.

FIG. 52 illustrates an example of an interface in a case where a piece of data is supplied from a synchronous logic circuit 240 to an asynchronous logic circuit 250 and an interface in a case where a piece of data is supplied from an asynchronous logic circuit 250 to a synchronous logic circuit 260.

The synchronous logic circuit 240 includes a flip-flop circuit 241 and a combinational circuit 242. The flip-flop circuit 241 operates on the basis of the clock signal CLK. The combinational circuit 242 performs a logical operation on the basis of a piece of data supplied from the flip-flop circuit 241.

The asynchronous logic circuit 250 includes an asynchronous logic circuit 251. The asynchronous logic circuit 251 is generated by, for example, the processing method according to the embodiment described above. The asynchronous logic circuit 251 may include the circuits described in the circuit examples E1 to E5. A piece of data supplied from the combinational circuit 242 is inputted to the asynchronous logic circuit 251, and the clock signal CLK is inputted as the signal REQ to the asynchronous logic circuit 251. A terminal at which the signal ACK is to be outputted of the asynchronous logic circuit 251 is turned to the open state. The signal REQ outputted from the asynchronous logic circuit 251 is inputted as the signal ACK to this asynchronous logic circuit 251.

The synchronous logic circuit 260 includes an combinational circuit 261 and a flip-flop circuit 262. A piece of data outputted from the asynchronous logic circuit 251 is supplied to the combinational circuit 261.

Here, the synchronous logic circuit 240 corresponds to a specific example of a "first synchronous circuit" in an embodiment of the present disclosure. The asynchronous logic circuit 250 corresponds to a specific example of a "asynchronous circuit" in an embodiment of the present disclosure. The synchronous logic circuit 260 corresponds to a specific example of a "second synchronous circuit" in an embodiment of the present disclosure.

The computer prepares such an interface in a case where the piece of data is supplied from the synchronous logic circuit 240 to the asynchronous logic circuit 250 and in a case where the piece of data is supplied from the asynchronous logic circuit 250 to the synchronous logic circuit 260.

The present technology has been described above with reference to some embodiments and the modification examples, but the present technology is not limited to the embodiments and the like, and may be modified in a variety of ways.

For example, in the respective embodiments described above, the synchronous logic circuit is converted into the bundled-data asynchronous logic circuit, but this is not limitative. The synchronous logic circuit may be converted into an asynchronous logic circuit of any other system.

It is to be noted that the effects described herein are merely illustrative and non-limiting, and there may be any other effects.

It is to be noted that the present technology may have the following configurations. According to the present technology having the following configurations, it is possible to effectively identify flip-flop circuit preceding to and subsequent to a combinational circuit in a synchronous circuit including a flip-flop circuit forming a self-feedback loop.

(1)

A processing method including:

causing a computer to perform first processing for identifying one or a plurality of flip-flop circuits each forming a self-feedback loop from among a plurality of flip-flop circuits in a synchronous circuit, deleting a feedback path in the self-feedback loop, identifying two or more flip-flop circuits forming strongly coupled components from among the one or plurality of flip-flop circuits, and replacing the two or more flip-flop circuits forming the strongly coupled components with one dummy flip-flop circuit; and causing the computer to perform second processing for alternately performing processing for searching for one or more flip-flop circuits coupled to input side of one or more flip-flop circuits out of the plurality of flip-flop circuits including the dummy flip-flop circuit through a combinational circuit, and processing for searching for one or more flip-flop circuits coupled to output side of the searched one or more flip-flop circuits through the combinational circuit a plurality of times to thereby identify first one or more flip-flop circuits coupled to input side of the combinational circuit and second one or more flip-flop circuits coupled to output side of the combinational circuit.

(2)

The processing method according to (1), in which the second processing includes causing the computer to perform third processing for sequentially selecting one of the plurality of flip-flop circuits including the dummy flip-flop circuit, causing the computer to perform fourth processing for identifying, as a first set, one or a plurality of flip-flop circuits coupled to first side that is one of input side and output side of the flip-flop circuit selected by the third processing through a combinational circuit, and identifying, as a second set, one or a plurality of flip-flop circuits coupled to second side that is the other of the input side and the output side of each of the one or plurality of flip-flop circuits included in the first set through the combinational circuit, causing the computer to repeatedly perform fifth processing once or a plurality of times, the fifth processing being for identifying, as a first set different from the latest first set, one or a plurality of flip-flop circuits coupled to the first side of each of the one or plurality of flip-flop circuits included in the latest second set through the combinational circuit, and identifying, as a second set different from the latest second set, one or a plurality of flip-flop circuits coupled to the second side of each of the one or plurality of flip-flop circuits included in the latest first set through the combinational circuit, and causing the computer to perform sixth processing for confirming whether or not a determination condition that latest two of the first sets are equal to each other and latest two of the second sets are equal to each other is satisfied every time the fifth processing is performed, and specifying the first one or more flip-flop circuits and the second one or more flip-flop circuits on the basis of the latest two of the first sets and the latest two of the second sets in a case where the determination condition is satisfied.

(3)

The processing method according to (1) or (2), further including causing the computer to perform seventh processing in a case where the second one or more flip-flop circuits specified by the second processing form the self-feedback loop, the seventh processing being for converting each of the second one or more flip-flop circuits into four stages of latch circuits, converting the combinational circuit into four combinational circuits by logically dividing the combinational circuit into four in a logical stage number direction, and alternately disposing one of the four combinational circuits and one of the four stages of latch circuits.

(4)

The processing method according to (3), further including causing the computer to perform eighth processing for preparing a handshake circuit that performs handshake processing with one or both of a preceding-stage circuit and a subsequent-stage circuit, and supplies four control signals to the respective four stages of latch circuits.

(5)

The processing method according to (3), further including causing the computer to perform ninth processing for converting a first circuit into a second circuit, the first circuit in which one of the four combinational circuits obtained by the seventh processing and one of the four stages of latch circuits are alternately disposed, and the second circuit including the four combinational circuits and two stages of latch circuits, in which in the second circuit, one of a piece of output data of a first stage of combinational circuit of the four stages of combinational circuits and a piece of output data of a third stage of combinational circuit is selectively supplied to a first stage of latch circuit out of the two stages of latch circuits, a piece of output data of the first stage of latch circuit is selectively supplied to one of a second combinational circuit and a fourth combinational circuit out of the four combinational circuits, one of a piece of output data of the second combinational circuit and a piece of output data of the fourth combinational circuit is selectively supplied to a second stage of latch circuit out of the two stages of latch circuits, and a piece of output data of the second stage of latch circuit is selectively supplied to one of the first combinational circuit and the third combinational circuit.

(6)

The processing method according to (5), further including causing the computer to perform tenth processing for preparing a handshake circuit that performs handshake processing with one or both of a preceding-stage circuit and a subsequent-stage circuit, and supplies two control signals to the respective two stages of latch circuits.

(7)

The processing method according to any one of (1) to (6), further including causing the computer to perform eleventh processing in a case where the second one or more flip-flop circuits specified by the second processing do not form the self-feedback loop, the eleventh processing being for converting each of the second one or more flip-flop circuits into two stages of latch circuits, converting the combinational circuit into two combinational circuits by logically dividing the combinational circuit into two in a logical stage number direction, and alternately disposing one of the two combinational circuits and one of the two stages of latch circuits.

(8)

An asynchronous circuit including:

a first combinational circuit that is configured to perform a logical operation on the basis of a piece of input data and a piece of output data;

a second combinational circuit that is configured to perform a logical operation on the basis of a piece of first data;

a first multiplexer that is configured to select one of a piece of data outputted from the first combinational circuit and a piece of data outputted from the second combinational circuit on the basis of a first selection signal;

a first latch circuit that is configured to latch a piece of data outputted from the first multiplexer on the basis of a first control signal;

a first control latch circuit that is configured to latch the first selection signal on the basis of the first control signal;

a first demultiplexer that is configured to output a piece of data outputted from the first latch as a piece of second data or a piece of third data on the basis of a second selection signal that is a signal outputted from the first control latch;

a third combinational circuit that is configured to perform a logical operation on the basis of the piece of second data;

a fourth combinational circuit that is configured to perform a logical operation on the basis of the piece of third data;

a second multiplexer that is configured to select one of a piece of data outputted from the third combinational circuit and a piece of data outputted from the fourth combinational circuit on the basis of the second selection signal;

a second latch circuit that is configured to latch a piece of data outputted from the second multiplexer on the basis of a second control signal;

a second control latch circuit that is configured to latch the second selection signal on the basis of the second control signal;

a second demultiplexer that is configured to output a piece of data outputted from the second latch as the piece of first data or the piece of output data on the basis of a third selection signal that is a signal outputted from the second control latch; and a handshake circuit that is configured to perform handshake processing with one or both of a preceding-stage circuit and a subsequent-stage circuit, and is configured to generate the first selection signal, the first control signal, and the second control signal.

(9)

The asynchronous circuit according to (8), in which the handshake circuit includes a join circuit, a first control circuit that is configured to generate a first signal, a second control circuit that is configured to generate a second signal, a third control circuit that is configured to generate a third signal, a fourth control circuit that is configured to generate a fourth signal, a fork circuit, a first AND circuit that is configured to generate a fifth signal by determining AND of the first signal and an inverted signal of the second signal, a second AND circuit that is configured to generate a sixth signal by determining AND of the second signal and an inverted signal of the third signal.

a third AND circuit that is configured to generate a seventh signal by determining AND of the third signal and an inverted signal of the fifth signal, a fourth AND circuit that is configured to generate an eighth signal by determining AND of the fourth signal and an inverted signal of the first signal, a first OR circuit that is configured to generate the first control signal by determining OR of the fifth signal and the seventh signal, a second OR circuit that is configured to generate the second control signal by determining OR of the sixth signal and the eighth signal, and a third OR circuit that is configured to generate the first selection signal by determining OR of the second signal and the seventh signal, the join circuit is configured to output a request signal to the first control circuit on the basis of request signals from both of the preceding-stage circuit and the fork circuit, and is configured to output a response signal to the preceding-stage circuit and the fork circuit on the basis of a response signal from the first control circuit, the first control circuit is configured to output a request signal to the second control circuit, output a response signal to the join circuit, and generate the first signal on the basis of the request signal from the join circuit and a response signal from the second control circuit, the second control circuit is configured to output a request signal to the third control circuit, output a response signal to the first control circuit, and generate the second signal on the basis of the request signal from the first control circuit and a response signal from the third control circuit, the third control circuit is configured to output a request signal to the fourth control circuit, output a response signal to the second control circuit, and generate the third signal on the basis of the request signal from the second control circuit and a response signal from the fourth control circuit, the fourth control circuit is configured to output a request signal to the fork circuit, output a response signal to the third control circuit, and generate the fourth signal on the basis of the request signal from the third control circuit and a response signal from the fork circuit, and the fork circuit is configured to output a request signal to both of the subsequent-stage circuit and the join circuit on the basis of the request signal from the fourth control circuit, and is configured to output a response signal to the fourth control circuit on the basis of response signals from both of the subsequent-stage circuit and the join circuit.

(10)

The asynchronous circuit according to (8), in which the handshake circuit includes a join circuit, a merge circuit.

a first control circuit that is configured to generate a first signal, a second control circuit that is configured to generate the second control signal, a split circuit, a third control circuit, a fork circuit, and a fifth AND circuit that is configured to generate the first control signal by determining AND of the first signal and an inverted signal of the second control signal, the join circuit is configured to output a request signal to the merge circuit on the basis of request signals from both of the preceding-stage circuit and the fork circuit, and is configured to output a response signal to the preceding-stage circuit and the fork circuit on the basis of a response signal from the merge circuit, the merge circuit is configured to output a request signal to the first control circuit and generate the first selection signal on the basis of a request signal from at least one of the join circuit or the third control circuit, and is configured to output a response signal to one of the join circuit and the third control circuit on the basis of a response signal from the first control circuit, the first control circuit is configured to output a request signal to the second control circuit, output a response signal to the merge circuit, and generate the first signal on the basis of the request signal from the merge circuit and a response signal from the second control circuit, the second control circuit is configured to output a request signal to the split circuit, output a response signal to the first control circuit, and generate the second control signal on the basis of the request signal from the first control circuit and a response signal from the split circuit, the split circuit is configured to supply a request signal to a circuit corresponding to the third selection signal out of the fork circuit and the third control circuit on the basis of the request signal from the second control circuit, and is configured to output a response signal to the second control circuit on the basis of a response signal from at least one of the fork circuit or the third control circuit, the third control circuit is configured to output a request signal to the merge circuit and output a response signal to the split corridor on the basis of the request signal from the split circuit and a response signal from the merge circuit, and the fork circuit is configured to output a request signal to both of the subsequent-stage circuit and the join circuit on the basis of the request signal from the split circuit, and is configured to output a response signal to the split circuit on the basis of response signals from both of the subsequent-stage circuit and the join circuit.

(11)

The asynchronous circuit according to (8), in which the handshake circuit includes a join circuit, a merge circuit, a first control circuit that is configured to generate the first control signal, a second control circuit that is configured to generate the second control signal, a split circuit, and a fork circuit, the join circuit is configured to output a request signal to the merge circuit on the basis of request signals from both of the preceding-stage circuit and the fork circuit, and is configured to output a response signal to the preceding-stage circuit and the fork circuit on the basis of a response signal from the merge circuit.

the merge circuit is configured to output a request signal to the first control circuit and generate the first selection signal on the basis of a request signal from at least one of the join circuit or the split circuit, and is configured to output a response signal to one of the join circuit and the split circuit on the basis of a response signal from the first control circuit, the first control circuit is configured to output a request signal to the second control circuit, output a response signal to the merge circuit, and generate the first control signal on the basis of the request signal from the merge circuit and a response signal from the second control circuit.

the second control circuit is configured to output a request signal to the split circuit, output a response signal to the first control circuit, and generate the second control signal on the basis of the request signal from the first control circuit and a response signal from the split circuit, the split circuit is configured to supply a request signal to a circuit corresponding to the third selection signal out of the fork circuit and the merge circuit on the basis of the request signal from the second control circuit, and is configured to output a response signal to the second control circuit on the basis of a response signal from at least one of the fork circuit or the merge circuit, and the fork circuit is configured to output a request signal to both of the subsequent-stage circuit and the join circuit on the basis of the request signal from the split circuit, and is configured to output a response signal to the split circuit on the basis of response signals from both of the subsequent-stage circuit and the join circuit.

(12)

The asynchronous circuit according to (11), in which each of the first control circuit and the second control circuit incudes a first terminal serving as an input terminal of a request signal from a preceding stage, a second terminal serving as an output terminal of a response signal to the preceding stage, a third terminal serving as an output terminal of a request signal to a subsequent stage, a fourth terminal serving as an input terminal of a response signal from the subsequent stage, a fifth terminal serving as an output terminal of a corresponding control signal out of the first control signal and the second control signal, a sixth AND circuit that is configured to determine AND of a signal at the first terminal and a signal at the second terminal, a seventh AND circuit that is configured to determine AND of the signal at the first terminal, an inverted signal of a signal at the third terminal, and an inverted signal of a signal at the fourth terminal, a fourth OR circuit that is configured to generate the signal at the second terminal and a signal at the fifth terminal by determining OR of an output signal of the sixth AND circuit and an output signal of the seventh AND circuit, an eighth AND circuit that is configured to determine AND of the signal at the third terminal and the inverted signal of the signal at the fourth terminal, and a fifth OR circuit that is configured to generate the signal at the fourth terminal by determining OR of the signal at the fifth terminal and an output signal of the eighth AND circuit.

(13)

The asynchronous circuit according to (12), further including:

the preceding-stage circuit; and the subsequent-stage circuit, in which each of the preceding-stage circuit and the subsequent-stage circuit includes a first terminal serving as an input terminal of a request signal from a preceding stage, a second terminal serving as an output terminal of a response signal to the preceding stage, a third terminal serving as an output terminal of a request signal to a subsequent stage, a fourth terminal serving as an input terminal of a response signal from the subsequent stage, a fifth terminal serving as an output terminal of a control signal, and a C-element circuit that generates signals at the second terminal, the third terminal, and the fifth terminal on the basis of a signal at the first terminal and an inverted signal of a signal at the fourth terminal.

(14)

A logic circuit including:

a first synchronous circuit;

an asynchronous circuit provided subsequent to the first synchronous circuit; and a second synchronous circuit provided subsequent to the asynchronous circuit, in which the asynchronous circuit includes a data input terminal serving as an input terminal of a piece of data from the first synchronous circuit, an output terminal data output terminal of a piece of data to the second synchronous circuit, a first terminal serving as an input terminal of a request signal from a preceding stage, a second terminal serving as an output terminal of a response signal to the preceding stage, a third terminal serving as an output terminal of a request signal to a subsequent stage, and a fourth terminal serving as an input terminal of a response signal from the subsequent stage, a clock signal in the first synchronous circuit is supplied to the first terminal, the second terminal is turned to an open state, and the third terminal and the fourth terminal are coupled to each other.

(15)

The logic circuit according to (14), in which the asynchronous circuit includes a first circuit, and the first circuit includes a first combinational circuit that is configured to perform processing on the basis of a piece of input data and a piece of output data, a second combinational circuit that is configured to perform processing on the basis of a piece of first data, a first multiplexer that is configured to select one of a piece of data outputted from the first combinational circuit and a piece of data outputted from the second combinational circuit on the basis of a first selection signal, a first latch that is configured to latch a piece of data outputted from the first multiplexer on the basis of a first control signal, a first control latch that is configured to latch the first selection signal on the basis of the first control signal, a first demultiplexer that is configured to output a piece of data outputted from the first latch as a piece of second data or a piece of third data on the basis of a second selection signal that is a signal outputted from the first control latch, a third combinational circuit that is configured to perform processing on the basis of the piece of second data, a fourth combinational circuit that is configured to perform processing on the basis of the piece of third data, a second multiplexer that is configured to select one of a piece of data outputted from the third combinational circuit and a piece of data outputted from the fourth combinational circuit on the basis of the second selection signal, a second latch that is configured to latch a piece of data outputted from the second multiplexer on the basis of a second control signal, a second control latch that is configured to latch the second selection signal on the basis of the second control signal, a second demultiplexer that is configured to output a piece of data outputted from the second latch as the piece of first data or the piece of output data on the basis of a third selection signal that is a signal outputted from the second control latch, and a handshake circuit that is configured to perform handshake processing with one or both of a preceding-stage circuit and a subsequent-stage circuit, and is configured to generate the first selection signal, the first control signal, and the second control signal.

This application claims the priority on the basis of Japanese Patent Application No. 2022-032437 filed on Mar. 3, 2022 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A processing method comprising:
causing a computer to perform first processing for identifying one or a plurality of flip-flop circuits each forming a self-feedback loop from among a plurality of flip-flop circuits in a synchronous circuit, deleting a feedback path in the self-feedback loop, identifying two or more flip-flop circuits forming strongly coupled components from among the one or plurality of flip-flop circuits, and replacing the two or more flip-flop circuits forming the strongly coupled components with one dummy flip-flop circuit; and causing the computer to perform second processing for alternately performing processing for searching for one or more flip-flop circuits coupled to input side of one or more flip-flop circuits out of the plurality of flip-flop circuits including the dummy flip-flop circuit through a combinational circuit, and processing for searching for one or more flip-flop circuits coupled to output side of the searched one or more flip-flop circuits through the combinational circuit a plurality of times to thereby identify first one or more flip-flop circuits coupled to input side of the combinational circuit and second one or more flip-flop circuits coupled to output side of the combinational circuit.

2. The processing method according to claim 1, wherein the second processing includes causing the computer to perform third processing for sequentially selecting one of the plurality of flip-flop circuits including the dummy flip-flop circuit, causing the computer to perform fourth processing for identifying, as a first set, one or a plurality of flip-flop circuits coupled to first side that is one of input side and output side of the flip-flop circuit selected by the third processing through a combinational circuit, and identifying, as a second set, one or a plurality of flip-flop circuits coupled to second side that is the other of the input side and the output side of each of the one or plurality of flip-flop circuits included in the first set through the combinational circuit, causing the computer to repeatedly perform fifth processing once or a plurality of times, the fifth processing being for identifying, as a first set different from the latest first set, one or a plurality of flip-flop circuits coupled to the first side of each of the one or plurality of flip-flop circuits included in the latest second set through the combinational circuit, and identifying, as a second set different from the latest second set, one or a plurality of flip-flop circuits coupled to the second side of each of the one or plurality of flip-flop circuits included in the latest first set through the combinational circuit, and causing the computer to perform sixth processing for confirming whether or not a determination condition that latest two of the first sets are equal to each other and latest two of the second sets are equal to each other is satisfied every time the fifth processing is performed, and specifying the first one or more flip-flop circuits and the second one or more flip-flop circuits on a basis of the latest two of the first sets and the latest two of the second sets in a case where the determination condition is satisfied.

3. The processing method according to claim 1, further comprising causing the computer to perform seventh processing in a case where the second one or more flip-flop circuits specified by the second processing form the self-feedback loop, the seventh processing being for converting each of the second one or more flip-flop circuits into four stages of latch circuits, converting the combinational circuit into four combinational circuits by logically dividing the combinational circuit into four in a logical stage number direction, and alternately disposing one of the four combinational circuits and one of the four stages of latch circuits.

4. The processing method according to claim 3, further comprising causing the computer to perform eighth processing for preparing a handshake circuit that performs handshake processing with one or both of a preceding-stage circuit and a subsequent-stage circuit, and supplies four control signals to the respective four stages of latch circuits.

5. The processing method according to claim 3, further comprising causing the computer to perform ninth processing for converting a first circuit into a second circuit, the first circuit in which one of the four combinational circuits obtained by the seventh processing and one of the four stages of latch circuits are alternately disposed, and the second circuit including the four combinational circuits and two stages of latch circuits, wherein in the second circuit, one of a piece of output data of a first stage of combinational circuit of the four stages of combinational circuits and a piece of output data of a third stage of combinational circuit is selectively supplied to a first stage of latch circuit out of the two stages of latch circuits, a piece of output data of the first stage of latch circuit is selectively supplied to one of a second combinational circuit and a fourth combinational circuit out of the four combinational circuits, one of a piece of output data of the second combinational circuit and a piece of output data of the fourth combinational circuit is selectively supplied to a second stage of latch circuit out of the two stages of latch circuits, and a piece of output data of the second stage of latch circuit is selectively supplied to one of the first combinational circuit and the third combinational circuit.

6. The processing method according to claim 5, further comprising causing the computer to perform tenth processing for preparing a handshake circuit that performs handshake processing with one or both of a preceding-stage circuit and a subsequent-stage circuit, and supplies two control signals to the respective two stages of latch circuits.

7. The processing method according to claim 1, further comprising causing the computer to perform eleventh processing in a case where the second one or more flip-flop circuits specified by the second processing do not form the self-feedback loop, the eleventh processing being for converting each of the second one or more flip-flop circuits into two stages of latch circuits, converting the combinational circuit into two combinational circuits by logically dividing the combinational circuit into two in a logical stage number direction, and alternately disposing one of the two combinational circuits and one of the two stages of latch circuits.

* * * * *